(12) United States Patent　　(10) Patent No.: US 7,728,689 B2
Pedersen et al.　　(45) Date of Patent: Jun. 1, 2010

(54) PULSE WIDTH MODULATOR SYSTEM

(75) Inventors: Kim Rishøj Pedersen, Egå (DK); Lars Arknæs-Pedersen, Viby J (DK)

(73) Assignee: The TC Group A/S (DK)

( * ) Notice: Subject to any disclaimer, the term of this patent is extended or adjusted under 35 U.S.C. 154(b) by 574 days.

(21) Appl. No.: 11/596,606

(22) PCT Filed: May 28, 2004

(86) PCT No.: PCT/DK2004/000376

§ 371 (c)(1),
(2), (4) Date: Sep. 4, 2007

(87) PCT Pub. No.: WO2005/117253

PCT Pub. Date: Aug. 12, 2005

(65) Prior Publication Data

US 2008/0278253 A1　Nov. 13, 2008

(51) Int. Cl.
*H03K 7/08*　(2006.01)
(52) U.S. Cl. .................... 332/109; 330/10; 375/238
(58) Field of Classification Search ............... 332/109, 332/107, 110; 330/10, 251, 207 A; 375/238
See application file for complete search history.

(56) References Cited

U.S. PATENT DOCUMENTS

| | | | |
|---|---|---|---|
| 4,240,036 | A | 12/1980 | Kohler |
| 5,252,063 | A | 10/1993 | Thillen et al. |
| 5,617,058 | A | 4/1997 | Adrian et al. |
| 6,028,944 | A | 2/2000 | Markow et al. |
| 6,031,481 | A | 2/2000 | Craven |
| 6,107,876 | A | 8/2000 | O'Brien |
| 6,320,465 | B1 | 11/2001 | Masini et al. |
| 6,429,737 | B1 | 8/2002 | O'Brien |
| 6,538,504 | B1 | 3/2003 | Kirn |
| 6,665,338 | B1 | 12/2003 | Midya et al. |
| 6,671,329 | B1 | 12/2003 | Lenz |
| 6,970,051 | B2 * | 11/2005 | Luu et al. .................. 332/109 |
| 2003/0122692 | A1 | 7/2003 | Roeckner |

FOREIGN PATENT DOCUMENTS

| | | |
|---|---|---|
| EP | 1 178 388 | 2/2002 |
| JP | 55021577 | 2/1980 |
| LU | 84520 | 10/1984 |
| WO | 2004/105233 | 12/2004 |
| WO | 2004/105242 | 12/2004 |
| WO | 2005/004330 | 1/2005 |

OTHER PUBLICATIONS

European Search Report; EP08000266; May 8, 2008.
International Search Report; PCT/DK2004/000376; Dec. 3, 2004 (all references in search report listed above).

\* cited by examiner

*Primary Examiner*—Robert Pascal
*Assistant Examiner*—Ryan J Johnson
(74) *Attorney, Agent, or Firm*—Cantor Colburn LLP

(57) ABSTRACT

The invention relates to pulse width modulator system (PWMS) comprising a modulator system input (MI),a modulator output (MO), an amplitude distribution filter (ADF) ,and a pulse width modulator (PMOD), wherein said amplitude distribution filter (ADF) establishes an intermediate output signal (OS) by modifying the level of the amplitude distribution of an input signal (IS) within at least one predetermined amplitude range of said input signal (IS), said input signal (IS) being received from said modulator system input (MI), and wherein said pulse width modulator (PMOD) provides a modulator output signal (MOS) on said modulator output (MO) on the basis of said intermediate output signal (OS).

53 Claims, 39 Drawing Sheets

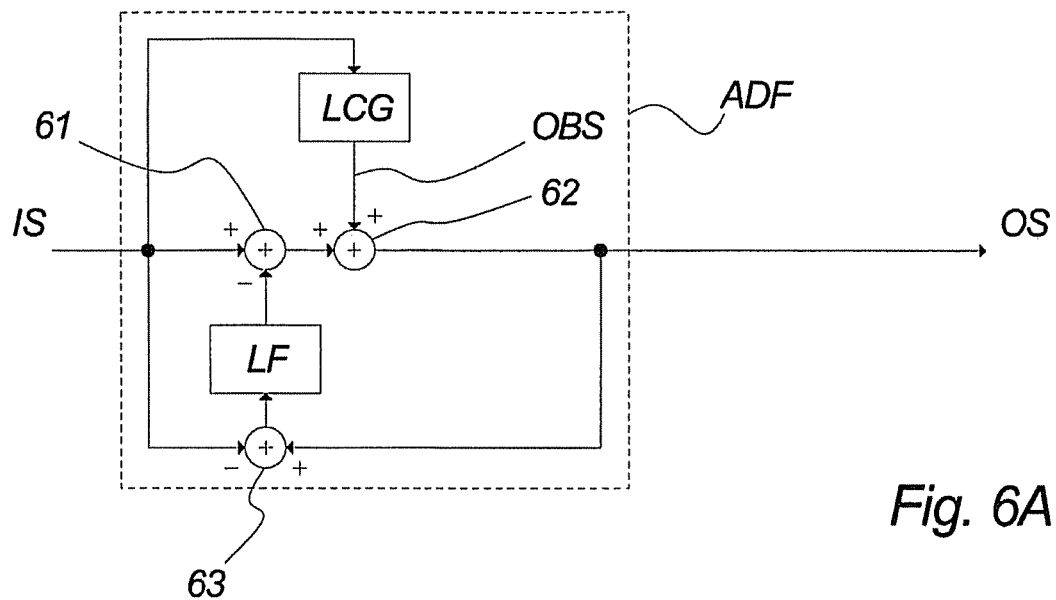
Fig. 6A
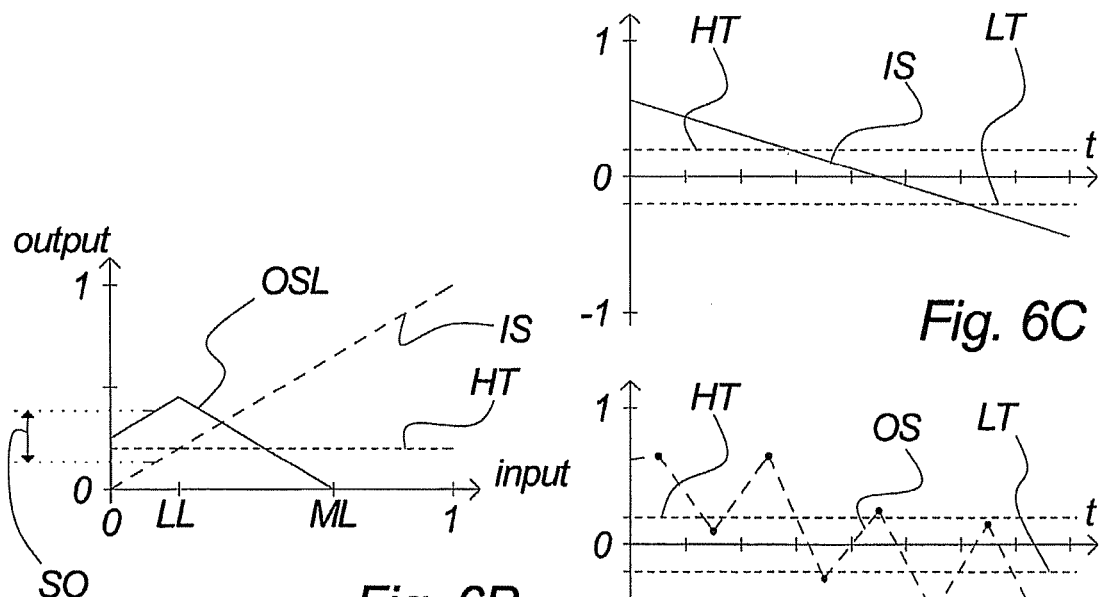
Fig. 6B
Fig. 6C
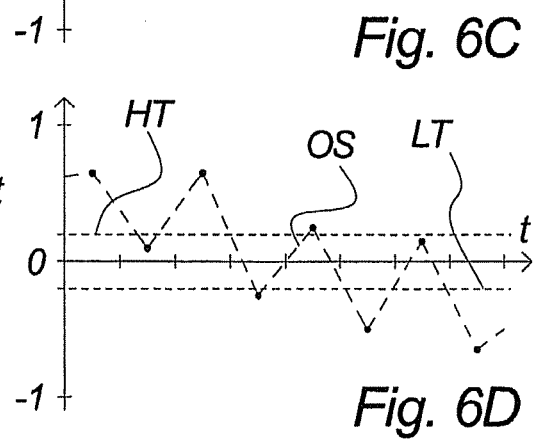
Fig. 6D
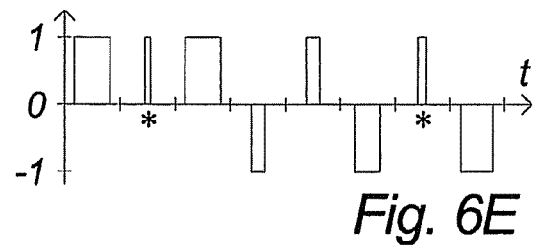
Fig. 6E input peak level = 0 input peak level = 0

PULSE WIDTH MODULATOR SYSTEM

FIELD OF THE INVENTION

The present invention relates to a pulse width modulator system comprising an amplitude distribution filter.

BACKGROUND OF THE INVENTION

U.S. Pat. No. 5,617,058 discloses a method of minimizing nonlinearities when amplifying pulse width modulated (PWM) signals. A problem of the disclosed invention is that it requires complex and power consuming compensation to be performed in the pulse width modulator. A further problem is that the compensation performed causes a worsening of the electromagnetic compatibility and interference (EMC/EMI) properties.

It is an object of the present invention to provide a pulse width modulator dealing with nonlinearities of, e.g., amplifiers for pulse width modulated signals in a cost-effective way.

It is a further object of the present invention to provide a pulse width modulator with improved electromagnetic compatibility and interference (EMC/EMI) properties.

SUMMARY OF THE INVENTION

The invention relates to a pulse width modulator system PWMS comprising
- a modulator system input MI,
- a modulator output MO,
- an amplitude distribution filter ADF, and
- a pulse width modulator PMOD, wherein said amplitude distribution filter ADF establishes an intermediate output signal OS by modifying the level of the amplitude distribution of an input signal IS within at least one predetermined amplitude range of said input signal IS, said input signal IS being received from said modulator system input MI, and wherein said pulse width modulator PMOD provides a modulator output signal MOS on said modulator output MO on the basis of said intermediate output signal OS.

According to the present invention, an advantageous means for modifying a signal to better allow for processing or other kinds of handling by means that do not process all possible signal amplitudes linearly is provided. By means of the present invention, the concentration of signal amplitudes that may be problematic to handle properly by a subsequent means is reduced.

The present invention is especially beneficial when used with connection to PWM amplifiers of other uses of pulse width modulation, as too narrow PWM pulses may often be handled improperly. By means of the present invention it is possible to prevent too narrow pulses to be established, or at least reduce the concentration of such pulses.

The present invention may however as well be used for preventing or reducing the concentration of pulses of any predetermined pulse widths. Also in systems where the end product is not pulses, the present invention may be used for preventing or reducing the concentration of occurrences within predetermined ranges.

According to the present invention the term predetermined is to be understood in a broad sense, thus not necessarily corresponding to the term fixed. Hence, e.g., the manufacturer or user may actually fix the predetermined amplitude range, or it may be determined from time to time during use, e.g. by adapting to changing environmental or internal parameters, or due to external control.

Also the concept of pulse width modulation is to be understood in a broad sense referring to any possible category of pulse width modulation, comprising, e.g., by sampling method: naturally sampled PWM and uniformly sampled PWM, by signal parts: single sided PWM and double sided PWM, and by encoding: two-level PWM, three-level PWM, etc.

According to the present invention, the pulse width modulator PMOD may be any kind of means suitable for establishing a pulse width modulated representation of a signal. Which kind of pulse width modulator to use in a particular application depends on the type of input signal, the desired precision and signal/error-ratio, as well as the desired type of PWM to be established. The pulse width modulator may be of a type operating on the basis of a reference signal, a reference signal representation, i.e. a model of a reference signal, or no reference signal at all. The pulse width modulator may be implemented as an all-analog circuit, all-digital circuit, software executable, or any kind of hybrid implementation.

When said pulse width modulator system PWMS is a distributed system, an advantageous embodiment of the present invention has been obtained.

According to the present invention the different system parts may be physically implemented within a single package, e.g. an integrated circuit, but they may as well be implemented as individual building blocks, whether as integrated circuits or by means of discrete components. Hence the amplitude distribution filter ADF may be positioned anywhere in the input signal path, and not necessarily in connection with the pulse width modulator and probably a PWM amplifier. This feature is made possible by the present invention offering pre-processing of a signal that at some point are to be processed by means comprising non-linear processing within certain amplitude ranges. Hence also setups comprising further processing blocks between the amplitude distribution filter ADF and the pulse width modulator PMOD is within the scope of the present invention.

When said pulse width modulator system PWMS comprises an amplifier AMP, comprising an amplifier output AMPO, said amplifier producing an amplified modulator system output signal MSOS on said amplifier output AMPO responsive to said modulator output signal MOS, an advantageous embodiment of the present invention has been obtained.

By amplifying the modulator output signal MOS is typically referred to increasing the amplitude of the PWM pulses. According to the present invention any kind of amplifier may be used for amplifying the PWM signal.

When according to an embodiment of the invention said amplifier AMP is a switching amplifier, an advantageous embodiment of the present invention has been obtained.

As generally appreciated, switching amplifiers are the most cost-effective means for amplifying a PWM signal. According to the present invention any kind of switching amplifier may be used, e.g. simple electrically or electronically switches, power electronic switches, e.g. power transistors, complex switch setups such as h-bridges, etc.

When said input signal IS is a continuous time signal, an advantageous embodiment of the present invention has been obtained.

According to the present invention, the input signal may be a continuous time signal, e.g. from the output of an analog audio media reading means or any other kind of analog and/or continuous time signal.

When said input signal IS is a discrete time signal, an advantageous embodiment of the present invention has been obtained.

According to the present invention, the input signal is preferably a discrete time signal, such as e.g. a sampled signal or the output of a true digital audio processing means. The input signal may e.g. be a pulse code modulated (PCM) signal.

When said input signal IS is an audio signal, an advantageous embodiment of the present invention has been obtained.

According to the present invention, the utility content of the input signal is preferably audio of any kind, i.e. representing a utility band of 20 kHz, preferably 48 kHz, and even more preferably 96 kHz.

When said modulator output signal MOS is a pulse width modulated signal, an advantageous embodiment of the present invention has been obtained.

According to the present invention, the modulator output signal MOS established by the pulse width modulator PMOD is preferably a PWM signal.

When said pulse width modulated signal comprises at least partly curved or inclined pulses, an advantageous embodiment of the present invention has been obtained.

In order to further improve the electromagnetic compatibility and interference (EMC/EMI) properties, non-square shapes may be used for establishing the PWM pulses.

When said modulator output signal MOS is a three level pulse width modulated signal, an advantageous embodiment of the present invention has been obtained.

According to the present invention the PWM signal is preferably a three level PWM signal, and preferably encoded on two signal carriers whereof a first carries pulses representing positive input signal amplitudes and a second carries pulses representing negative input signal amplitudes whereby the two signal carriers preferably never simultaneously comprise pulses. Any kind of three level PWM signals may however be used with the present invention, as well as two level or multiple level signals.

When said at least one predetermined amplitude range is dynamically positioned, an advantageous embodiment of the present invention has been obtained.

According to the present invention, the predetermined amplitude range may be moved among the possible signal amplitudes during use. Thereby it is possible to adapt the system of the present invention to actual environmental or internal parameter changes, as well as to let the system respond to externally provided control information.

When the extent of said at least one predetermined amplitude range is dynamically adapted, an advantageous embodiment of the present invention has been obtained.

According to the present invention, the extent, i.e. the values of the low and high thresholds LT, HT, relative to each other, of the predetermined amplitude range may be changed during use. Thereby it is possible to adapt the system of the present invention to actual environmental or internal parameter changes, as well as to let the system respond to externally provided control information.

When said at least one predetermined amplitude range comprises the zero-level, an advantageous embodiment of the present invention has been obtained.

According to the present invention, the predetermined amplitude range preferably comprises the zero-level, as it is around that level most PWM amplifiers process data non-linearly.

When said at least one predetermined amplitude range is symmetric around the zero-level, an advantageous embodiment of the present invention has been obtained.

According to the present invention, the predetermined amplitude range is preferably symmetric around the zero-level, as this is one of the typical properties of most PWM amplifiers' non-linear processing range.

When said at least one predetermined amplitude range comprises a range from a low threshold LT up to but not including the zero-level, and a range from but not including the zero-level up to a high threshold HT, an advantageous embodiment of the present invention has been obtained.

According to the present invention, the exact zero-level is often not included in the non-linear processing range of a processing means, even if both sides of it are. Hence a preferred embodiment of the present invention that utilizes this fact is provided.

When said at least one predetermined amplitude range does not comprise the zero-level, an advantageous embodiment of the present invention has been obtained.

According to the present invention it is possible to deal with predetermined amplitude ranges not comprising the zero-level.

When said at least one predetermined amplitude range is determined on the basis of a minimum pulse width MP of said modulator output signal MOS, an advantageous embodiment of the present invention has been obtained.

According to the present invention, a preferred embodiment is obtained by determining the predetermined amplitude range on the minimum width of the PWM pulses in the modulator output signal MOS.

When said minimum pulse width MP of said modulator output signal MOS is determined on the basis of characteristics of said amplifier AMP, an advantageous embodiment of the present invention has been obtained.

According to the present invention, an even more preferred embodiment is obtained by determined the minimum pulse widths on the basis of characteristics of the amplifier.

When said characteristics of said amplifier AMP comprises the rise time and/or fall time, an advantageous embodiment of the present invention has been obtained.

Due to the power electronics typically used within a PWM amplifier, rise and fall times of the switches become significant compared to the desired PWM pulse precision, i.e. the positioning of the flanks as well as the exact width of each pulse. By determining the minimum pulse width on the basis of the rise and/or fall time of the pulses established by the amplifier, a preferred embodiment of the present invention has been obtained.

When said at least one predetermined amplitude range is adaptively determined on the basis of an external control signal ECS, an advantageous embodiment of the present invention has been obtained.

According to the present invention is it possible, in addition to or instead of determining a predetermined amplitude range on the basis of amplifier characteristics, to determine the amplitude ranges on the basis of control information obtained from externally. Thus an embodiment of the present invention allows, e.g., an external control unit to dynamically adapt the predetermined amplitude ranges.

When said external control signal is provided by an instance of said pulse width modulator system PWMS, an advantageous embodiment of the present invention has been obtained.

For example a multiple channel PWM amplifier comprising several pulse width modulator systems according to the present invention, uses a shared control unit to dynamically adapt the predetermined amplitude ranges of each modulator system in order to avoid concurrent flanks in the different channels. Thereby, e.g., cross talk is reduced.

When said amplitude distribution filter ADF comprises a signal generator SG adapted for establishing an outband signal OBS, an advantageous embodiment of the present invention has been obtained.

When said amplitude distribution filter ADF comprises a level controlled generator LCG adapted for establishing an outband signal OBS at least partly controlled on the basis of the amplitude of said input signal IS, an advantageous embodiment of the present invention has been obtained.

According to the present invention, characteristics of the outband signal are controlled on the basis of the amplitude of the input signal. Thereby it is possible to adapt the amplitude distribution filter to a predetermined range by comparing a current input signal amplitude with the predetermined amplitude range or any other set of thresholds, and establish the outband signal differently depending on the comparison results.

When the peak amplitude of said outband signal OBS varies with the amplitude of said input signal IS, an advantageous embodiment of the present invention has been obtained.

According to the present invention, the outband signal amplitude varying with the input signal amplitude is to be understood in a loose sense, as this does not necessarily mean that the amplitudes follows each other by a fixed offset. The correspondence between the outband signal amplitude and the input signal amplitude is preferably changed according to the input signal amplitude.

When the peak amplitude of said outband signal OBS at least partly corresponds to the sum of the level of said input signal IS and a safe offset value SO, an advantageous embodiment of the present invention has been obtained.

According to the present invention, the outband signal amplitude in an embodiment varies tightly with the input signal amplitude, as it is determined only by adding an offset to the input signal amplitude.

When said safe offset value SO corresponds to at least the half of said predetermined amplitude range, an advantageous embodiment of the present invention has been obtained.

Thereby is ensured that no intermediate output signal amplitude peaks is within the predetermined amplitude range.

When the peak amplitude of said outband signal OBS for a first input signal amplitude range at least partly corresponds to the sum of the amplitude of said input signal IS and said safe offset value SO, for a second input signal level range at least partly corresponds to the difference between a predetermined level and the level of said input signal IS, and for a third input signal level range at least partly corresponds to zero, an advantageous embodiment of the present invention has been obtained.

By amplitude modulating the outband signal differently for different input signal amplitude range may e.g. better adapt to the restrictions of the system. By ramping in and out of the ranges instead of using hard changes may improve the signal/error ratio.

When said outband signal OBS is a periodic signal, an advantageous embodiment of the present invention has been obtained.

When simplicity and cost-effectiveness is considered a priority, the outband signal should preferably be a periodic signal, due to the easy establishment of such a signal or signal representation.

When said outband signal OBS comprises a frequency corresponding to the half of the modulation frequency of said pulse width modulator PMOD, an advantageous embodiment of the present invention has been obtained.

By choosing an outband signal frequency of half the PWM frequency it may for several simple outband signal wave form types be ensured that the outband signal amplitude peaks alternates between a high and a low peak with one such peak for each PWM period. When that situation is established, the performance of the amplitude distribution filter is improved.

When said outband signal OBS comprises a frequency corresponding to the quarter of the modulation frequency of said pulse width modulator PMOD, an advantageous embodiment of the present invention has been obtained.

By choosing an outband signal frequency of the quarter of the PWM frequency it may for several simple outband signal wave form types be ensured that the intermediate output signal amplitude for each four PWM periods has the values: high peak, zero, low peak, zero. When that situation is established, the performance of the amplitude distribution filter is improved, as well as a reduction of the power dissipation in the amplifier due to the absence of pulses on zero-level input.

When the wave form of said outband signal OBS is a sine waveform, a triangular waveform, a square waveform or a sawtooth waveform, an advantageous embodiment of the present invention has been obtained.

According to the present invention, simple periodic signals are preferred in order to prioritize simple and cost-effective implementation.

When said outband signal OBS is a multiple frequency signal, an advantageous embodiment of the present invention has been obtained.

According to the present invention, an outband signal comprising multiple frequencies is preferred in order to prioritize electromagnetic compatibility and interference (EMC/EMI) properties, as well as reducing the errors introduced when the outband signal is correlated to the input signal.

When said outband signal OBS comprises the broadest possible frequency band, an advantageous embodiment of the present invention has been obtained.

The broader frequency band comprised by the outband signal, the better EMC/EMI properties.

When the level of the frequency distribution of said outband signal OBS is at least partly reduced within the frequency range comprising the input signal IS, an advantageous embodiment of the present invention has been obtained.

In order to avoid introduction of errors in the utility band, the frequency spectrum of the outband signal should preferably be shaped by reducing the utility band concentration.

When said outband signal is at least partly synchronized with the modulation frequency of said pulse width modulator PMOD, an advantageous embodiment of the present invention has been obtained.

In order to optimize the performance of the amplitude distribution filter the outband signal should preferably be synchronized with the PWM frequency. Such synchronization may comprise direct synchronization between the outband signal and the PWM frequency or it may comprise indirect synchronization where the outband signal is established in such a way that the intermediate output signal becomes synchronized with the PWM frequency.

When said synchronization comprises synchronizing the peaks of said outband signal OBS with the modulation frequency and modulation phase of said pulse width modulator PMOD, an advantageous embodiment of the present invention has been obtained.

By ensuring, e.g., that the outband signal amplitude peaks, or preferably the intermediate output signal amplitude peaks, alternates between a high and a low peak with one such peak for each PWM period, or that the outband signal amplitude, or preferably the intermediate output signal amplitude, for each four PWM periods has the values: high peak, zero, low peak, zero, the performance of the amplitude distribution filter is improved.

By synchronization with the modulation phase is referred to synchronizing the outband peaks with the times in each PWM period where the input signal is considered or sampled, or more preferably establishing an outband signal that causes the intermediate output signal peaks to be synchronized with the times in each PWM period where the signal is considered or sampled by the pulse width modulator PMOD.

When said pulse width modulator PMOD comprises a reference signal representation generator 15 establishing a reference signal representation, an advantageous embodiment of the present invention has been obtained.

According to the present invention, the pulse width modulator may determine the times of the PWM pulse flanks by comparing the utility signal with a reference signal representation. This reference signal representation may be a physical signal or a model of a such comprising polynomials or a table of values.

When said synchronization comprises synchronizing the outband signal OBS with said reference signal representation of said pulse width modulator PMOD, an advantageous embodiment of the present invention has been obtained.

When the pulse width modulator operates on a reference signal, it may be beneficial to synchronize the outband signal with that reference signal representation. Such synchronization may comprise direct synchronization between the outband signal and the reference signal or it may comprise indirect synchronization where the outband signal is established in such a way that the intermediate output signal becomes synchronized with the reference signal.

When said amplitude distribution filter ADF establishes said intermediate output signal OS at least partly by means of an outband signal summing point 61, 102, 142, 182, 222 adapted for adding said outband signal to said input signal IS, an advantageous embodiment of the present invention has been obtained.

By adding the preferably high frequency outband signal to the utility signal is ensured that it may easily be retracted by, e.g., low pass filtering, as is, e.g., performed by a demodulator DEM, without disturbing the utility signal.

When said amplitude distribution filter ADF further comprises a noise shaper performing noise shaping of said intermediate output signal OS, preferably errors introduced by the addition of said outband signal OBS, an advantageous embodiment of the present invention has been obtained.

By adding a noise shaper is ensured that the errors introduced are moved into frequency bands where they are later easily removed by e.g. demodulation.

When said noise shaper comprises a loop filter LF, a filter summing point 63, 82, 103, 143, 162, 183, 223 and a feedback summing point 61, 81, 101, 141, 161, 181, 221 establishing a feedback path from said intermediate output signal OS to said input signal IS, an advantageous embodiment of the present invention has been obtained.

According to the present invention, the above described noise shaper embodiment is preferred. It is however noted that any kind of noise shaper implementation is within the scope of the present invention.

When said loop filter LF comprises a low pass filter, preferably a low-pass infinite impulse response filter with a corner frequency at preferably 20 kHz, an advantageous embodiment of the present invention has been obtained.

According to the present invention, the above described loop filter embodiment is preferred. It is however noted that any kind of loop filter implementation is within the scope of the present invention. Also a distribution of parts the loop filter or a relocation of the whole loop filter to different positions in the circuit is within the scope of the present invention.

When said amplitude distribution filter ADF establishes said intermediate output signal OS at least partly by means of mapping means MM adapted for establishing a mapping output 83, 163 corresponding to said input signal IS in such a way that input signal amplitude instances that fall within said at least one predetermined amplitude range are mapped to mapping output amplitude instances according to a predetermined mapping scheme, an advantageous embodiment of the present invention has been obtained.

According to the present invention the mapping means may be any suitable means for performing the described mapping, whether analog, digital or software based. Such means may, e.g., comprise table lookups, "if-else" conditional structures, "switch-case" conditional structures or any other suitable means.

When said predetermined mapping scheme comprises mapping input signal amplitude instances that fall within said at least one predetermined amplitude range to amplitude instances outside said at least one predetermined amplitude range, an advantageous embodiment of the present invention has been obtained.

According to the present invention, input signal amplitudes within the predetermined amplitude range are in the mapping output 83, 163 mapped to amplitudes outside the predetermined amplitude range. Thereby is for a PWM system ensured that no pulses with a width of less than the minimum pulse width are established.

When said predetermined mapping scheme comprises mapping input signal amplitude instances that fall within said at least one predetermined amplitude range to the zero-level, an advantageous embodiment of the present invention has been obtained.

According to the present invention, input signal amplitudes within the predetermined amplitude range are in the mapping output 83, 163 mapped to the zero-level, which may cause several PWM-periods to comprise no pulse. This may in certain applications cause a considerable saving on amplifier power consumption.

When said predetermined mapping scheme is dynamically adapted, an advantageous embodiment of the present invention has been obtained.

According to the present invention, the predetermined mapping scheme may be dynamically adapted, preferably in order to adapt to changes in the predetermined amplitude range. Thereby it is possible to adapt the system of the present invention to actual environmental or internal parameter changes, as well as to let the system respond to externally provided control information.

When said predetermined mapping scheme is controlled by an external control signal ECS, an advantageous embodiment of the present invention has been obtained.

According to the present invention is it possible, in addition to or instead of determining a predetermined mapping scheme on the basis of amplifier characteristics, to determine the mapping scheme on the basis of control information obtained from externally. Thus an embodiment of the present invention allows, e.g., an external control unit to dynamically adapt the predetermined mapping scheme.

When said noise shaper further performs noise shaping of errors introduced by said mapping means MM, an advantageous embodiment of the present invention has been obtained.

By adding a noise shaper is ensured that the errors introduced are moved into frequency bands where they are later easily removed by e.g. demodulation.

When said amplitude distribution filter ADF further comprises a quantizer QZ, an advantageous embodiment of the present invention has been obtained.

As quantization of the utility signal is often necessary or preferred before or in connection with the pulse width modulation, a quantizer is implemented in a preferred embodiment. By placing the quantizer within the amplitude distribution filter, the noise shaping capabilities of preferred embodiments are also applied to the quantization errors inherently introduced by any quantization.

When said noise shaper further performs noise shaping of errors introduced by said quantizer QZ, an advantageous embodiment of the present invention has been obtained.

By adding a noise shaper is ensured that the errors introduced are moved into frequency bands where they are later easily removed by e.g. demodulation.

When said modifying the level of the amplitude distribution of said input signal IS within said at least one predetermined amplitude range comprises decreasing said level of the amplitude distribution of said input signal IS within said at least one predetermined amplitude range, an advantageous embodiment of the present invention has been obtained.

By reducing the concentration of certain intermediate output signal amplitude ranges without causing harmful alteration of the utility signal an exceptionally useful embodiment has been obtained, allowing a pre-conditioning of a signal to better fit to a processing stage comprising problematic processing within these certain amplitude ranges.

When said modifying the level of the amplitude distribution of said input signal IS within said at least one predetermined amplitude range comprises entirely restraining said level of the amplitude distribution of said input signal IS within said at least one predetermined amplitude range, an advantageous embodiment of the present invention has been obtained.

By substantially preventing certain amplitude ranges to occur within an intermediate output signal without causing harmful alteration of the utility signal an exceptionally useful embodiment has been obtained, allowing a pre-conditioning of a signal to better fit to a processing stage comprising problematic processing within these certain amplitude ranges.

When said pulse width modulator PMOD comprises an intersection computing block 12, an advantageous embodiment of the present invention has been obtained.

According to the present invention, the intersection computing block may be any suitable means for measuring, monitoring, estimating, computing, etc., the times of intersection between two signals. Such means may, e.g., comprise comparators, logical gates or software-based routines, or any other suitable implementation.

When said pulse width modulator PMOD comprises a pulse generator 14, an advantageous embodiment of the present invention has been obtained. According to the present invention the pulse generator may be any means suitable for establishing PWM pulses.

The present invention further relates to a pulse width modulator system PWMS comprising
 a modulator system input MI,
 a modulator output MO,
 an amplitude distribution filter ADF, and
 a pulse width modulator PMOD,
wherein said amplitude distribution filter ADF establishes an intermediate output signal OS by modifying the level of the amplitude distribution of an input signal IS within at least one predetermined amplitude range of said input signal IS, said input signal IS being received from said modulator system input MI, wherein said pulse width modulator PMOD provides a modulator output signal MOS on said modulator output MO on the basis of said intermediate output signal OS, and wherein said modifying the level of the amplitude distribution of an input signal IS within at least one predetermined amplitude range of said input signal IS comprises substantially preventing said pulse width modulator PMOD from establishing pulse width modulation pulses of a width less than a predetermined minimum pulse width.

When said system further comprises any of the above-mentioned features, an advantageous embodiment of the present invention has been obtained.

THE DRAWINGS

The invention will in the following be described with reference to the drawings where FIG. 1A illustrates an embodiment of the present invention, FIG. 1B illustrates an embodiment of the present invention shown in a context, FIG. 1C illustrates an embodiment of a pulse width modulator PMOD, FIG. 2A to 2D illustrate a possible effect of non-linear processing, FIG. 3A illustrates an ideal output/input relationship, FIG. 3B illustrates an output/input relationship comprising a non-linear range, FIG. 4A to 4F illustrate a reference output signal amplitude distribution, FIG. 5A illustrates an embodiment of an amplitude distribution filter ADF according to the present invention, FIG. 5B to 5G illustrate possible effects of the embodiment of FIG. 5A, FIG. 6A illustrates a further embodiment of an amplitude distribution filter ADF according to the present invention, FIG. 6B graphically illustrates a possible outband signal level control algorithm, FIG. 6C to 6E illustrate possible effects of the embodiment of FIG. 6A, FIG. 7A illustrates a possible input signal IS to the embodiment of FIG. 6A, FIG. 7B illustrates a possible outband signal OBS established by the embodiment of FIG. 6A, FIG. 7C illustrates a possible output signal OS provided by the embodiment of FIG. 6A, FIG. 7D to 7I illustrate the output signal amplitude distribution according to the embodiment of FIG. 6A, FIG. 8A illustrates a further embodiment of an amplitude distribution filter ADF according to the present invention, FIG. 8B to 8C illustrate a possible mapping scheme, FIG. 9A illustrates a possible input signal IS to the embodiment of FIG. 8A, FIG. 9B illustrates a possible output signal OS provided by the embodiment of FIG. 8A, FIG. 9C to 9H illustrate the output signal amplitude distribution according to the embodiment of FIG. 8A, FIG. 10 illustrates a preferred embodiment of the amplitude distribution filter ADF of the present invention, FIG. 11A illustrates a possible input signal IS to the embodiment of FIG. 10, FIG. 11B illustrates a possible outband signal OBS established by the embodiment of FIG. 10, FIG. 11C illustrates a possible output signal OS provided by the embodiment of FIG. 10, FIG. 11D to 11I illustrate the output signal amplitude distribution according to the embodiment of FIG. 10, FIG. 12 to 13 illustrate possible relative output signal noise floors, FIG. 14A illustrates a further embodiment of an amplitude distribution filter ADF according to the present invention, FIG. 14B to 14D illustrate possible effects of the embodiment of FIG. 14A, FIG. 15A illustrates a possible input signal IS to the embodiment of FIG. 14A, FIG. 15B illustrates a possible outband signal OBS established by the embodiment of FIG. 14A, FIG. 15C illustrates a possible output signal OS provided by the embodiment of FIG. 14A, FIG. 15D to 15J illustrate the output signal amplitude distribution according to the embodiment of FIG. 14A, FIG. 16A illustrates a further embodiment of an amplitude distribution filter ADF according to the present invention, FIG. 16B to 16C illustrate a possible mapping scheme, FIG. 17A illustrates a possible input signal IS to the embodiment of FIG. 16A, FIG. 17B illustrates a possible output signal OS provided by the embodiment of FIG. 16A, FIG. 17C to 17H illustrate the output signal amplitude distribution according to the embodiment of FIG. 16A, FIG. 18 illustrates a preferred embodiment of the amplitude distribution filter ADF of the present invention, FIG. 19A illustrates a possible input signal IS to the embodiment of FIG. 18, FIG. 19B illustrates a possible outband signal OBS established by the embodiment of FIG. 18, FIG. 19C illustrates a possible output signal OS provided by the embodiment of FIG. 18, FIG. 19D to 19I illustrate the output signal amplitude distribution according to the embodiment of FIG. 18, FIG. 20 to 21 illustrate possible relative output signal noise floors, FIG. 22A illustrates a further preferred embodiment of the amplitude distribution filter ADF of the present invention, FIG. 22B graphically illustrates a possible outband signal level control algorithm, FIG. 22C illustrates a possible effect of the embodiment of FIG. 22A, FIG. 23A illustrates an output/input relationship comprising several non-linear ranges, FIG. 23B illustrates an output/input relationship comprising a dynamically positioned non-linear range, and FIG. 24 illustrates an embodiment of a multi-channel pulse width modulator system MCS.

DETAILED DESCRIPTION

FIG. 1A illustrates an embodiment of a pulse width modulator system PWMS of the present invention. It comprises a modulator input MI receiving an input signal IS. The input signal may is preferably the utility signal to be pulse width modulated. An amplitude distribution filter ADF of the present invention processes the input signal IS in order to adapt the input signal amplitude distribution to achieve the best performance of subsequent stages. The amplitude distribution filter ADF establishes an output signal OS, also referred to as intermediate output signal, which is fed to a pulse width modulator PMOD. The pulse width modulator PMOD establishes a pulse width modulated representation of the output signal, and outputs it via a modulator output MO as a modulator output signal MOS.

FIG. 1B illustrates a further embodiment of a pulse width modulator system PWMS of the present invention, and a context for its use. It comprises all elements of FIG. 1A coupled as described above. It furthermore comprise an amplifier AMP received the modulator output MOS. The amplifier is preferably of the power switch type, but may be any amplifier suited for amplifying a PWM signal. The amplifier may comprise any number of switches and couplings of these, in accordance with the type of PWM modulation scheme used by the PWM modulator PMOD. The amplifier outputs a modulator system output signal MSOS via an amplifier output AMPO. The modulator system output signal MSOS being the output of the pulse width modulator system PWMS of the present embodiment is preferably demodulated by means of a demodulator DEM, typically a low-loss, low-pass filter, and is fed to a loudspeaker LS. According to the particular PWM modulation scheme used the amplifier, demodulator and loudspeaker may be coupled in any way suitable. This particularly applies for systems where the PWM signal is distributed over two or more simultaneous signal parts, e.g. as typically used for three level PWM signals.

FIG. 1C illustrates a further embodiment of a pulse width modulator system PWMS of the present invention, and in particular is illustrates an example of an embodiment of the pulse width modulator PMOD. The illustrated system comprises a PWM amplifier/audio system for use with a discrete time input signal, e.g. a pulse code modulated (PCM) signal.

Like the embodiment of FIG. 1B the present embodiment comprises a modulator system input MI feeding an input signal IS to an amplitude distribution filter ADF. The intermediate output signal OS of the amplitude distribution filter ADF is fed to the pulse width modulator PMOD.

The modulator output MOS of the pulse width modulator PMOD, i.e. a pulse width modulated signal, is amplified by means of an amplifier AMP as described above and rendered into sound by means of a demodulator DEM and a loudspeaker setup LS as also described above.

FIG. 1C further illustrates an embodiment of a pulse width modulator PMOD. It comprises an upsampling block 11 basically transforming the intermediate output signal OS from one sampling frequency representation into an N times higher sampling representation.

The upsampled signal is then fed to an intersection-computing block 12 adapted for determination of intersections with a parallel reference signal representation 16 provided by a reference signal generator 15. The intersections may e.g. be established in the block 12 according to the principles disclosed in PCT/DK03/00334 hereby incorporated by reference, or in PCT/DK2004/000361 hereby incorporated by reference. A consecutive noise shaping and quantizing block 13 feeds the established intersections to a pulse generator 14 which establishes the modulator output signal MOS, i.e. a pulse width modulated signal.

It is noted that the above-described embodiment of a pulse width modulator PMOD is only one of several possible embodiments suitable for use with the present invention. Also several different kinds of pulse width modulation and encoding schemes may be used for establishing the pulse width modulated signal MOS. This signal may thus perfectly be distributed over several sub-signals, e.g. when differentiated PWM signals are established. In such cases also the amplifier AMP may comprise several sub-amplifiers, typically power switches, and the demodulator DEM may comprise several demodulators. Also the loudspeaker setup may comprise several signal inputs.

An example of a further pulse width modulator PMOD embodiment that may be used with the present invention is disclosed in PCT/DK03/00475, hereby incorporated by reference.

A further example of a pulse width modulator PMOD embodiment that may be used with the present invention is disclosed in EP 1 178 388 A1, hereby incorporated by reference.

It is noted that the above-mentioned embodiment examples are not exhaustive, and that the present invention may be used in any context for any application and that the illustrations in FIGS. 1A, 1B and 1C are only examples for establishing a concept and context for the following detailed description.

FIG. 2A illustrates an analog input signal 21 depicted in a system of a vertical amplitude axis and a horizontal time axis.

Figure 1A:
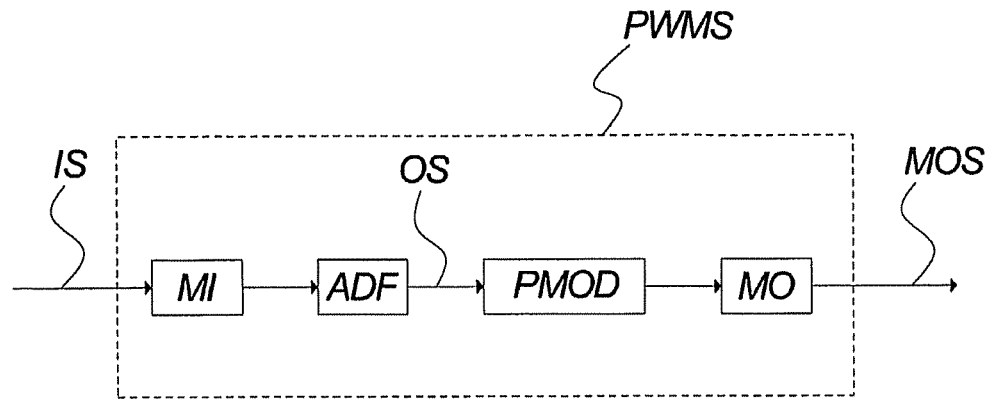
Figure 1B:
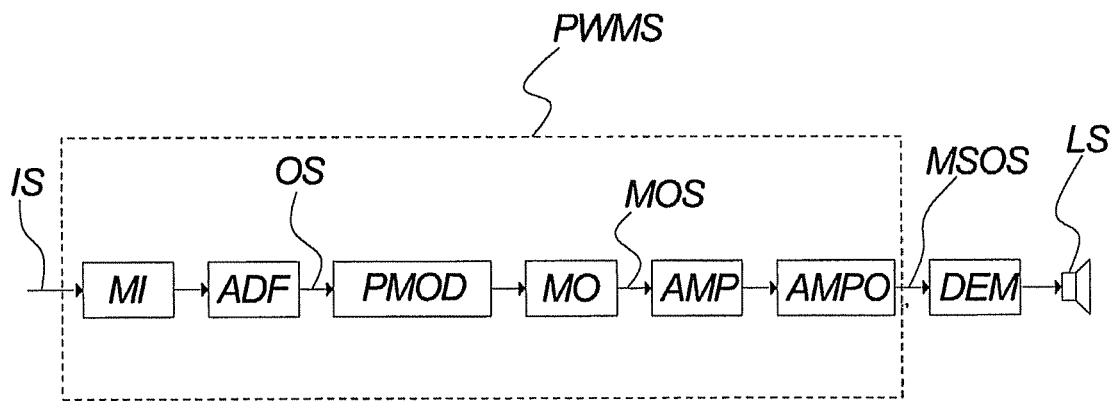
Figure 1C:
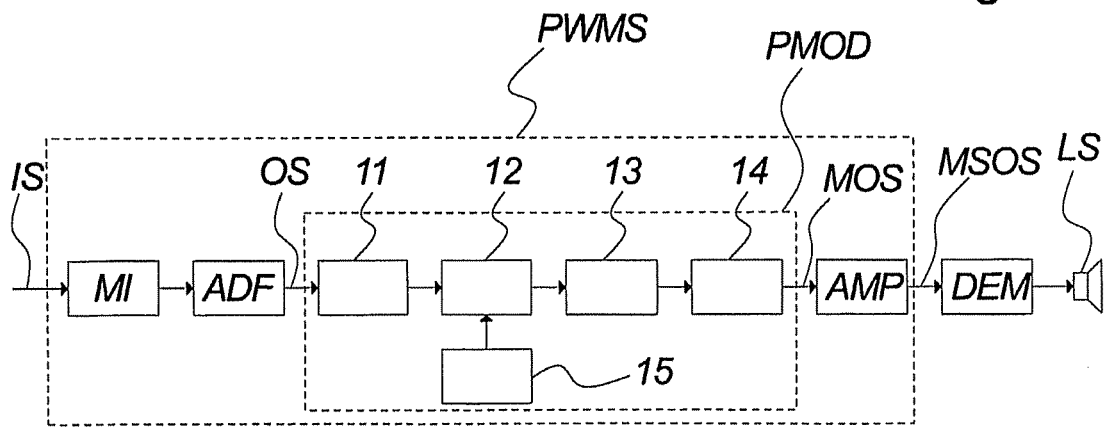
Figure 2A:
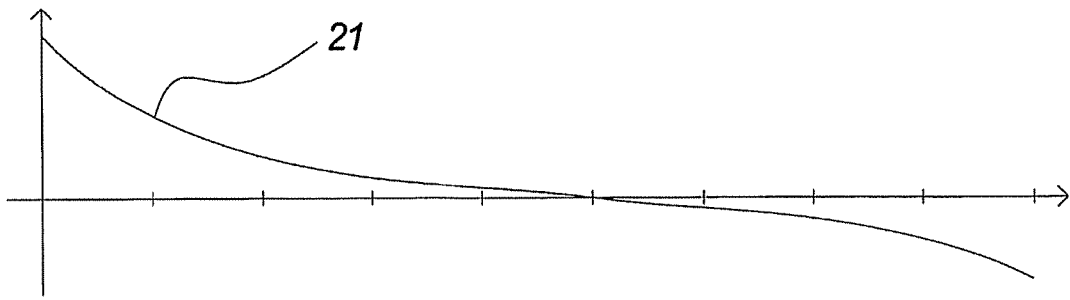
FIGS. 2A to 2D illustrate one kind of nonlinear processing of input within certain ranges by a processing stage, which may be compensated for by means of the present invention. The signals shown in FIGS. 2A-2D relate to digital amplifiers with power switches.
Figure 2B:
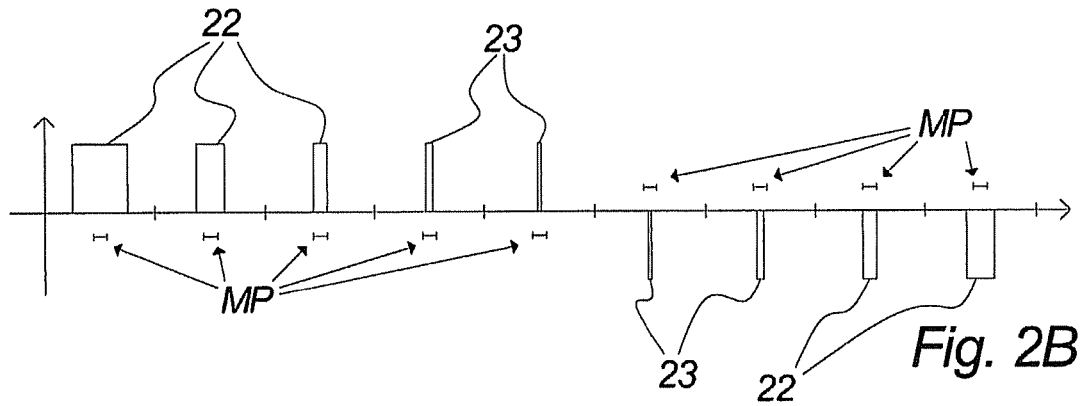

FIG. 2B illustrates a result of pulse width modulating the signal 21 of FIG. 2A. The pulses 22, 23 are shown relative to the same horizontal time axis as the signal 21 of FIG. 2A. The time axis comprises a number of divisions reflecting the periods of the pulse width modulation (PWM), and for each of these the analog signal amplitude may be decoded from the width of the corresponding pulse. The pulses shown in FIG. 2B are ideal so far that they comprise totally vertical flanks. The modulation scheme used for the PWM signal shown in FIG. 2B is a three-level modulation, thus representing negative analog signal amplitudes by negative pulses. Thereby, large amplitude analog signals, either positive or negative, are represented by wide pulses, positive or negative, and small amplitude analog signals are represented by narrow pulses. Ideally, a zero input is represented by the absence of pulses. As a typical analog signal, e.g. representing audio, crosses the zero-value very often and, furthermore, also very often stays near zero for longer time periods, several extremely narrow pulses are established when the signal is pulse width modulated according to the above-described three-level modulation scheme and other modulation schemes. Especially because input signals that in theory should be zero in practice are often alternating around the zero-level, several very narrow PWM pulses are established by empty input signals.

Figure 2C:
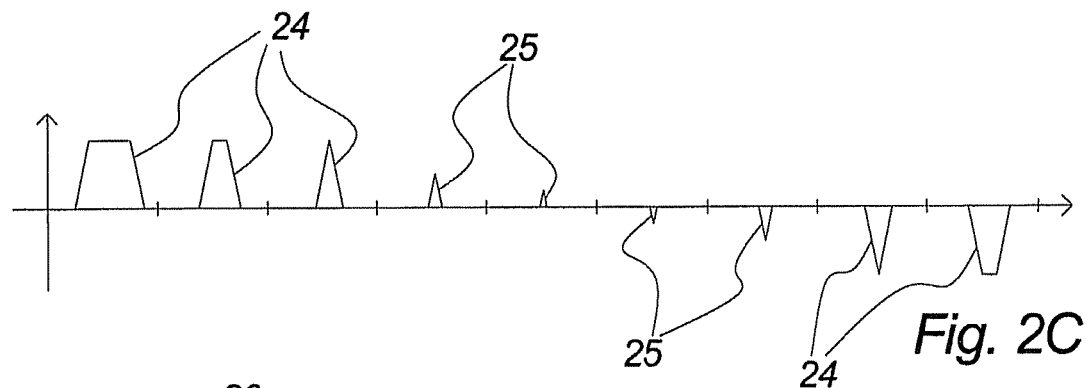

FIG. 2C illustrates a probable output of a set of power switches applied for amplifying the PWM signal of FIG. 2B. The horizontal time axis of FIG. 2C corresponds to the time axis of FIG. 2B but the vertical amplitude axis is, due to clearance, scaled as the pulses of FIG. 2C probably have larger amplitudes than the pulses of FIG. 2B due to the amplification. As it takes some time for the power switches to build up the high voltages on their output, rise and fall times distort the output pulses 24, 25. However, for PWM pulses 22 of a certain width, the rise and fall times in combination contribute to a pulse 24 effectively having the same area, and thereby energy, as the input pulse 22.

Figure 2D:
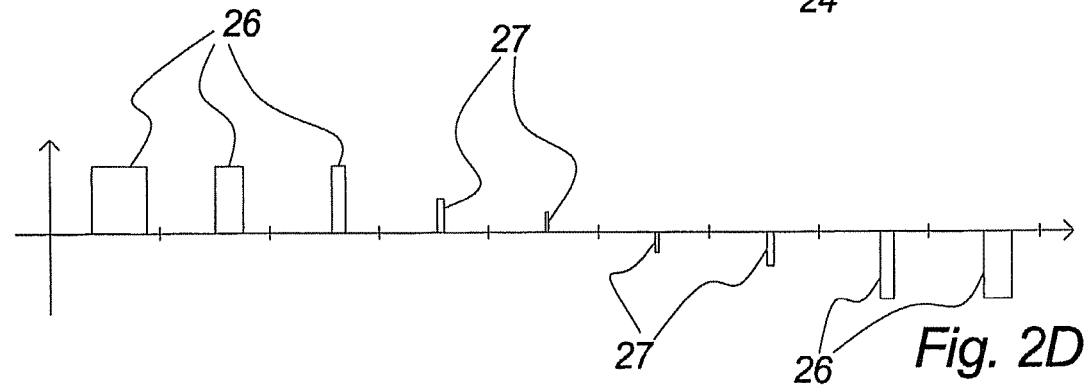

FIG. 2D illustrates the effective output of the power switches represented by rectangular pulses in order to ease the comparison with the input pulses of FIG. 2B. Thus, the pulses of FIG. 2D have the widths of the pulses of FIG. 2B but the area of the pulses of FIG. 2C. These restrictions leave any differences to be represented by the pulse heights, thus allowing comparison of the pulse heights of FIG. 2B with the pulse heights of FIG. 2D.

Thus, the pulses 26 may represent the effect of the, however distorted, pulses 24 established from the pulses 22, and it may easily be seen that apart from the vertical scaling issue according to any amplification, the effective output pulses 26 equal the input pulses 22.

As the rise and fall times are independent from the actual input pulses 22, 23, the same rise and fall times are applied to the narrow input pulses 23. For input pulses narrower than the rise time, the actual output pulses, thus, never reaches the full amplitude before falling back to zero level as illustrated by the output pulses 25. In order to be able to compare the effect of the output from the narrow pulses, FIG. 2D comprises the effect of such pulses 27. As seen, the pulse height decreases the narrower the input pulses are indicating loss of energy and, thus, introduction of distortion and errors.

In FIG. 2B the minimum pulse width MP is shown. This width represents the narrowest pulses that are not distorted, according to this problem, by the power switches. The minimum pulse width MP is determined by features of the actual digital amplifier, e.g. power switches, power supply, voltage regulation, load balancing, etc. Thus, one way to minimize this problem would be to develop better power switches and accessories but as the problem is especially significant for input signal amplitudes close to zero, the problem may never be eliminated. Thus, the minimum pulse width MP represents an input amplitude range to which the processing stage, i.e. the amplifier, acts in a non-linear manner.

However, true zero-level input, i.e. input that is represented by the absence of pulses, though definitely narrower than the minimum pulse width MP, may be processed by the power switches and further stages without distortion. When the non-linear processing range, thus, ranges across the zero-level, the non-linear processing range does however typically not comprise the exact value of zero.

As explained above, ideal PWM signals often comprise several very narrow pulses caused by an empty or silent input, which is actually not completely silent in praxis. This typically causes digital amplifiers to be noisy when the input is silent.

It is noted that the minimum pulse width constraint does not apply to all types of pulse width modulated signals, for example is it possible to realize pulses of any width by means of a conventional differential PWM technique where two sets of switches operate simultaneously thus establishing overlapping pulses. Such techniques however typically provide poor electromagnetic compatibility and interference (EMC/EMI) properties as well as higher power dissipation.

Figure 3A:
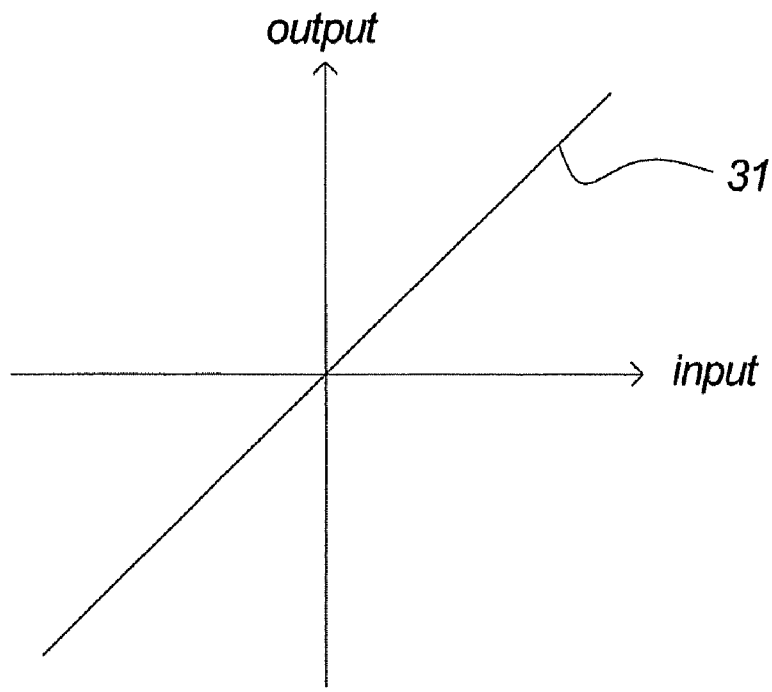
Figure 3B:
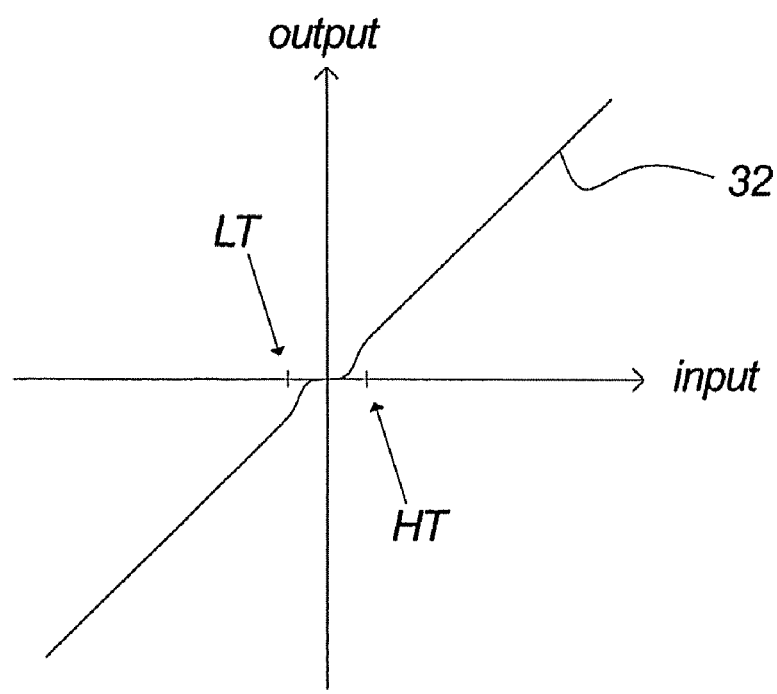

FIGS. 3A and 3B illustrate this more generally. FIG. 3A illustrates by a straight line 31 the common relationship between the output and the input of a linear process. This relationship is desirable in most applications processing an input, especially in audio applications, and as almost no electronical parts or other parts inherently offer linearity for a wide input range, the linearity requirement typically makes the development more difficult, the expenses greater and introduces several other limitations.

FIG. 3B illustrates a relationship between the output and the input of a process being non-linear for inputs within a certain amplitude range, i.e. between a low threshold LT and a high threshold HT. Thus, for inputs within that amplitude range, the output is distorted. The relationship illustrated in FIG. 3B may very well be that between the output and input of a PWM amplifier, as described above, thus introducing distortion when the input is close to zero. The low threshold LT and high threshold HT values, thus, correspond to the minimum pulse width MP of FIG. 2B or more accurately to the analog input signal 21 amplitude corresponding to the minimum pulse width MP.

It is noted that the range of input amplitudes where the processing means, e.g. a pulse width modulator PMOD or an amplifier AMP, performs non-linear processing according to the present invention need not necessarily be arranged around the zero level or middle value, but may be anywhere within the input range, occupy any width of the range, and even be divided into several non-linear ranges. In the following such ranges may be referred to as predetermined amplitude ranges or problematic ranges, which represents amplitude ranges that should be sought prevented from use due to subsequent non-linear processing or for any other reason.

FIGS. 4A to 4F are provided for reference purposes and illustrate characteristics of the output signal OS when the amplitude distribution filter ADF is empty, i.e. comprises only a wire with a gain of 1 for all relevant frequencies.

Figure 4A:
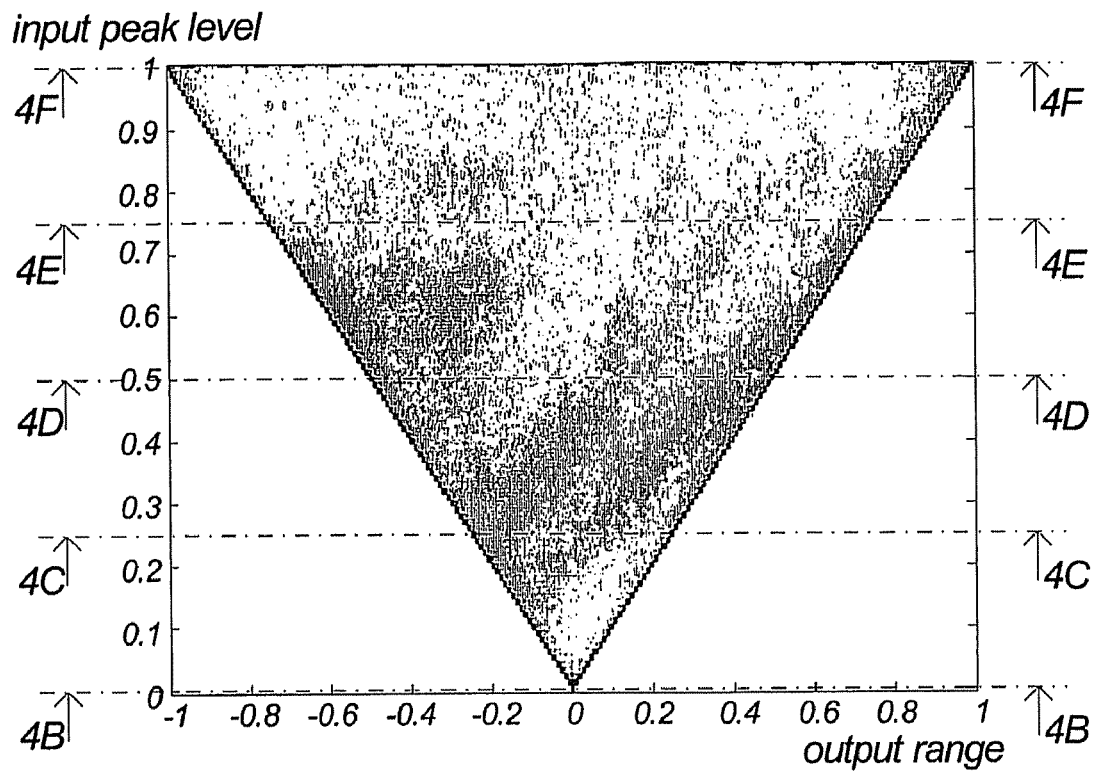

FIG. 4A illustrates the level distribution of the output signal OS when the input signal is a 1 kHz sine wave at different input signal peak levels. The vertical axis corresponds to different peak amplitudes of the sine wave ranging from 0 to 1. The horizontal axis corresponds to the possible output signal levels, i.e. −1 to 1. The lightness corresponds to the level distribution in such a way that darker areas represent higher concentrations. Thus, any white areas represent combinations of input peak level and output levels that never occur, whereas dark grey areas represent combinations that frequently occur. It can, thus, be seen that for an empty input signal, i.e. a sine wave with an amplitude of zero, the only value represented in the output signal is also zero, whereas the output level distribution for an input sine wave of full extend comprises all possible values and is more concentrated at high absolute amplitudes.

In order to clarify the meaning of the different shades of grey in FIG. 4A, FIGS. 4B to 4F are provided. These figures comprise sectional views of FIG. 4A at different input peak levels. The horizontal axes of FIGS. 4B to 4F are the same as the horizontal axis in FIG. 4A, i.e. corresponding to the output range. The vertical axes of FIGS. 4B to 4F correspond to the output level distribution, i.e. the lightness of FIG. 4A.

Figure 4B:
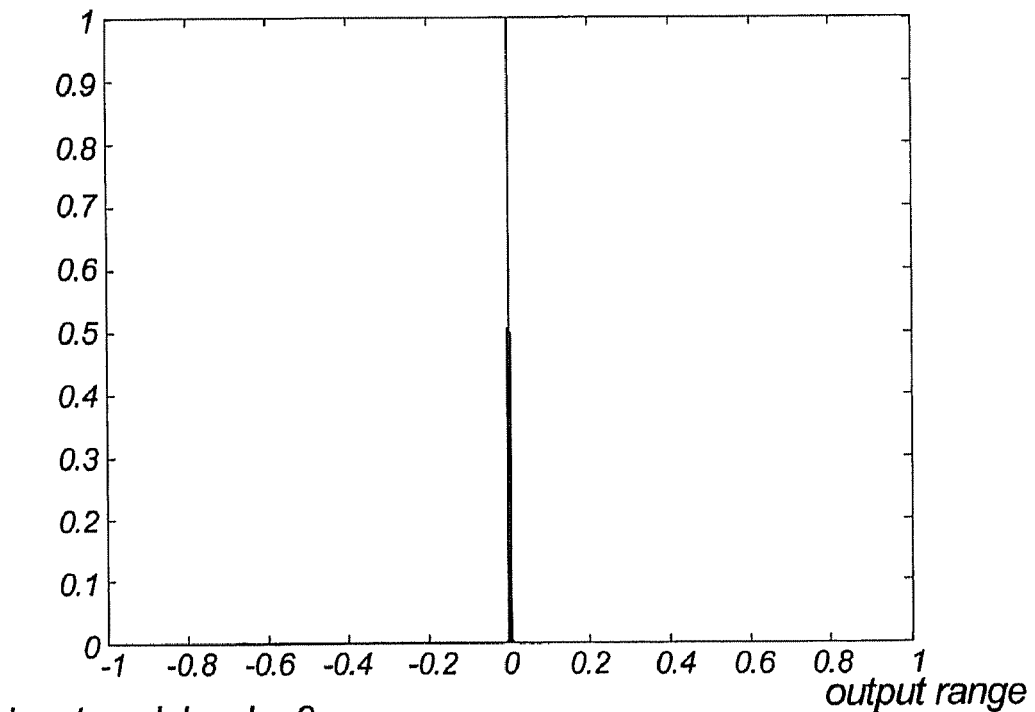

FIG. 4B is a sectional view of FIG. 4A at an input peak level of zero. As described above, only the value zero is represented in the output level distribution.

Figure 4C:
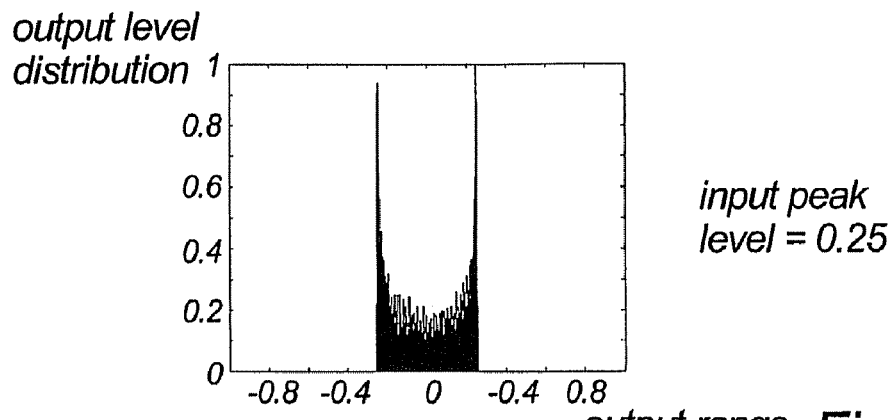

FIG. 4C is a sectional view of FIG. 4A at an input peak level of 0.25, i.e. a quarter of the full possible extend and, thus, comprises the output level distribution of a 1 kHz sine wave with a peak value of 0.25. As seen, the output signal level is distributed over values from −0.25 to 0.25 and is most concentrated at the outer edges due to the slow-varying nature of a sine wave when at its top or bottom levels.

Figure 4D:
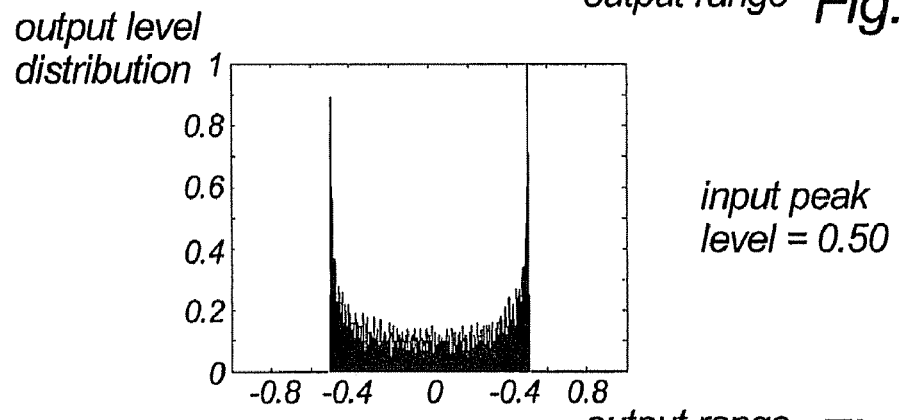
Figure 4E:
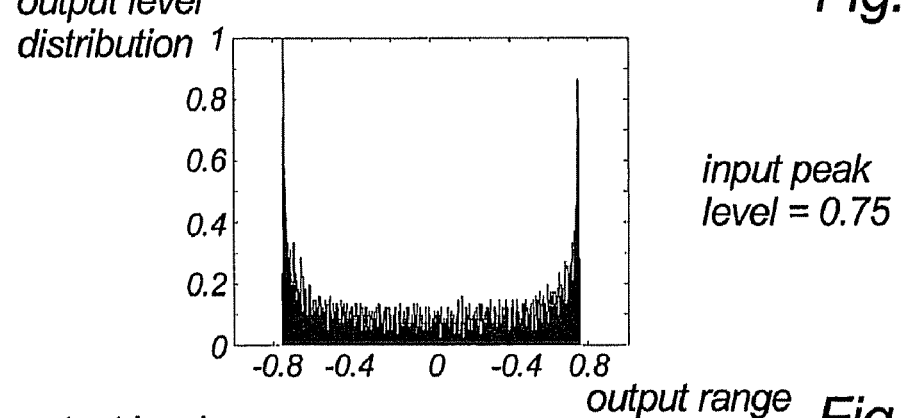
Figure 4F:
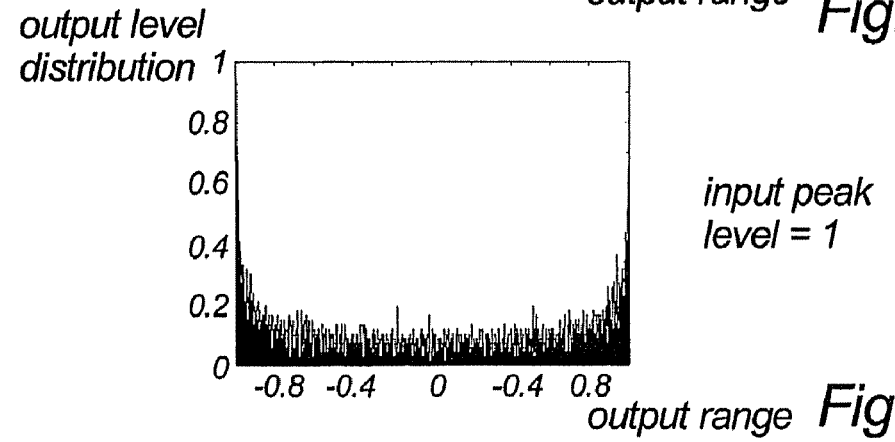

FIGS. 4D to 4F also comprise sectional views of FIG. 4A at input peak levels 0.5, 0.75 and 1.0. Common to all input peak levels, as easily seen from FIG. 4A, is that the output signal OS comprises levels around zero as well as all other values between the lower and upper peak levels. The output signal, thus, comprises values within the nonlinear processing range of a typical subsequent processing means PM, e.g. a PWM amplifier.

In the following, with reference to the FIGS. 5A to 22C, embodiments of the present invention are described in the context of an application where the signal is pulse width modulated and amplified by a means performing non-linear processing for input amplitudes within a range centred around the zero-level as illustrated in FIG. 3B. It is noted that the present invention may be used in any context where non-linear processing is performed for certain input amplitude ranges, or the use of such ranges are sought prevented for any other reason.

Figure 5A:
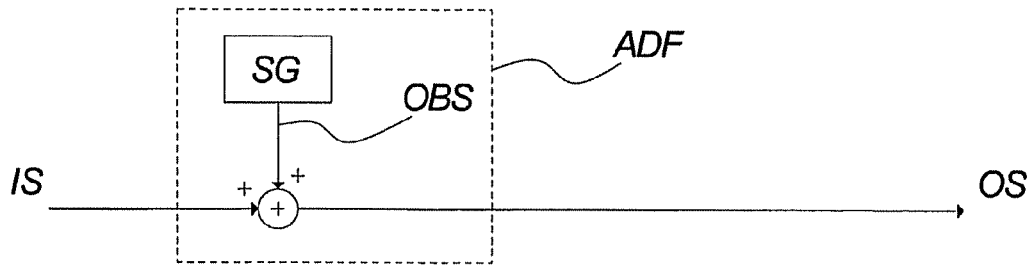

FIG. 5A illustrates an embodiment of the amplitude distribution filter ADF of the present invention. It comprises an input signal IS and an output signal OS. The output signal OS is established by adding an outband signal OBS to the input signal IS. The outband signal is established by means of a signal generator SG. Dependent of the natures of the input and outband signals, the level of the amplitude distribution function of the composite signal OS may be lower within the predetermined amplitude range than the level of the distribution function of the unmodified input signal. In other words, the amplitude of the composite signal OS may be within the predetermined amplitude range for in total a shorter time than the input signal IS, thus, in the case of subsequent pulse width modulation, causing fewer pulses narrower than the minimum pulse width to be established. Also dependent on the characteristics of the outband signal it may only influence the spectrum of the input signal without the utility frequency band. For example, when the input signal is an audio signal of 96 kHz, choosing a high frequency outband signal, e.g. of 192 kHz, does not disturb the audio content of the signal. According to the present invention it is, thus, possible to add an outband signal to the input signal without causing any impact on the utility content of the signal but yet conditioning the signal to better avoid certain non-linear or otherwise problematic ranges of subsequent processing stages.

The waveform of the outband signal OBS may be anything. As regards electromagnetic compatibility and interference (EMC/EMI) issues, i.e. possible problems related to electromagnetic radiation, a waveform with the widest frequency spectrum possible should be used, thus distributing the energy over the broadest band possible. Such a possible wide-spectrum outband signal may comprise white noise shaped to not interfere with the audio band. In several practical uses, and in the following description due to clarity, the outband signal OBS is a periodic signal, e.g. a sine wave, a triangular wave, a square wave, etc., and preferably of a rate half the rate of the pulse width modulation. Thereby, an outband signal may be established alternating between its highest and lowest amplitudes at the times where the pulse width modulator samples the signal. Furthermore, when the maximum amplitude of the outband signal is outside the predetermined amplitude range, the outband signal itself never causes an amplitude value within the non-linear range to be sampled.

Figure 5B:
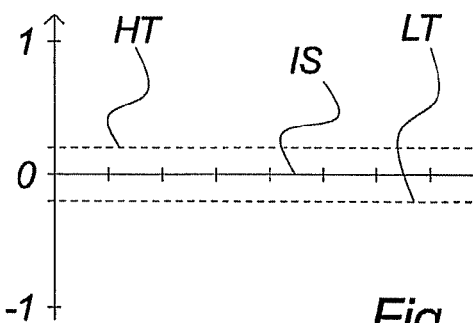
Figure 5E:
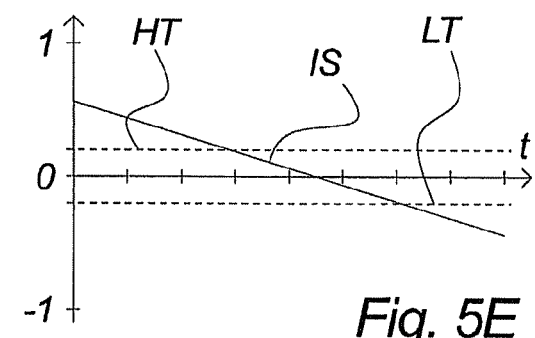

FIGS. 5B and 5E illustrate two possible input signals. In FIG. 5B the input signal IS is always zero. The horizontal axis corresponds to the time t or any other time wise division such as, e.g., samples and the vertical axis represents the amplitude. In the diagram by dashed lines a high threshold HT and a low threshold LT are, furthermore, shown. This is the amplitude range in which, e.g., a subsequent amplifier AMP or other processing means may act in a non-linear way, and the input signal example of this figure is, thus, within this probably problematic range all the time. While this input signal is perfect in theory, as it causes no PWM pulses to be established at all, it may as described above actually cause a quite distorted output signal as the actual values probably alternates closely around zero.

Figure 5C:
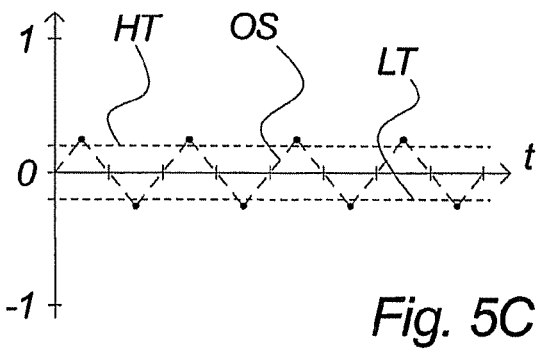

FIG. 5C illustrates the output signal OS established by adding the input signal IS and the outband signal OBS. As the input signal is zero, the output signal is actually equal to the outband signal. The outband signal in this example is, if in the continuous domain, a triangular waveform with a frequency of half the frequency of the PWM periods denoted by the divisions of the timeline. For a system sampling the signal in the middle of each PWM period, the output signal will always be outside the predetermined amplitude range between LT and HT. If the sample time is shifted, e.g. by sampling at the beginning of each PWM period, the outband signal may simply be shifted accordingly. It noted that the outband signal may take any of several different forms and still be sampled with the same result. Such forms comprise, e.g., saw-tooth waveforms, sine waveforms, square waveforms, etc.

Figure 5F:
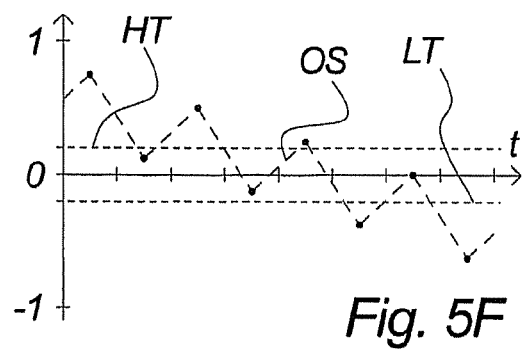
Figure 5D:
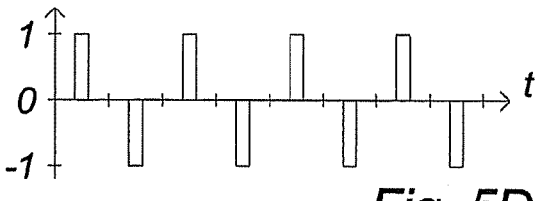

FIG. 5D illustrates the result of pulse width modulating the output signal OS as shown in FIG. 5C. It is easily understood that this signal, if the frequency is high enough, is rendered as silence by e.g. a speaker.

In a typical application where the subsequent stages comprise power switches for digital amplification and demodulation filtering only a small fraction of the energy of the high frequency content is transformed into heat. Thereby, the additional power consumption caused by adding the outband signal is in practice insignificant.

FIG. 5E illustrates a second possible input signal IS. The further features of FIG. 5E are equal to those of FIG. 5B and described with reference to that figure. The input signal example of FIG. 5E lies within the probably problematic range, i.e. between low threshold LT and high threshold HT for approximately three successive PWM periods around the centre of the time period shown.

FIG. 5F shows the resultant output signal OS when adding the input signal of FIG. 5E with the outband signal OBS. The outband signal is in this example equal to the outband signal used for rendering the output signal of FIG. 5C. As seen, some of the problematic amplitudes of the input signal of FIG. 5E have been pushed outside the problematic range but in the same way some of the safe amplitudes have been pushed into the problematic range between the LT and HT values.

Figure 5G:
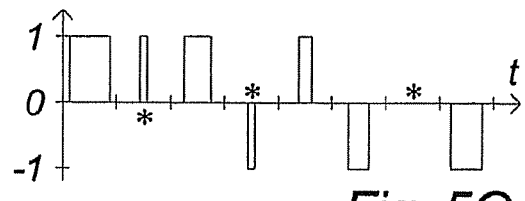

Like FIG. 5D FIG. 5G illustrates the result of pulse width modulating the output signal OS of FIG. 5F. The asterisks indicate pulses that are too narrow, i.e. less than the minimum pulse width established from the output signal amplitudes within the problematic range.

The embodiment of FIG. 5A may, thus, for some input signals IS cause the level of the amplitude distribution function of the output signal OS to be lower within the range between the low and high thresholds than the level of the distribution function of the input signal IS, whereas it for other input signals may worsen the problem. If the nature and characteristics of the input signal IS are well defined or known, the embodiment of FIG. 5A may be used to significantly reduce the number of e.g. too narrow pulses in an PWM amplifier application.

Even if the established output signal causes a number of too narrow pulses to be established, these will typically by means of the present invention occur a little before or after the time where the signal should be silent, i.e. a little before or after the zero-crossings of the input signal. This effectively causes the distortion to be less significant as the signal/error-ratio increases rapidly when moving away from the zero-crossings. In other words, the unavoidable distortions are moved to situations where the utility signal masks them.

FIG. 6A illustrates a further, more preferred embodiment of the present invention.

Like the embodiment of FIG. 5A it comprises an input signal IS, which is turned into an output signal OS by adding an outband signal OBS to it by means of a summing point 62. The outband signal of the embodiment of FIG. 6A is established by means of a level controlled generator LCG. The level controlled generator is controlled at least partly by an input connected to the input signal. An outband signal that is amplitude controlled by the input signal may, thus, be established. The particular characteristics of the outband signal, e.g. waveform, frequency, etc., may be freely chosen or determined by other parameters as with the embodiment of FIG. 5A, and need not to be controlled by the input signal. The level controlled generator may, e.g., be implemented as a signal generator with voltage controlled gain.

The embodiment of FIG. 6A further comprises a loop filter LF. The loop filter is in the embodiment of FIG. 6A located in the feedback path from the output signal OS in such a way that is processes the difference between the output signal OS and the input signal IS and the output of the loop filter LF is subtracted from the input signal IS by means of a summing point 61. Assuming a linear loop filter LF and a silent outband signal OBS, the filter and feedback loop causes the following relationship between the output and the input signals:

$$OS=IS-LF(OS-IS),$$

which may be rearranged into:

$$\frac{OS}{IS} = 1$$

Thus the loop filter and the feedback loop as arranged in the embodiment of FIG. 6A does not have any effect on the input signal to output signal relation, i.e. it has a gain of one.

However, for the relationship between the output signal and any signal, distortion, error or noise injected to the forward path between the summing point 61 and the feedback path starting point, in the following referred to as e, the loop filter causes the following:

$$OS=IS+e-LF(OS-IS),$$

which, when ignoring the input signal IS, may be rearranged into:

$$\frac{OS}{e} = \frac{1}{1+LF}$$

Thus, the loop filter LF applies to the error signal in a negated way and may by means of a preferred filter characteristic serve as a noise shaper to distortion and errors introduced to the signal forward path. Such preferred loop filter implementation may comprise a low-pass IIR filter, i.e. infinite impulse response filter, with a corner frequency at the top of the desired utility band, e.g. 20 kHz, and a large gain within the utility band. To the error e this implementation causes any utility band content to be heavily attenuated.

Regarding the embodiment of FIG. 6A, addition of the level controlled outband signal causes introduction of errors because the outband signal depends on the input signal amplitude. The errors introduced comprise, e.g., amplitude modulation side bands that also affect the utility frequency band, e.g. the audio band. Due to the errors being introduced within the noise-shaper loop, these errors are however suppressed by that.

Regarding the level controlled generator LCG any rules or algorithms for determining the outband signal amplitude on the basis of the input signal may be implemented. Such a rule may, in a simple example, comprise always letting the outband signal amplitude exceed the amplitude of the input signal by an amount corresponding to just a little more than the half of the range between the low threshold LT and the high threshold HT, i.e. a safe offset SO. Thereby, for a zero input, the outband signal amplitude stays just outside the range between the thresholds at the sample times, provided that the frequency of the outband signal is half the frequency of the sampling performed in subsequent stages. For a non-zero input, the outband signal amplitude alternates between the safe offset value SO and values considerably higher than the input signal amplitude. Thus, this implementation requires far better dynamic parameters than needed to provide for the input signal itself.

A preferred embodiment of the level controlled generator LCG amplitude-determining algorithm is illustrated graphically in FIG. 6B. This illustration comprises a horizontal axis corresponding to the absolute of the input amplitude and a vertical axis corresponding to the absolute of the outband signal amplitude, i.e. the output of the level controlled generator. The half of the range between the low threshold and the high threshold is shown as a horizontal dashed line HF. The amplitude of the input signal IS is shown as a dashed line and the amplitude OSL of the outband signal OBS is shown as a solid line. For a first input signal amplitude range, i.e. input amplitudes below a low level LL, the outband signal amplitude is controlled as described above simply by adding a safe offset SO to the value of the input signal. Thereby, as described above it is ensured that the output signal OS at the sample times is either the safe offset SO or the twice of the input signal amplitude plus the safe offset value. For a second input signal amplitude range, i.e. input amplitudes between the low level LL and a middle level ML, the outband signal amplitude is smoothly decreased by determining it as the difference between a predetermined value, e.g. equal to the middle level value, and the input signal amplitude. Within this second input amplitude range the outband signal amplitude, thus, decreases in order to not get clipped at the maximum amplitude level. For a third input signal amplitude range, i.e. input amplitudes between the middle level ML and maximum, the outband signal amplitude is steady at zero, i.e. the outband signal is switched off. Within this third amplitude range the input signal is, thus, not regulated in this specific embodiment of the present invention.

The effect of the level controlled generator LCG of FIG. 6A for a silent signal as illustrated in FIG. 5B is exactly like for the embodiment of FIG. 5A. As the input signal is zero all the time, the outband signal amplitude takes the value of the safe offset SO shown in FIG. 6B. Hence, the output signal OS established by summing together the silent input signal IS with the outband signal OBS, thus, becomes the same as in FIG. 5C, where the signal is outside the problematic range at every sample time. Obviously, the possible outcome illustrated in FIG. 5D of pulse width modulating the output signal OS of FIG. 5C also applies to this situation. None of the pulses are too narrow.

FIG. 6C illustrates a different input signal IS, equal to the signal illustrated in FIG. 5E. It sweeps from a value above the high threshold HT across zero to a value below the low threshold LT. FIG. 6D illustrates the output signal OS resulting from summing together the input signal of FIG. 6C with an outband signal established according to the algorithm illustrated by FIG. 6B. The outband signal actually causes all of the input signal amplitudes within the problematic range to be pushed outside it, but nevertheless also causes a couple of good input signal amplitudes to be moved into the problematic range. A result of pulse width modulating the output signal is shown in FIG. 6E. As seen, two of the pulses marked with asterisks are narrower than minimum pulse width.

Figure 7A:
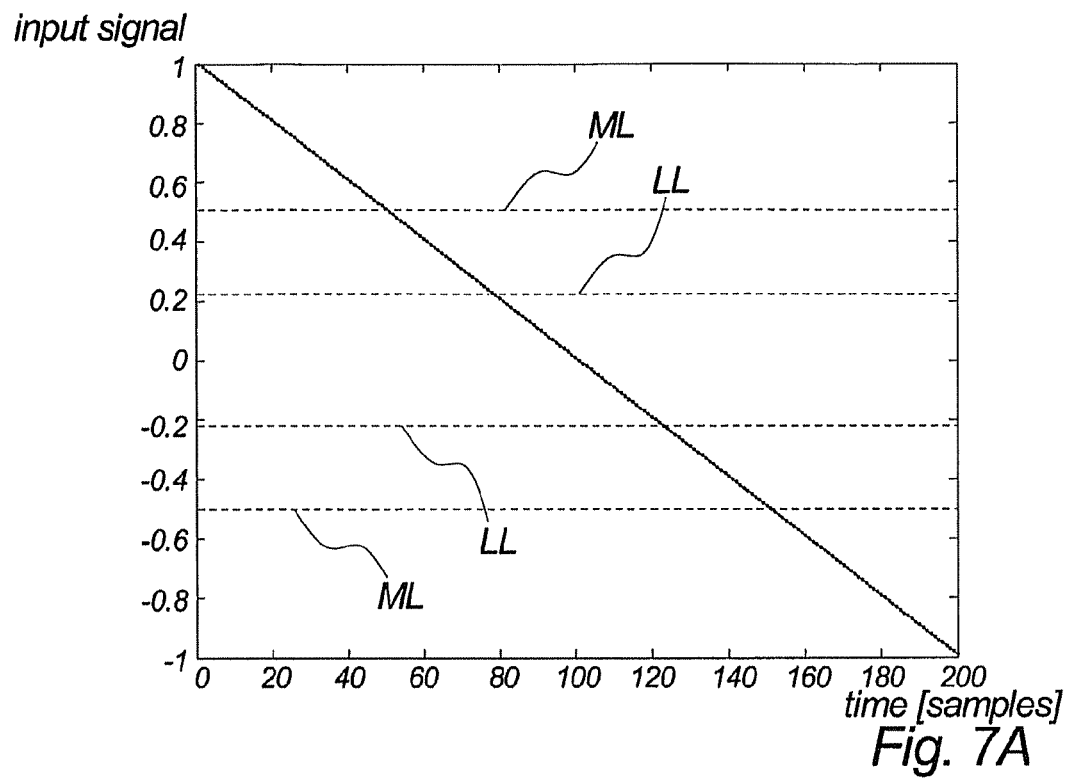

FIGS. 7A to 7I illustrate the effect of the level controlled generator LCG generated outband signal OBS of a preferred embodiment of the present invention. In FIG. 7A an input signal IS is shown. The horizontal axis corresponds to time or samples, whereas the vertical axis corresponds to signal amplitude. FIG. 7A further comprises dashed lines indicating the low level LL and middle level ML amplitudes corresponding to FIG. 6B.

Figure 7B:
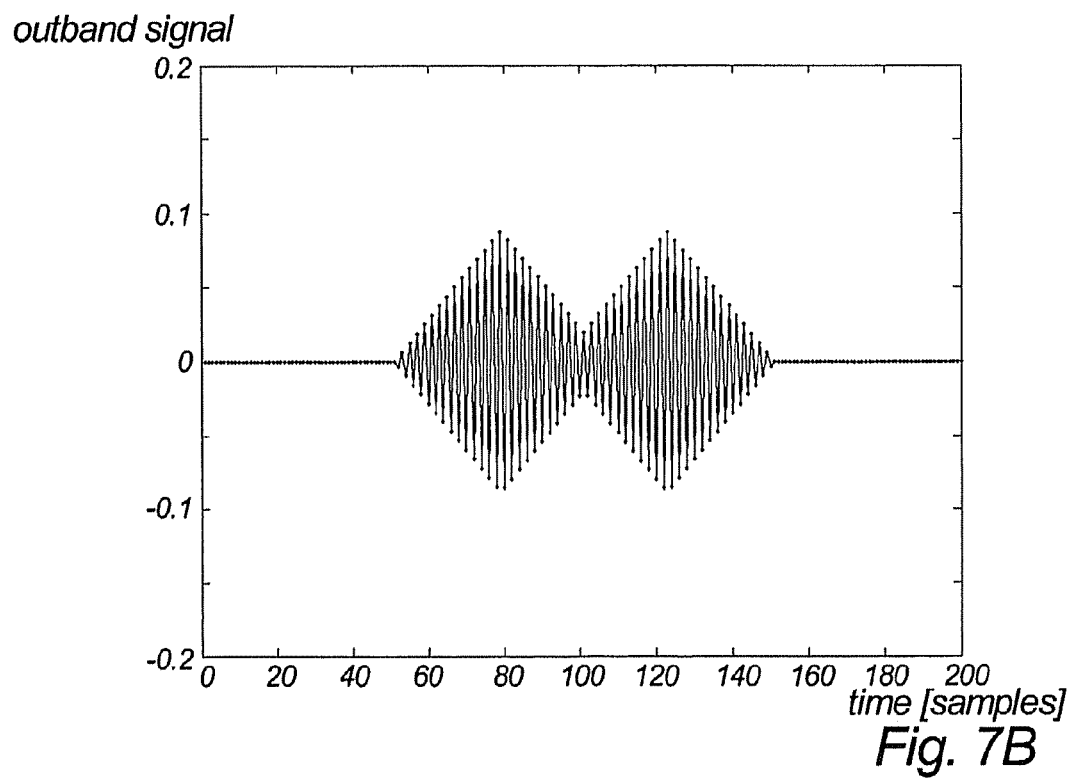

FIG. 7B comprises a possible outband signal OBS established from the input signal of FIG. 7A on the basis of an algorithm in principle corresponding to the one shown in FIG. 6B. From the beginning, i.e. the left side of FIG. 7A, the input signal IS is above the middle level ML and thus, according to the algorithm of FIG. 6B, the outband signal in FIG. 7B is kept at zero. When the input signal decreases below the middle level ML, the algorithm of FIG. 6B causes the outband signal to build up, e.g. with an amplitude being the difference between the middle level ML or another fixed level and the input signal IS. Furthermore, when the input signal decreases below the low level LL, the algorithm causes the amplitude of the outband signal OBS to track the input signal amplitude at an offset, e.g. a safe offset SO.

Figure 7C:
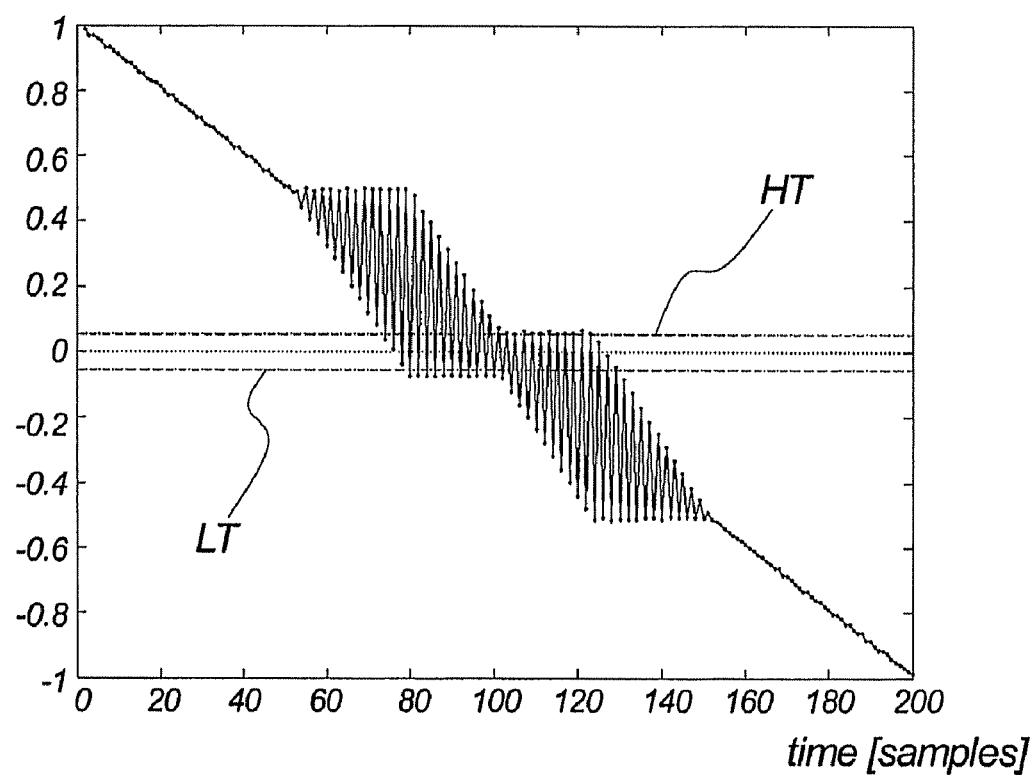

FIG. 7C illustrates a possible output signal OS established by summing together the input signal IS of FIG. 7A and the outband signal OBS of FIG. 7B. Furthermore, the illustration comprises dashed lines indicating the high threshold HT and the low threshold LT. As seen, the output signal equals the input signal through the first stage, where the input signal is above the middle level ML. In the next stage, between the middle level and low level LL, the oscillation builds up until the lower amplitude peaks are below the low threshold LT. From that time the lower amplitude peaks stays just below the low threshold LT while the higher amplitude peaks decrease with the signal until just above the high threshold HT. From there, the opposite behaviour is seen for the rest of the signal.

The outband signal OBS should, preferably, have a mean value of zero in order not to disturb the utility signal. Thereby, it is achieved that the output signal of FIG. 7C render as the input signal in FIG. 7A when processed by a low pass filter. Furthermore, it may be seen that no peaks, i.e. samples when the signal is used for e.g. a PWM amplifier, are within the problematic range around the time where the input signal crosses zero. The output signal, however, comprises altogether six samples within the problematic area at the times where the outband signal fades in or out. The distortion established by these samples is, however, less significant as the higher input signal level at that time causes a significantly higher signal/error-ratio.

Figure 7D:
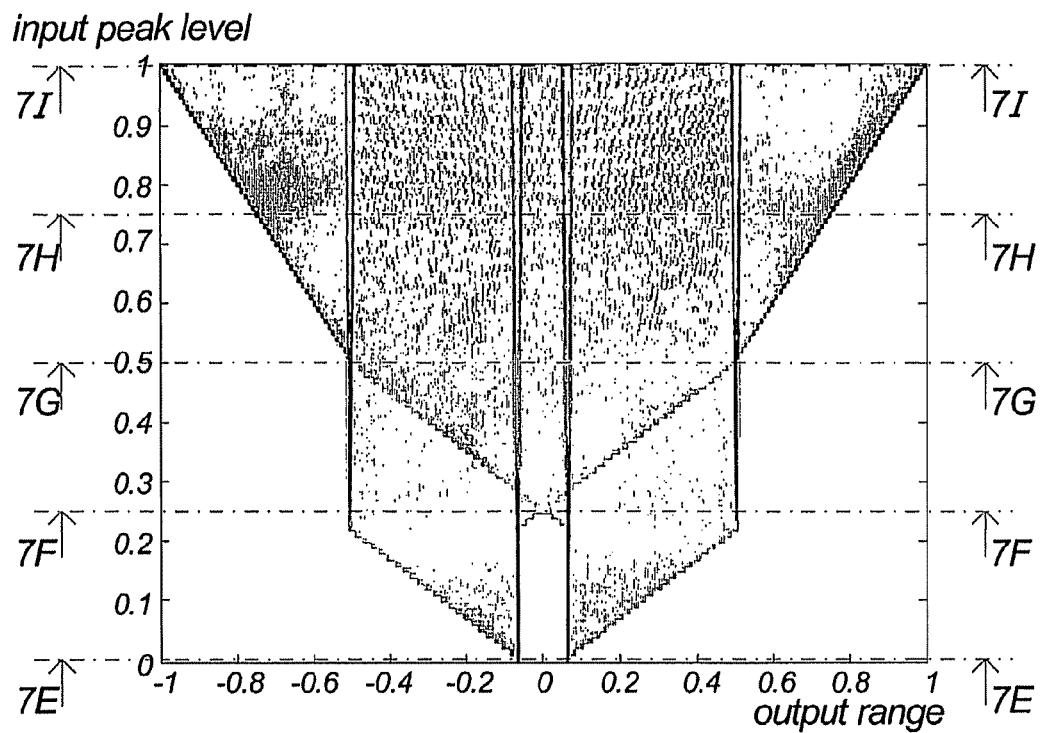
Figure 7E:
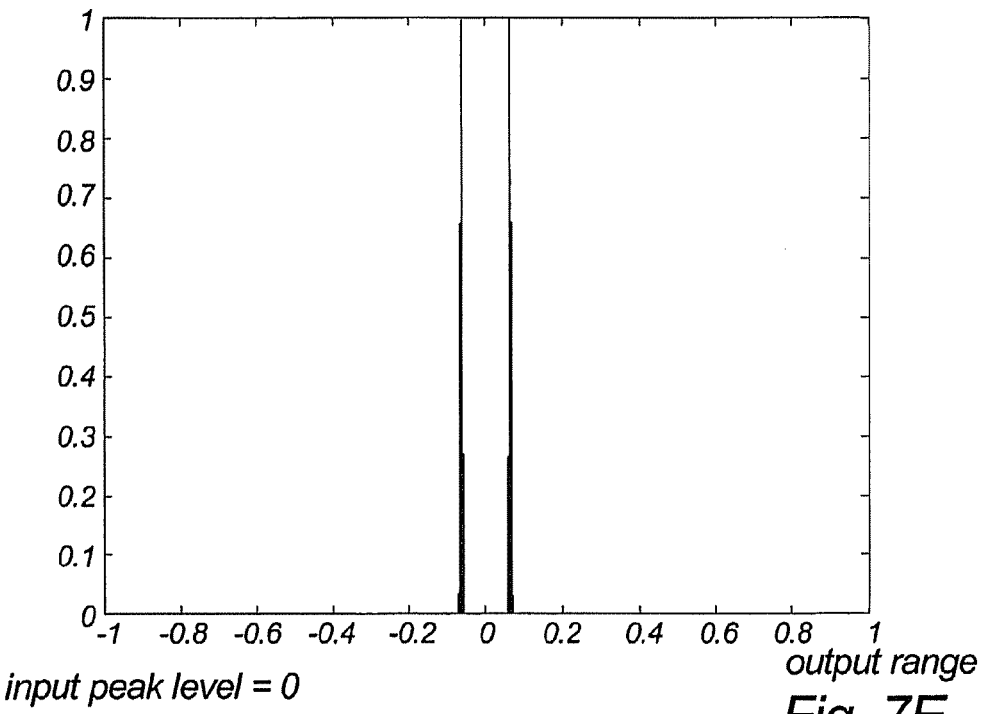
Figure 7F:
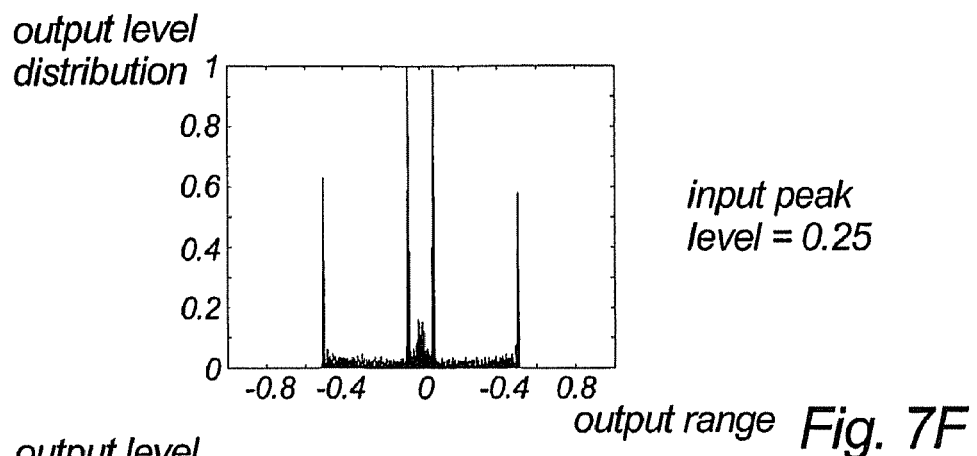
Figure 7G:
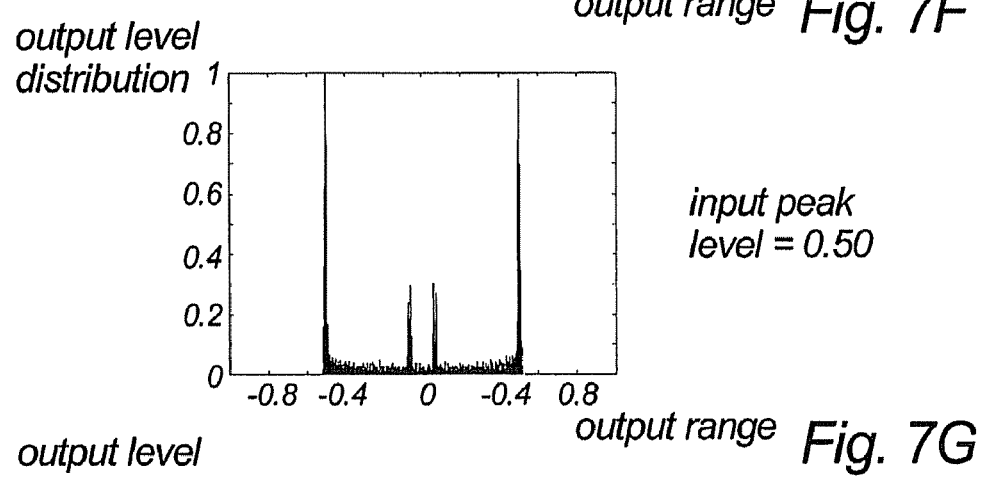
Figure 7H:
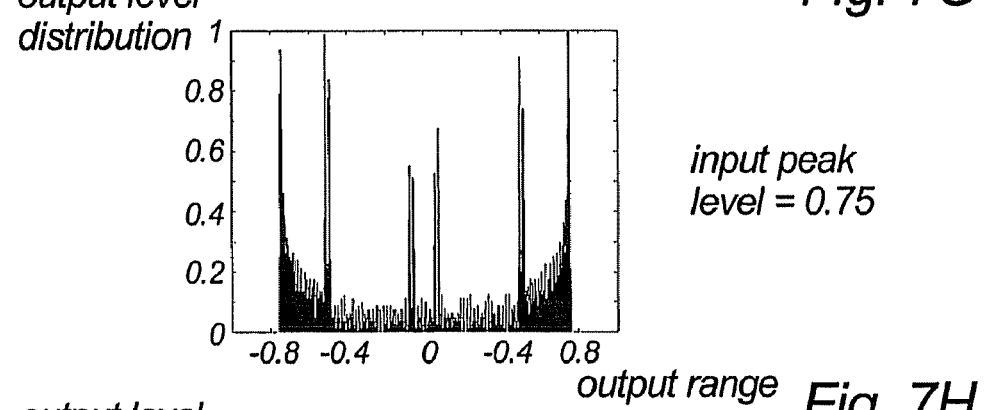
Figure 7I:
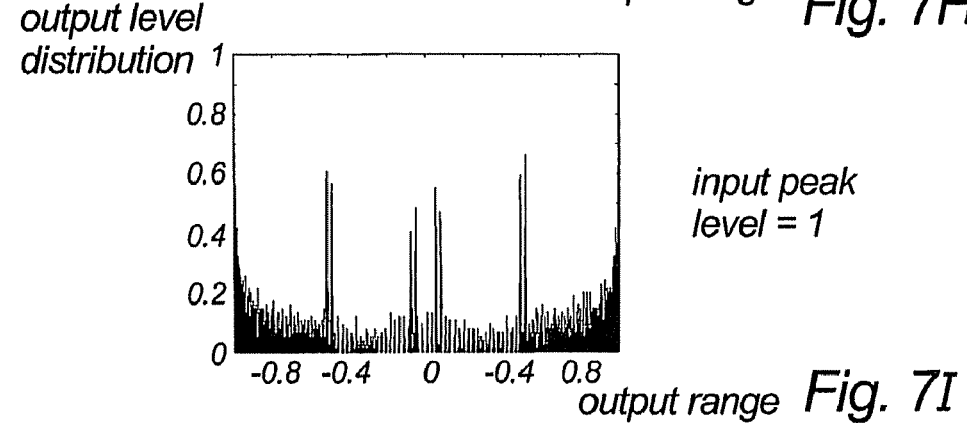

FIGS. 7D to 7I correspond to FIGS. 4A to 4F but regarding the embodiment of FIG. 6A instead of an empty amplitude distribution filter ADF. Thus, the input signal IS used for establishing the FIGS. 7D to 7I is a 1 kHz sine wave. FIG. 7D is a three-dimensional presentation of the output level distribution, indicated by shades of grey, for different input peak levels at the vertical axis and different output levels at the horizontal axis. Darker shades indicate a higher concentration of a specific output level within an output signal established from an input signal with a specific input peak level.

FIGS. 7E to 7I comprise sectional views of the plot in FIG. 7D for five specific input signal peak levels. Thus, FIG. 7E comprises a sectional view at input peak level 0, FIG. 7F at input peak level 0.25, FIG. 7G at input peak level 0.5, FIG. 7H at input peak level 0.75 and FIG. 7I at input peak level 1.

It may be seen that for small input signals having a peak amplitude of less than approximately 0.23, the output level distribution is zero within the problematic range between the low threshold and high thresholds, in this example approximately −0.05 and 0.05. This is because the input signal at these levels never becomes above the low level LL and, thus, never causes the outband signal OBS to decrease, cf FIG. 6B.

For higher input signal peak levels, i.e. above approximately 0.23, some occurrences of output levels within the problematic range appear. This is due to the transition of the outband signal OBS from the low level to the middle level.

Figure 8A:
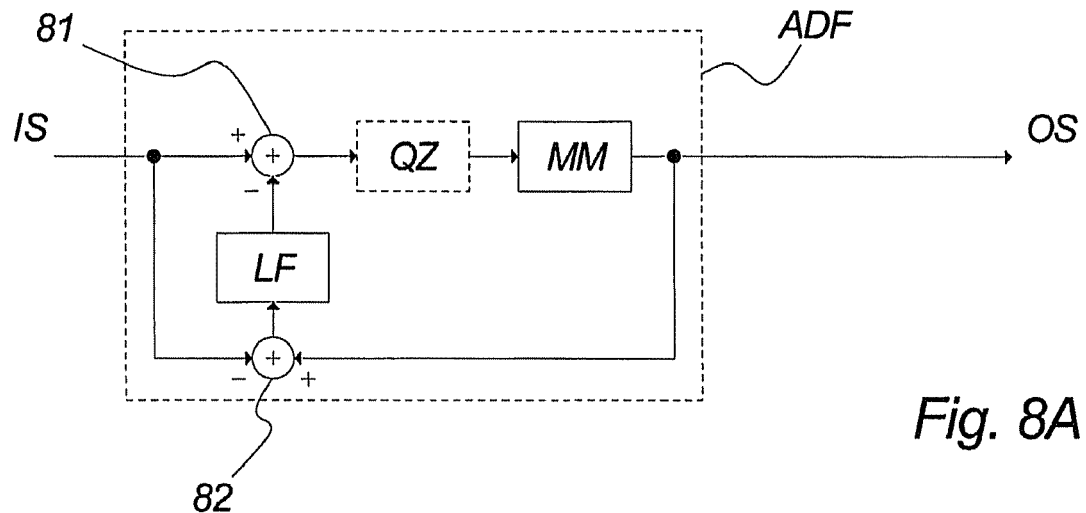

FIG. 8A illustrates an alternative embodiment of the amplitude distribution filter ADF of the present invention. It comprises an input signal IS and an output signal OS. The input signal is processed by a mapping means MM in order to establish the output signal OS. The embodiment, furthermore, comprises a loop filter LF as in the embodiment of FIG. 6A. This loop filter is coupled in the same way as with the former embodiment and serves the same purpose, namely noise shaping of errors or noise injected to the forward path subsequent to the summing point 81. The present embodiment also in a preferred embodiment comprises a quantizing means QZ but also embodiments without a separate quantizing means are within the scope of the present invention, hence the dashed outline.

The mapping means MM maps any input level within the one or more problematic ranges to levels outside the problematic ranges. To levels already outside the problematic ranges nothing is done. The mapping means may be kinds of hard limiters or any other means more or less intelligent that facilitate clearance of a specific amplitude range.

Figure 8B:
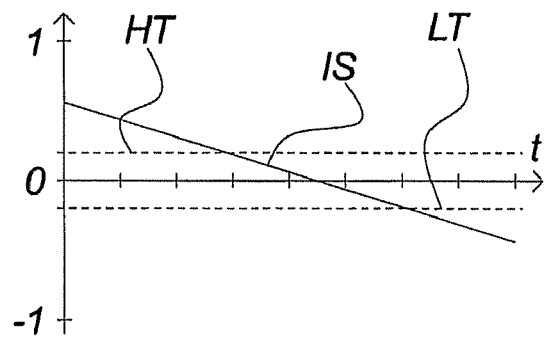
Figure 8C:
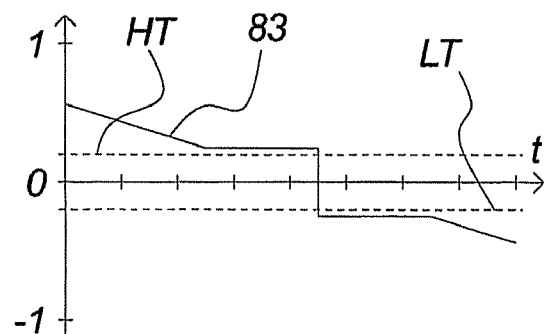

A possible effect of such a mapping means MM is shown by FIGS. 8B and 8C. FIG. 8B comprises an example input signal IS sweeping with time from a high amplitude across zero and a problematic range between a high threshold HT and a low threshold LT to a low amplitude. FIG. 8C illustrates a possible output 83 of a mapping means MM when fed with the input signal of FIG. 8B. It is noted that the effect of the mapping means shown in FIG. 8C is for a stand-alone mapping means, i.e. without any feedback compensation or noise-shaping. When the input signal decreases below a value a little higher than the high threshold HT, the mapping means keeps the output signal 83 at that value, until the input signal decreases below zero. Then the mapping means maintains an output level of a little below the low threshold LT until the input signal also decreases below that value and the mapping means has its output 83 follow the input signal.

As the mapping function 83 as illustrated in FIG. 8C, however, introduces significant amounts of errors in the utility band, the noise shaping feedback is applied by means of the loop filter LF. This filter may comprise the same characteristics as the loop filter in FIG. 6A, i.e. a low-pass IIR filter with a corner frequency at the top of the desired utility band, e.g. 20 kHz, and a large gain within the utility band.

The quantizing means QZ may be added when any subsequent stages are not able to exploit the amplitude resolution of the input signal. Quantizing the signal before mapping it may ease the implementation of the mapping means considerably. Furthermore, by placing the quantizing means within the forward path being noise-shaped quantizing errors are rejected. By placing the quantizing means QZ within the noise shaping loop instead of subsequently to the amplitude distribution filter ADF, as it is also possible, the errors established by the quantizing means QZ are also noise shaped.

Figure 9A:
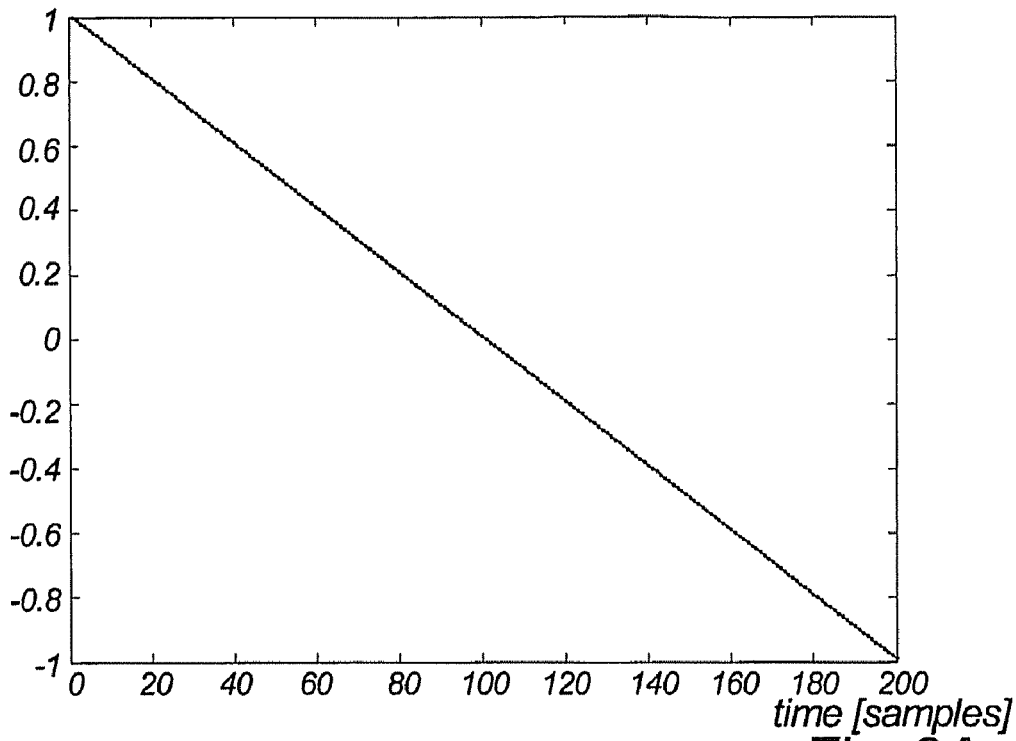
Figure 9B:
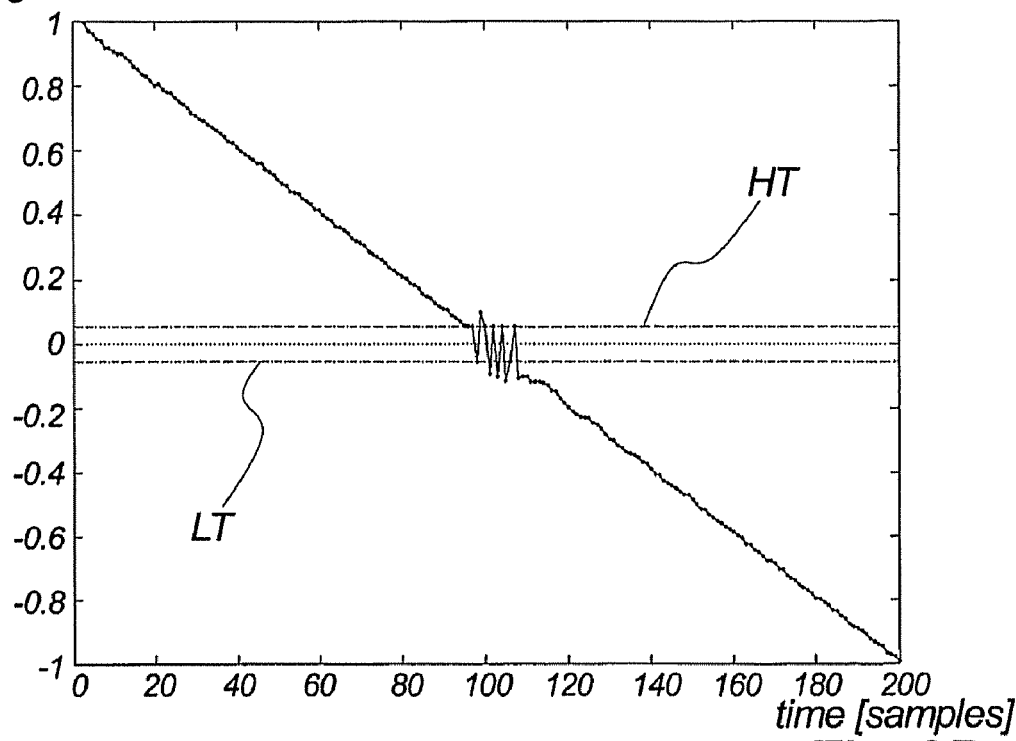
Figure 9C:
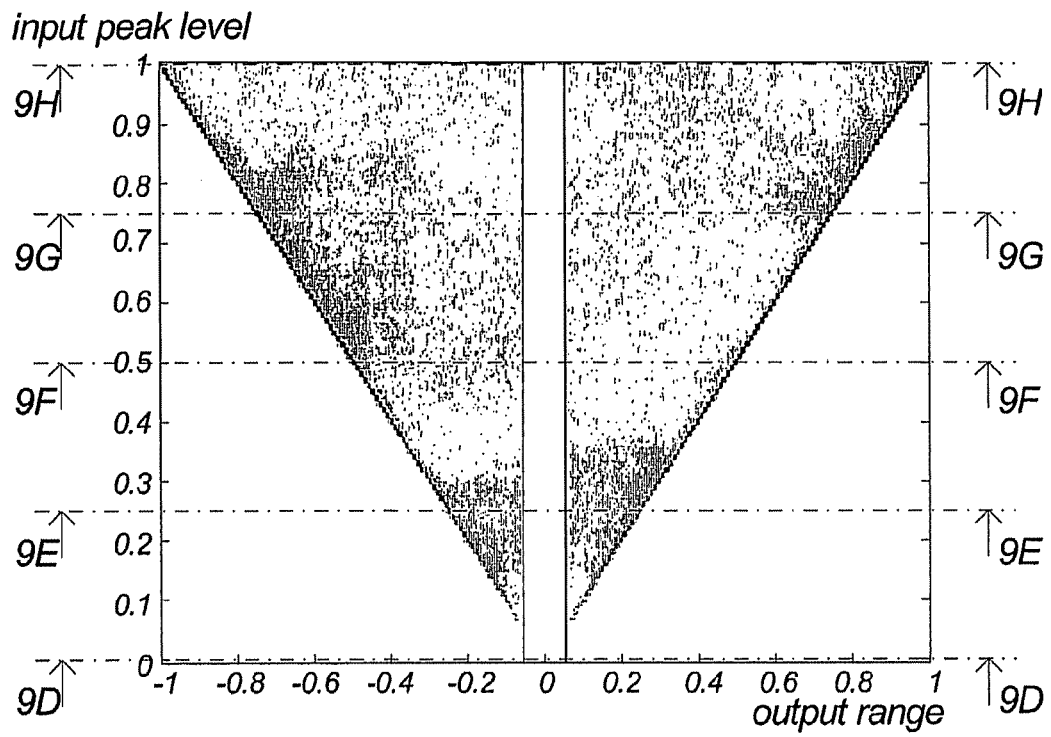

FIGS. 9A to 9H illustrate possible effects of the embodiment of FIG. 8A. FIG. 9A comprises a possible input signal sweeping with time from its maximum level 1 to its minimum level −1. FIG. 9B illustrates a possible output signal OS established by the embodiment illustrated in FIG. 8A, i.e. the combined mapping means MM and loop filter LF. The mapping means MM has caused the output signal to comprise no peak amplitudes within the range between the low threshold LT and high threshold HT. The oscillating nature of the output signal around the time where the input signal crosses zero, as opposed to the straightforward mapping shown in FIG. 8C, is caused by the noise-shaping loop.

Figure 9D:
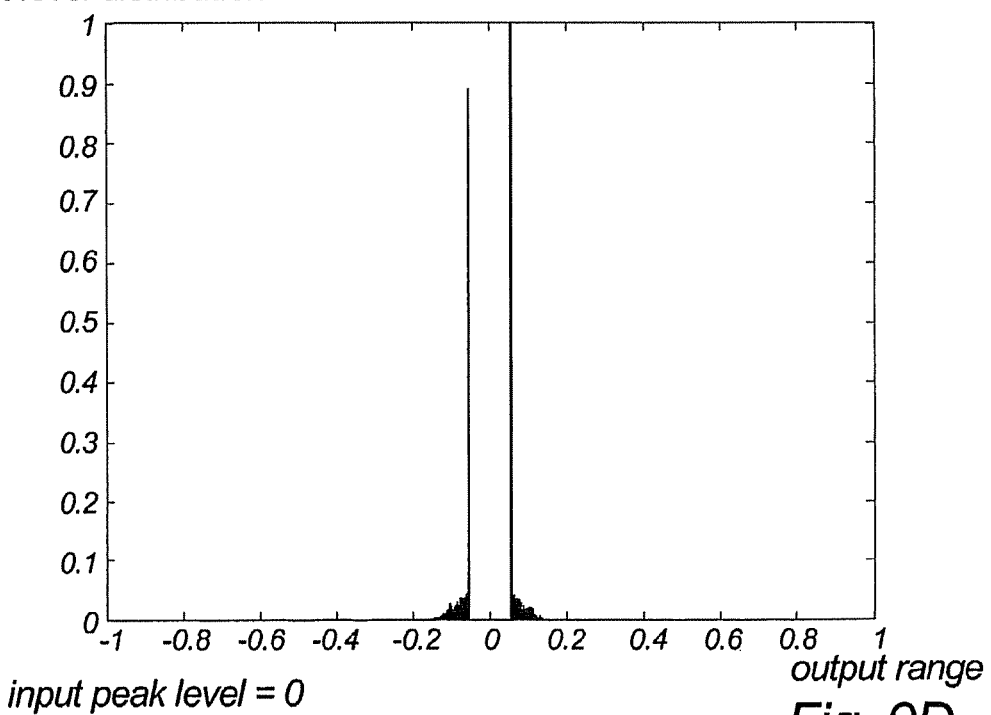
Figure 9E:
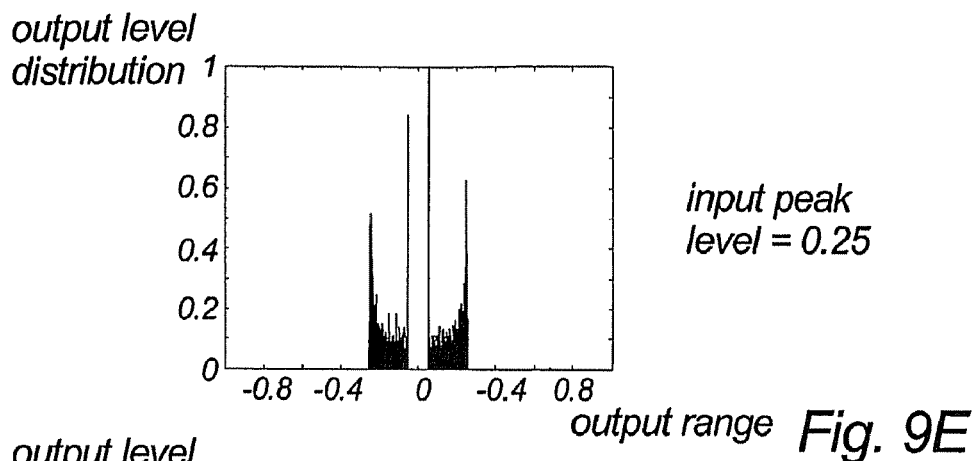
Figure 9F:
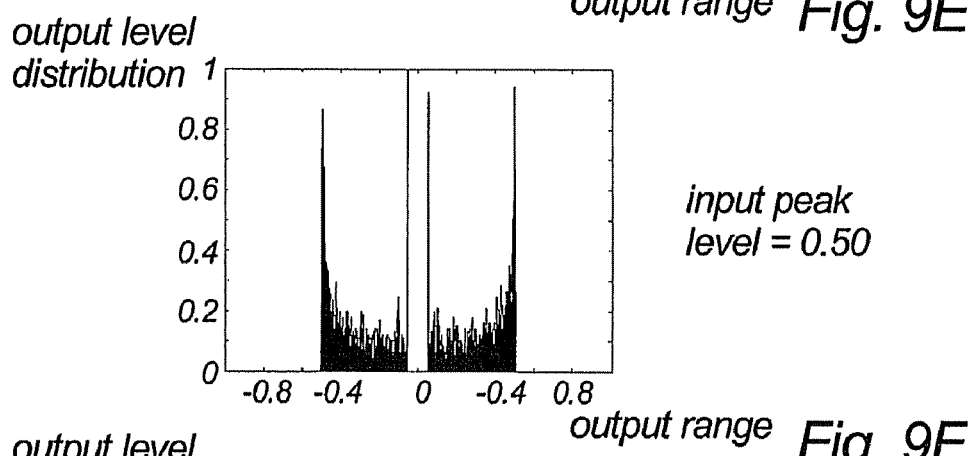
Figure 9G:
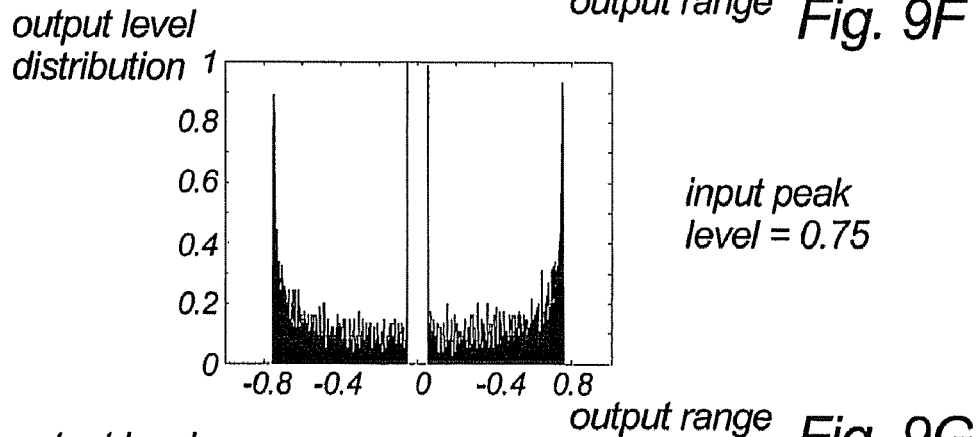
Figure 9H:
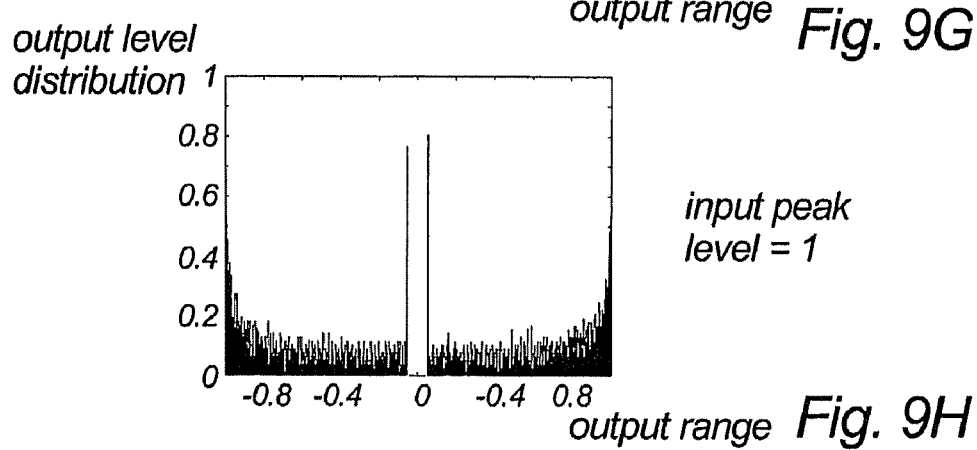

FIGS. 9C to 9H correspond in type to the FIGS. 4A to 4F and 7D to 7I but are established by inputting a 1 kHz sine wave to the embodiment of FIG. 8A. As seen, the output level distribution is zero within the problematic range for any input peak level, i.e. no pulses of less than the minimum pulse width ever occur when applying the present embodiment to a PWM amplifier. Regarding FIG. 9D illustrating the output level distribution for a zero input signal, i.e. when idling, a certain concentration of output levels below and above the low and high thresholds exists. This is due to the noise shaping mechanism causing several different amplitude levels to be mapped to instead of just the threshold levels.

Figure 10:
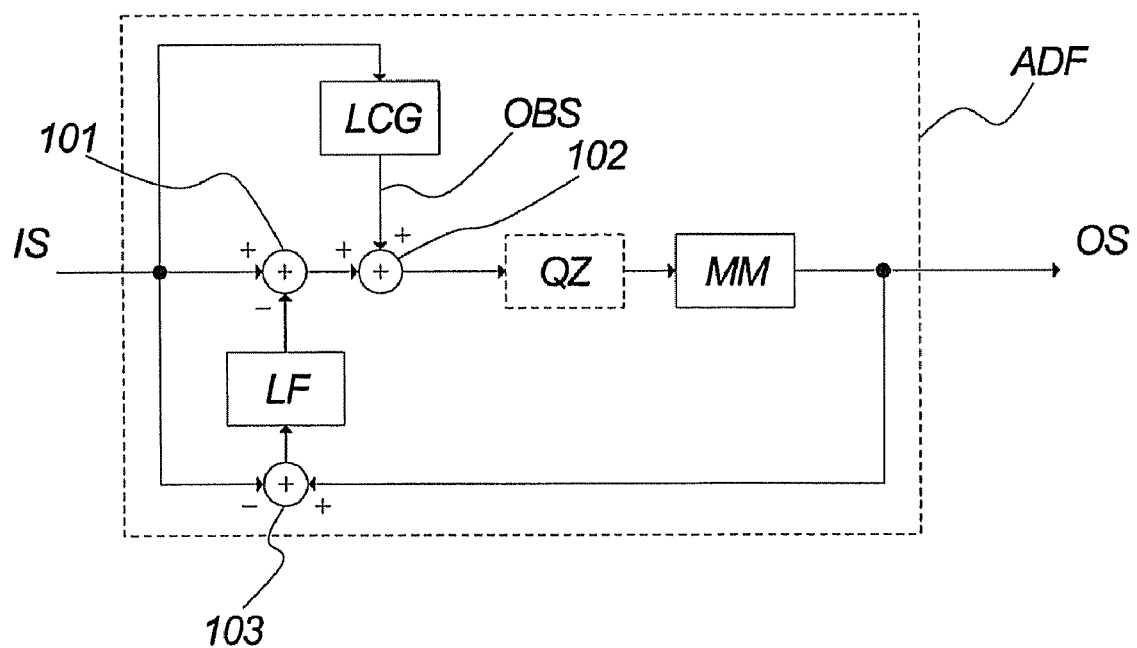

FIG. 10 illustrates a preferred embodiment of the amplitude distribution filter ADF of the present invention. It comprises an input signal IS and an output signal OS. Furthermore, it comprises the elements of both the embodiment of FIG. 6A and the embodiment of FIG. 8A, i.e. a level controlled generator LCG adding an outband signal OBS to the input signal, a mapping means MM mapping signal level within certain ranges to certain different levels, and a loop filter LF, which in virtue of its location performs noise shaping.

The addition of the outband signal to the input signal causes the input signal, at times with an amplitude close to zero, to be oscillating around the problematic range but, nevertheless, sometimes causes amplitudes within the problematic range to occur at other times. By letting this composite signal comprising the outband signal and the input signal to be processed by the mapping means MM, it is ensured that no output signal levels within the problematic range occur, i.e. the output level distribution is zero between the low and high thresholds. The distortion injected by the mapping means is less than when the signal is not pre-processed by adding the outband signal as the outband signal causes far less samples to be mapped and also causes the times where mappings are required to be moved farther away from the input signal zero crossings.

Figure 11A:
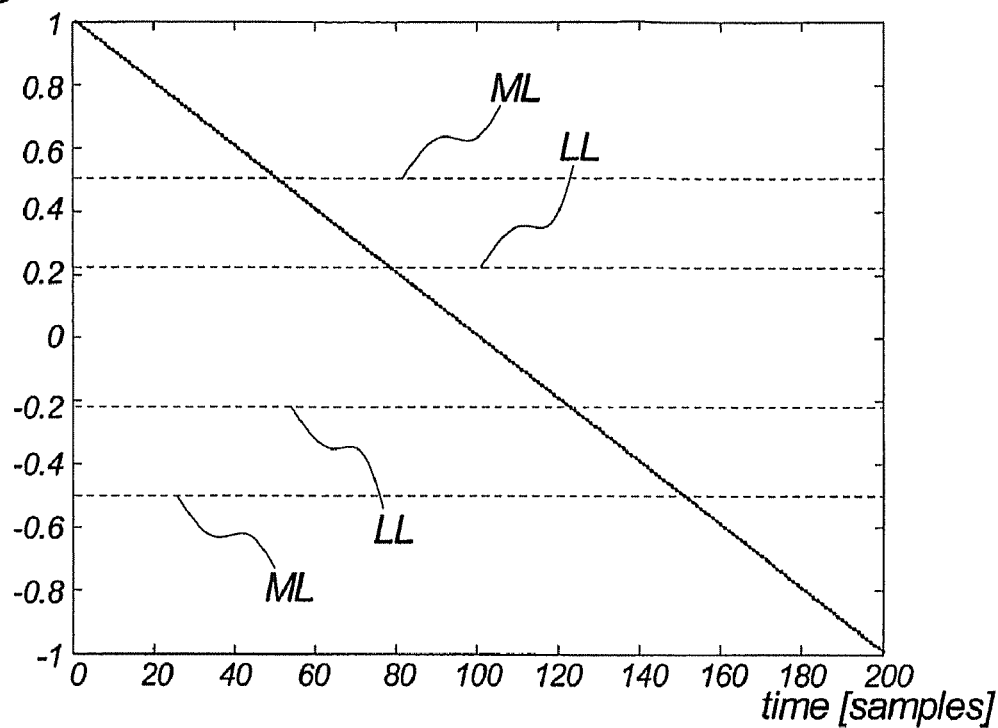
Figure 11B:
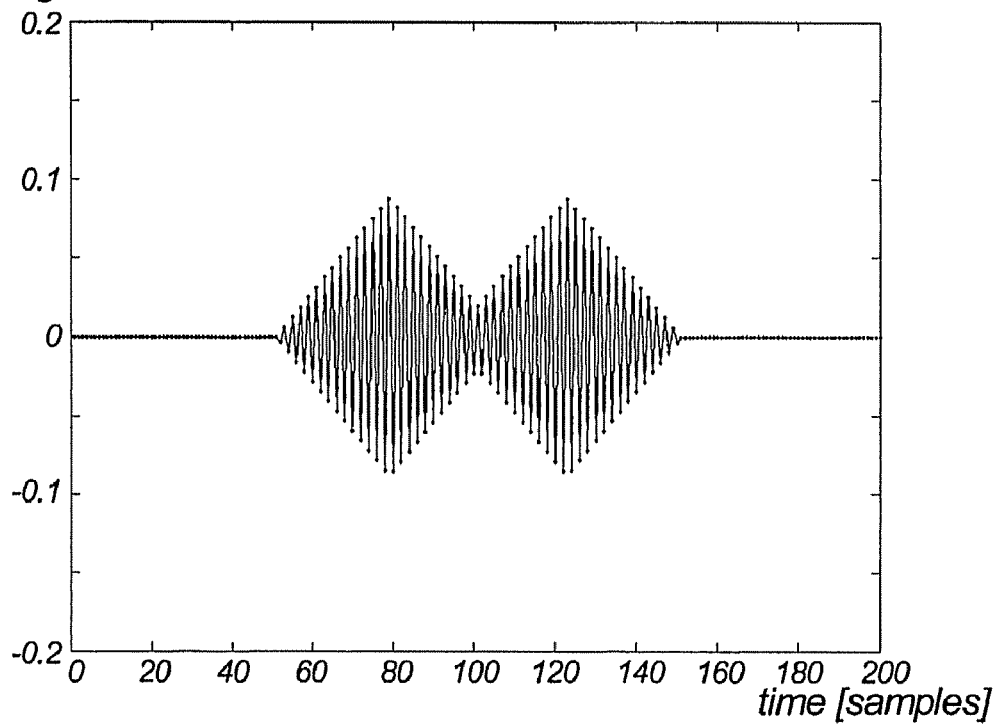
Figure 11C:
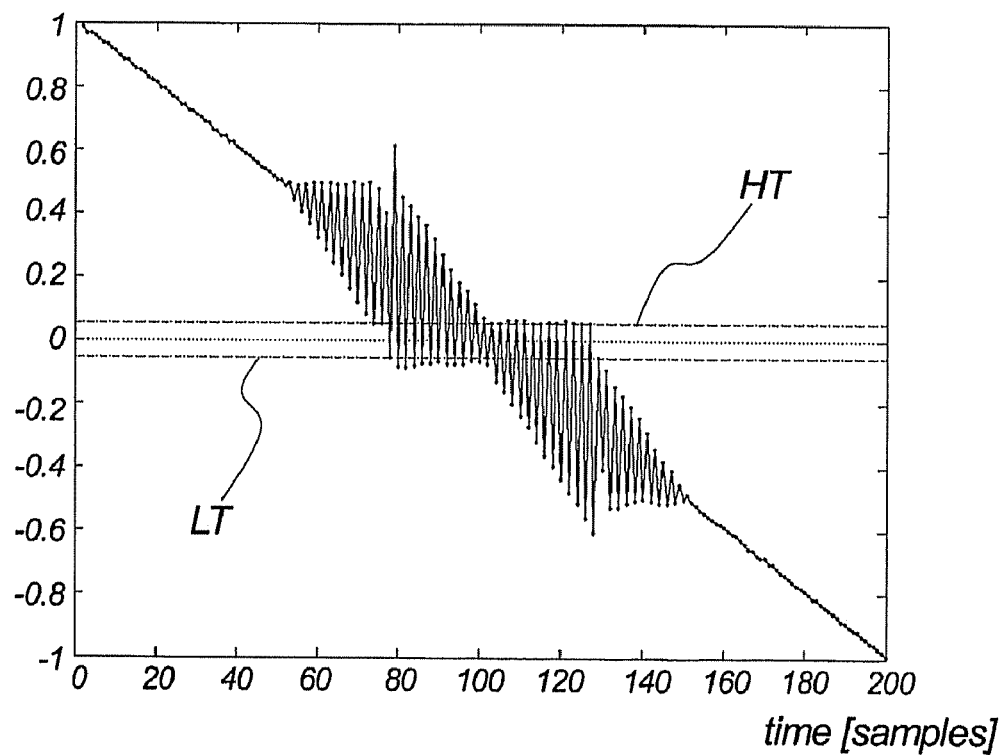
Figure 11D:
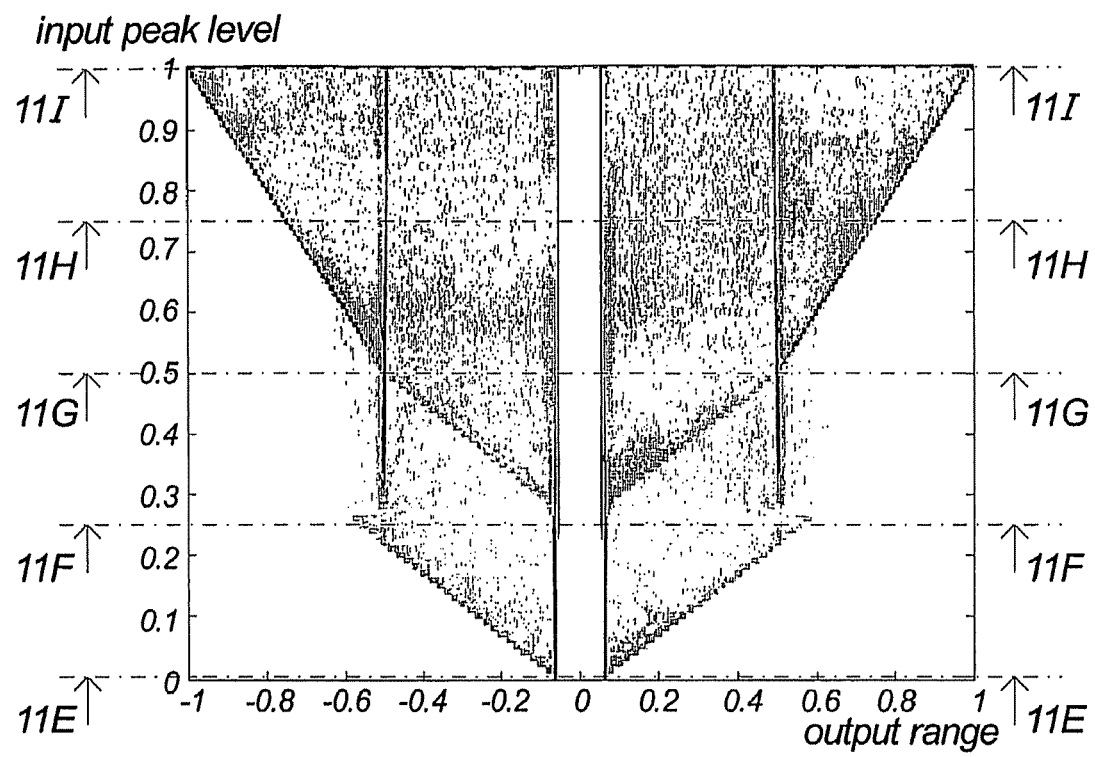
Figure 11E:
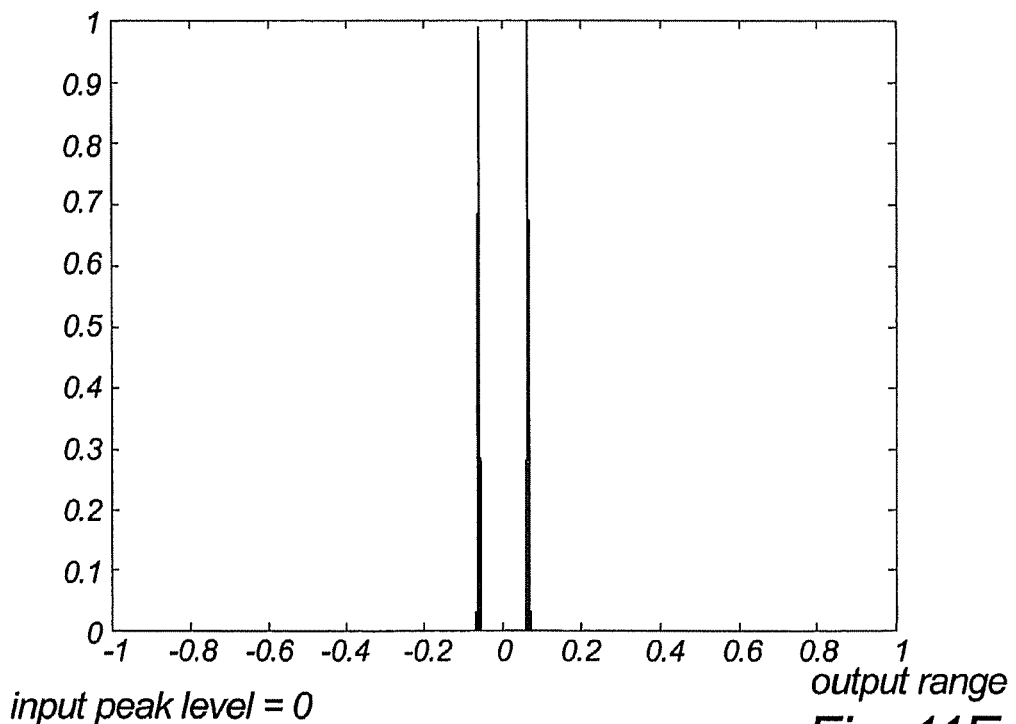
Figure 11F:
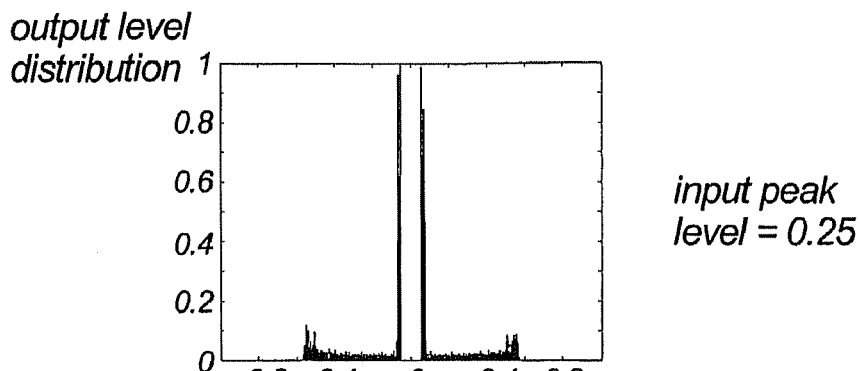
Figure 11G:
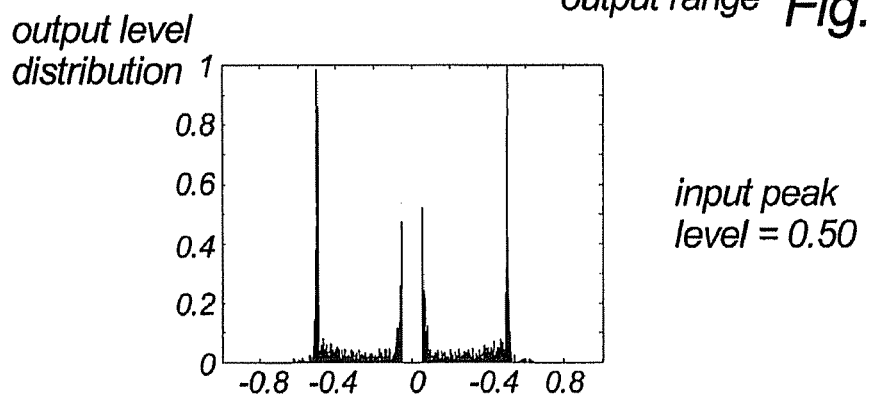
Figure 11H:
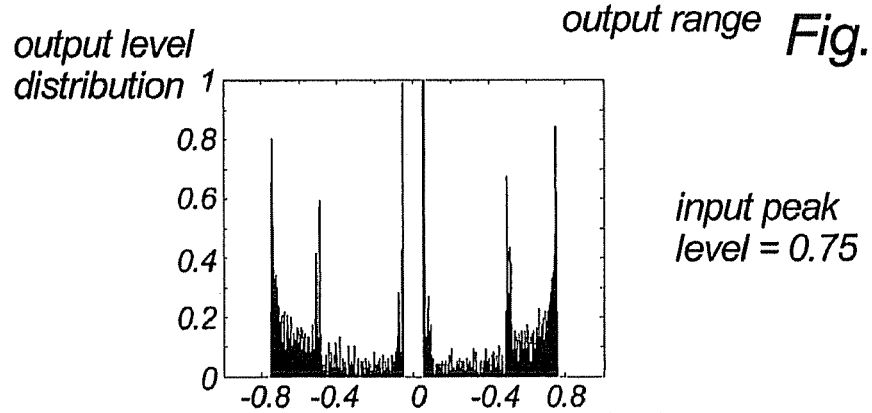
Figure 11I:
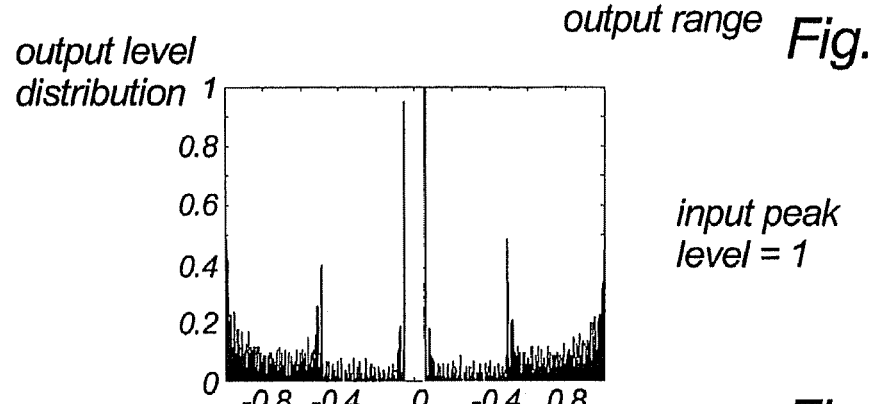

FIGS. 11A to 11C illustrate how the embodiment of FIG. 10 may affect a possible input signal. A possible input signal IS is shown in FIG. 11A together with dashed lines indicating the low level LL and middle level ML used for establishing the outband signal according to the algorithm of FIG. 6B. A corresponding outband signal OBS is shown in FIG. 11B. FIG. 11C illustrates a possible output signal OS established by the embodiment illustrated in FIG. 10 and on the basis of the input signal of FIG. 11A and the outband signal of FIG. 11B. FIG. 11C, furthermore, comprises dashed lines indicating a low threshold LT and a high threshold HT. As it can be seen, it is possible by means of the embodiment of FIG. 10 to establish an output signal comprising no sample values within the problematic range between the low and high thresholds. As described above this results from the combined work of the level controlled generator and summing point 102, the mapping means MM, and the noise shaping loop filter LF.

FIGS. 11D to 11I illustrate examples of the output signal level distribution that may result from the embodiment of FIG. 10. FIG. 11D to 11I correspond in type to e.g. the FIGS. 9C to 9H but are established by inputting a 1 kHz sine wave to the embodiment of FIG. 10. As seen, the output level distribution is zero within the problematic range for any input peak level, i.e. no pulses of less than the minimum pulse width ever occur when applying the present embodiment to a PWM amplifier.

Figure 12:
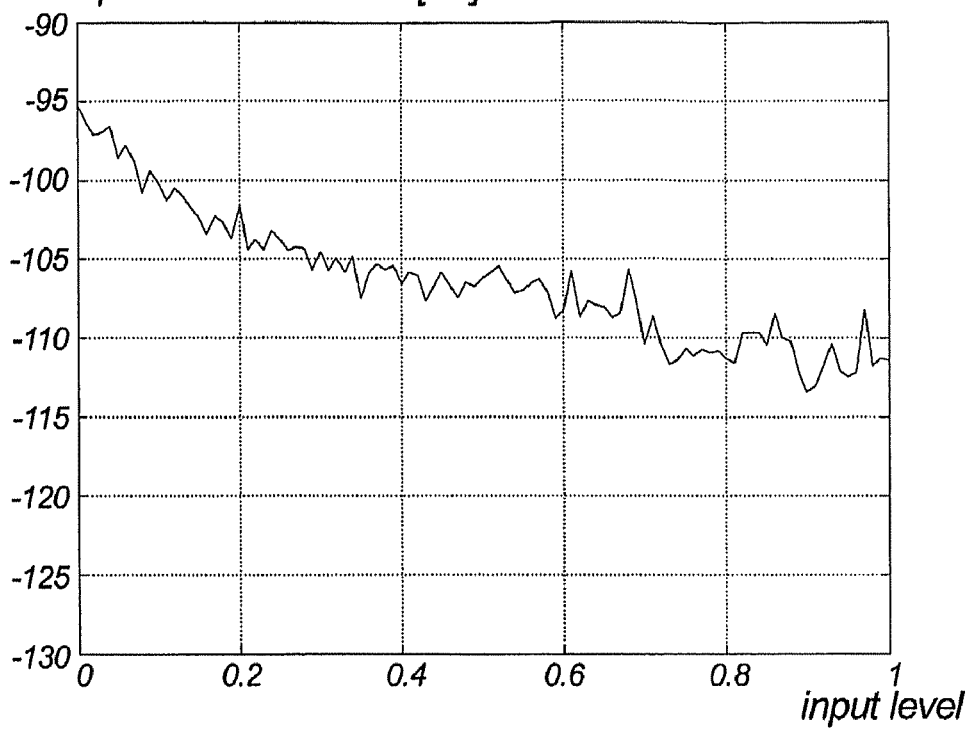
Figure 13:
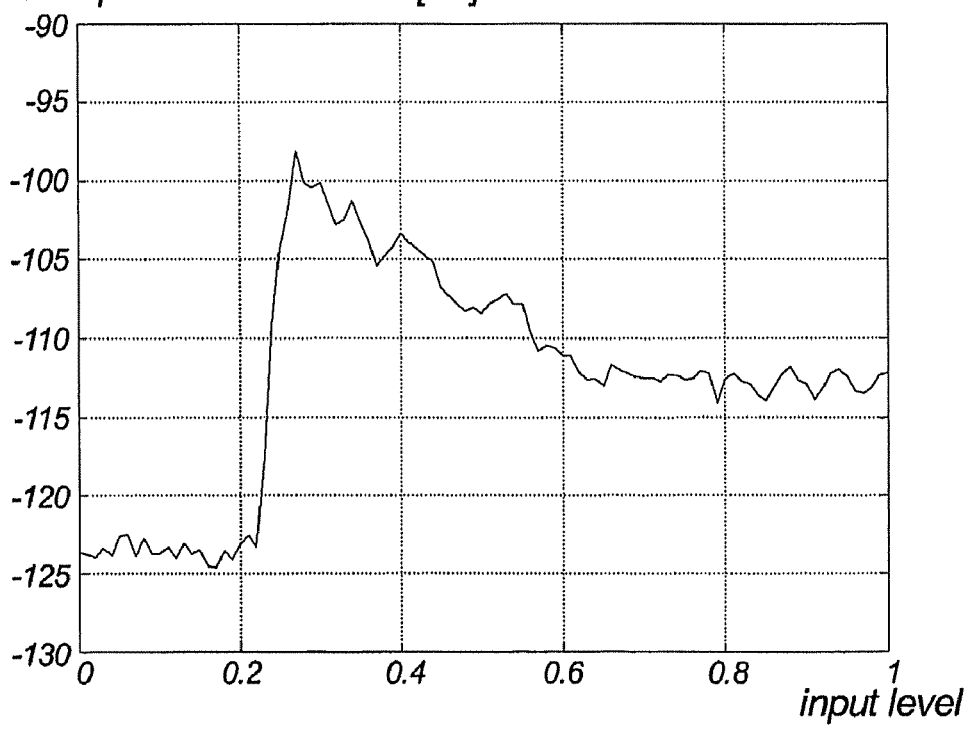

FIGS. 12 and 13 illustrate the relative noise floor, i.e. distortion and errors, which is comprised by the output signal by using the amplitude distribution filter embodiments of FIGS. 8A and 10, respectively. The horizontal axes correspond to the absolute input level, i.e. 0 to 1 for the examples given above. The vertical axes correspond to the relative noise floor of the output signal. By comparing the two illustrations it is easily seen that the embodiment of FIG. 10 that combines a level controlled generator with mapping means adds far less noise to small signals, i.e. input levels less than approximately 0.2, than the embodiment of FIG. 8A comprising only mapping means. As noise in small signals is naturally more disturbing than in large signals, the embodiment of FIG. 10 is preferred.

Figure 14A:
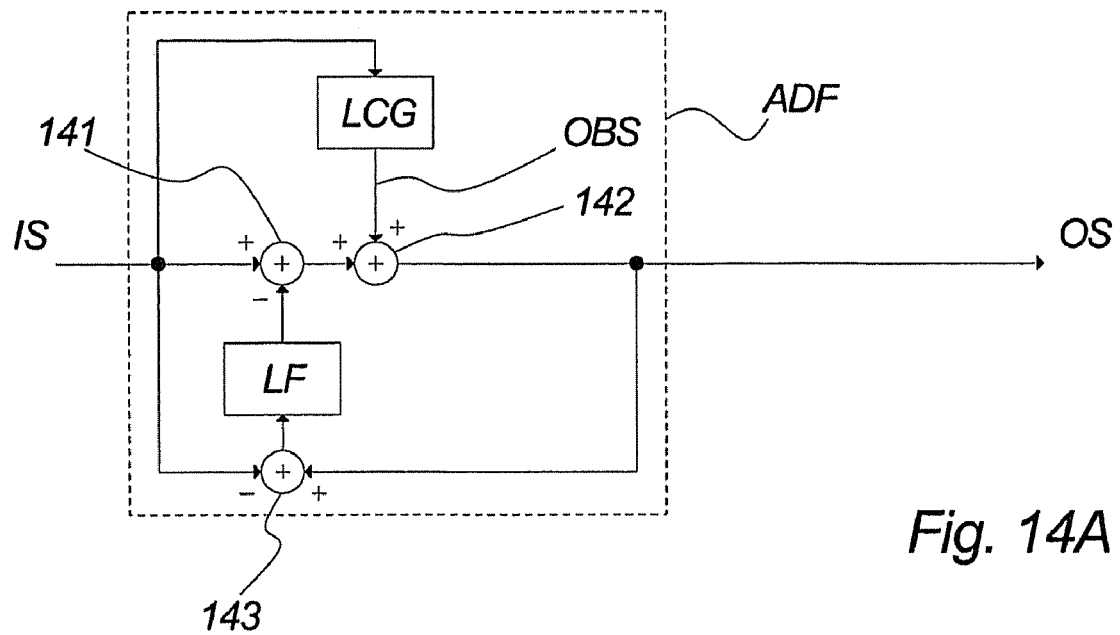
Figure 14B:
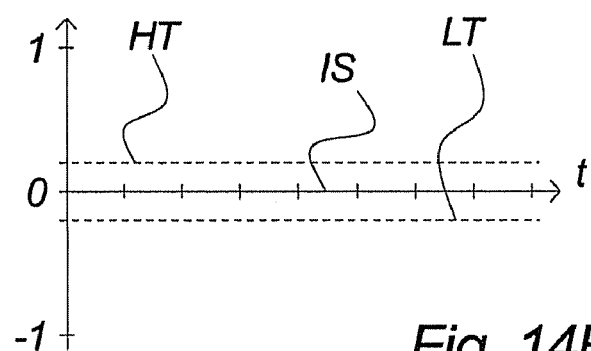
Figure 14C:
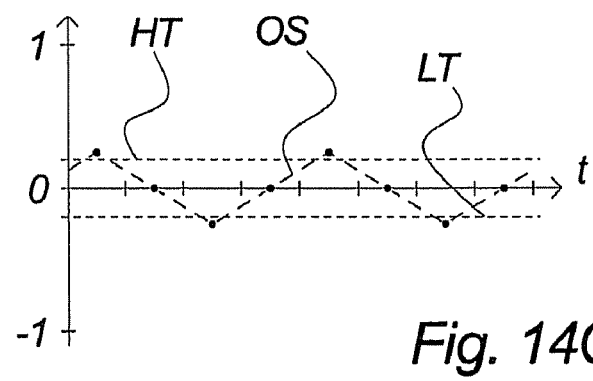

FIGS. 14A to 14D illustrate an alternative embodiment of the present invention. FIG. 14A is identical to FIG. 6A and comprises a level controlled generator establishing an outband signal OBS on the basis of an input signal IS and a loop filter LF acting as a noise shaper. FIG. 14B is identical to FIG. 5B and shows an empty input signal IS and low threshold LT and high threshold HT. FIG. 14C illustrates a possible output signal OS established by the embodiment of FIG. 14A. As the input signal IS is empty, the output signal OS of FIG. 14C also corresponds to the outband signal OBS added by the summing point 142. Any preferences and characteristics of the outband signal mentioned above, e.g. regarding FIG. 5A to 6E, also apply to the outband signal of the present embodiment, however, the outband signal of the present embodiment is preferably of a frequency rate a quarter of the rate at which the output signal is sampled in subsequent stages, e.g. in a subsequent pulse width modulator or digital amplifier. If, for example, the switching rate in a subsequent PWM amplifier is 384 kHz, the rate of a preferred outband signal would be 96 kHz. Thereby, it is possible as shown in FIG. 14C to have every second sample value to be zero for an empty input signal.

As described above, the present example assumes a problematic range, e.g. due to non-linear processing in subsequent stages between the low threshold LT and high threshold HT. However, as also described above, the level of exact zero is in fact not typically problematic. In above described embodiments, it is just more uncomplicated to treat the special value of zero as belonging to the problematic range. For applications where zero is in fact not a problem to process correctly, e.g. in a PWM system where zero is represented by no pulse at all, i.e. a duty cycle of 0%, the problematic range may as well be divided into a range from the low threshold LT to, but not including, zero and a range from, but not including, zero to the high threshold HT. In such a system the embodiment of FIG. 14C may cause significant power savings.

Figure 14D:
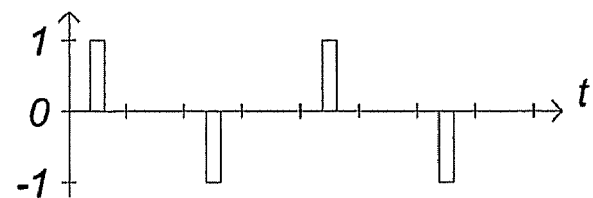

As for an empty input signal every second output sample is zero, the power switches in a possible subsequent PWM amplifier should only produce the half of the pulses of a typical amplifier as also illustrated in FIG. 14D. Thereby, also electromagnetic compatibility and interference (EMC/EMI) issues may be improved.

Figure 15A:
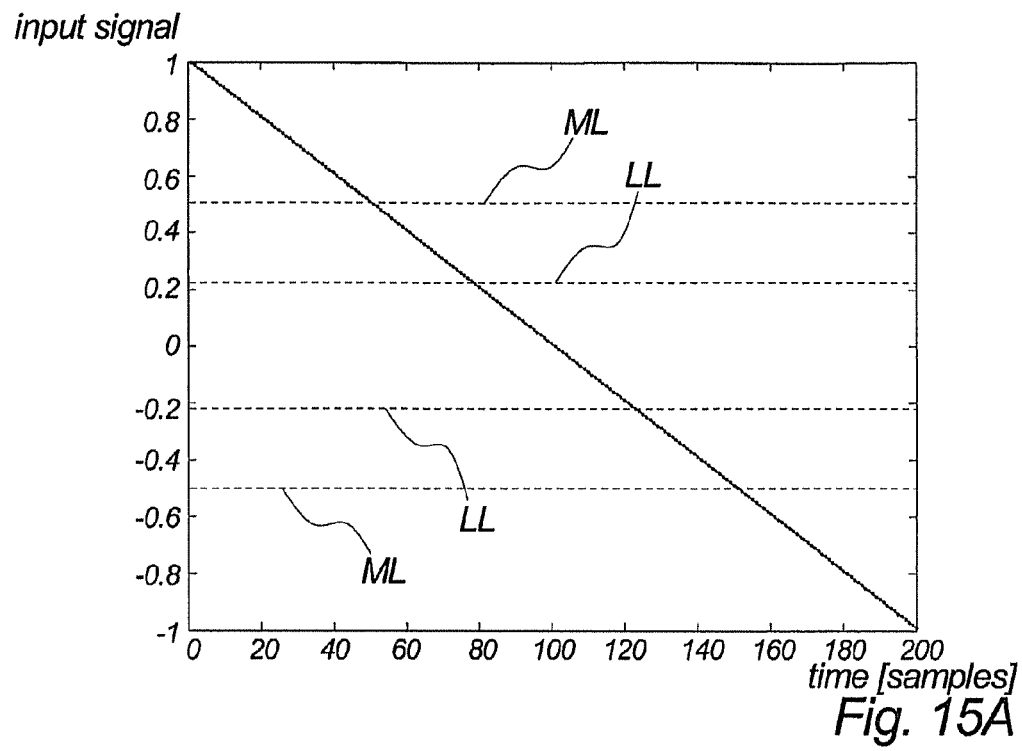
Figure 15B:
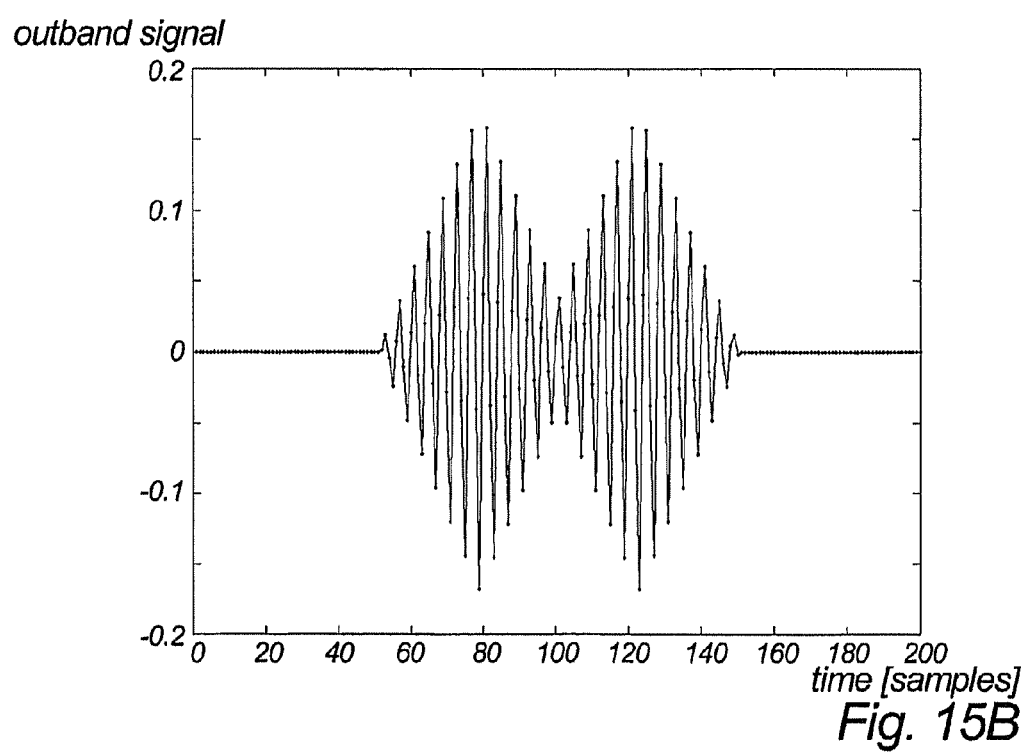
Figure 15C:
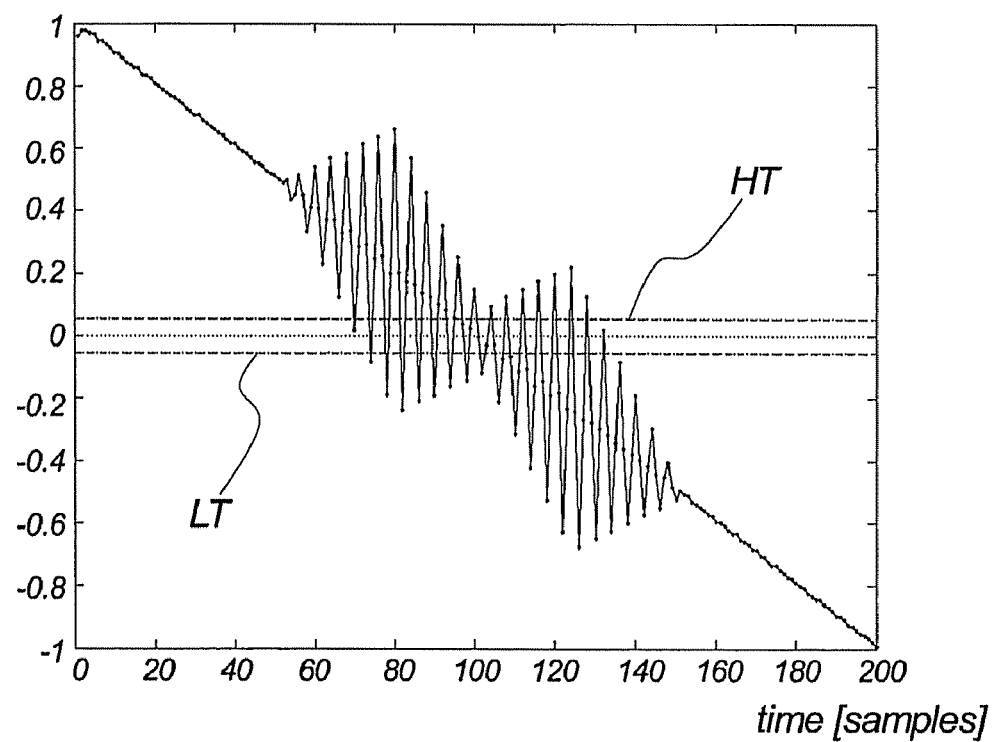
Figure 15D:
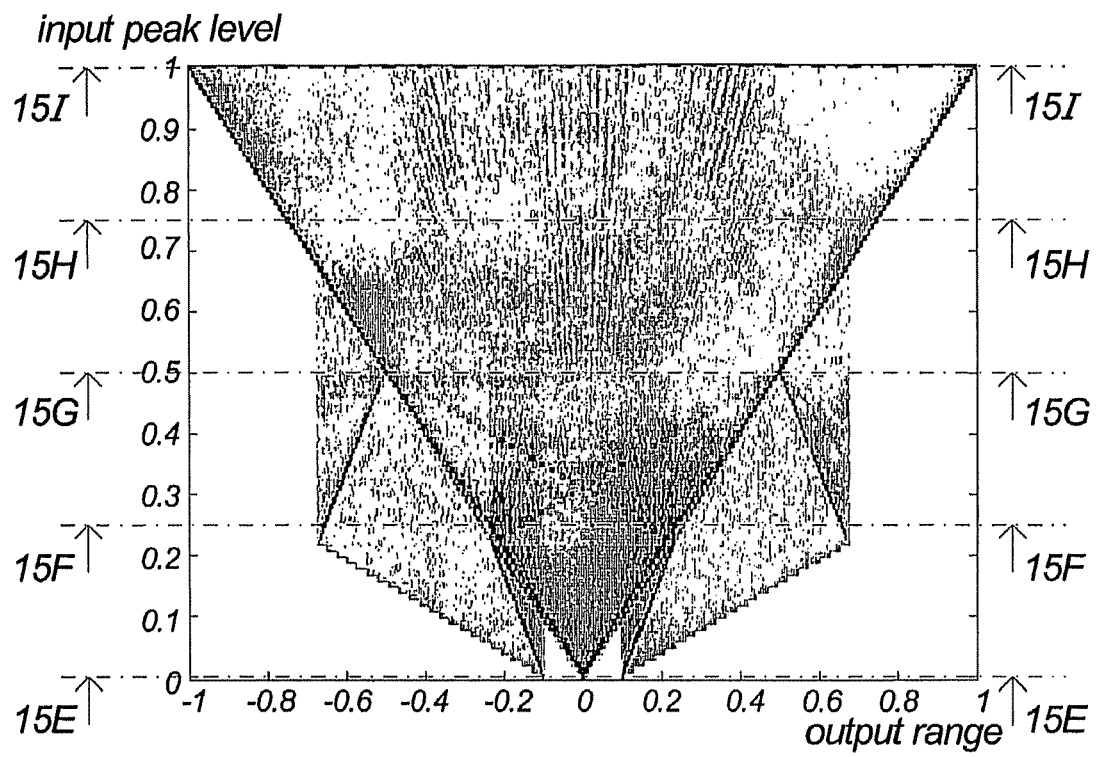
Figure 15E:
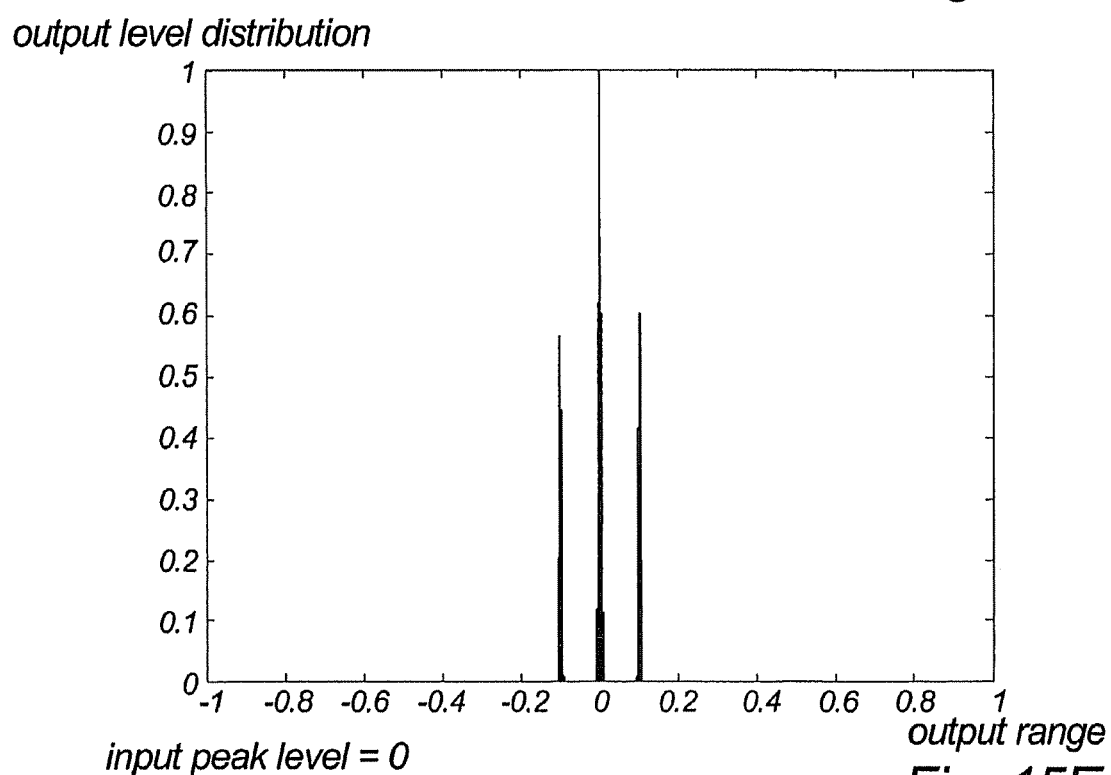
Figure 15F:
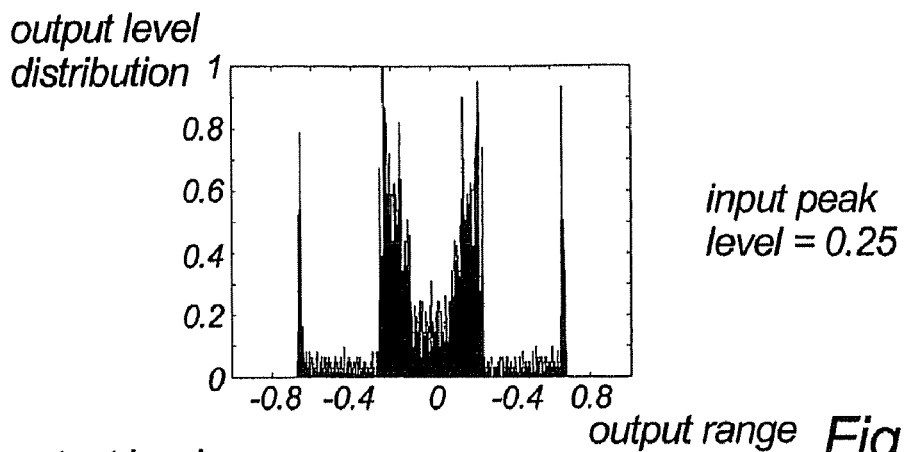
Figure 15G:
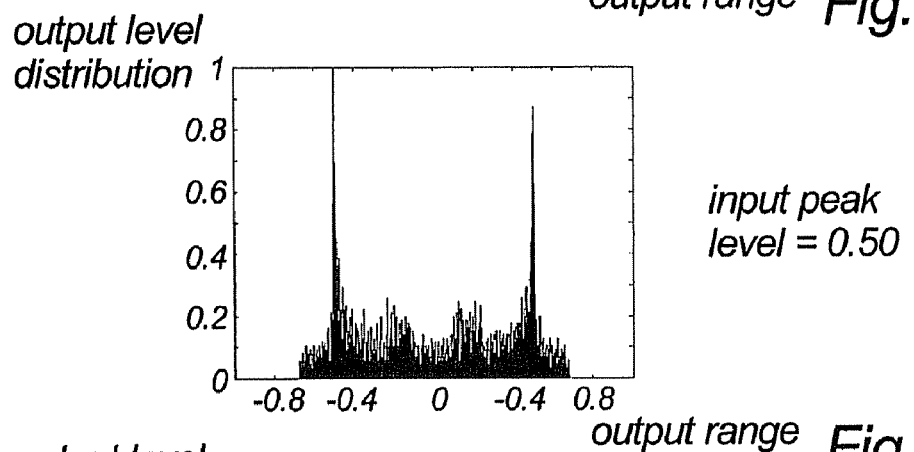
Figure 15H:
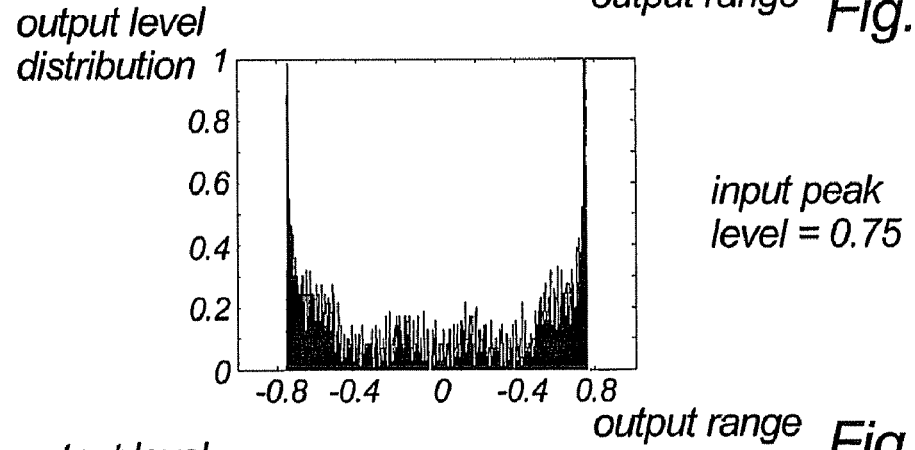
Figure 15I:
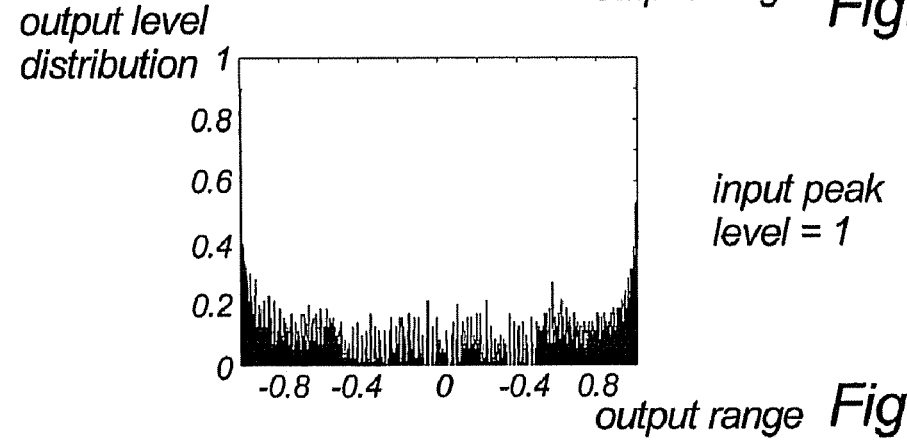

FIGS. 15A to 15C illustrate how the embodiment of FIG. 14A may process an example input signal not being zero. FIG. 15A illustrates a possible input signal IS, sweeping from 1 to −1. It also illustrates possible low level LL and middle level ML of a possible level controlled outband signal algorithm as, e.g., the one illustrated in FIG. 6B. FIG. 15B illustrates a possible outband signal OBS established by the embodiment of FIG. 14A. The preferred sample values are shown by dots. FIG. 14C illustrates a possible output signal OS established by summing together the signals of FIGS. 14A and 14B and applying noise shaping by means of the loop filter LF. The preferred sample values are shown by dots. Also the low threshold LT and high threshold HT are shown. It can be seen that several sample values are within the problematic range, but not zero, i.e. requires impossible narrow pulses to be established if subsequently processed by a typical PWM amplifier. And, unfortunately, several of these values occur at times where the input signal, i.e. utility content of the output signal, is close to zero.

FIGS. 15D to 15I illustrate examples of the output signal level distribution that may result from the embodiment of FIG. 14A. FIG. 15D to 15I correspond in type to, e.g., the FIGS. 9C to 9H but are established by inputting a 1 kHz sine wave to the embodiment of FIG. 14A. As seen from FIGS. 15D and 15E only output levels of zero and safe offsets to either side of zero occur. But as seen from FIGS. 15F to 15I and, e.g., by comparison with FIGS. 7F to 7I, the concentration of occurrences of levels within the problematic range and, thus, pulses of less than the minimum pulse width if used for a PWM amplifier is greater than with the embodiment of FIG. 6A.

Figure 16A:
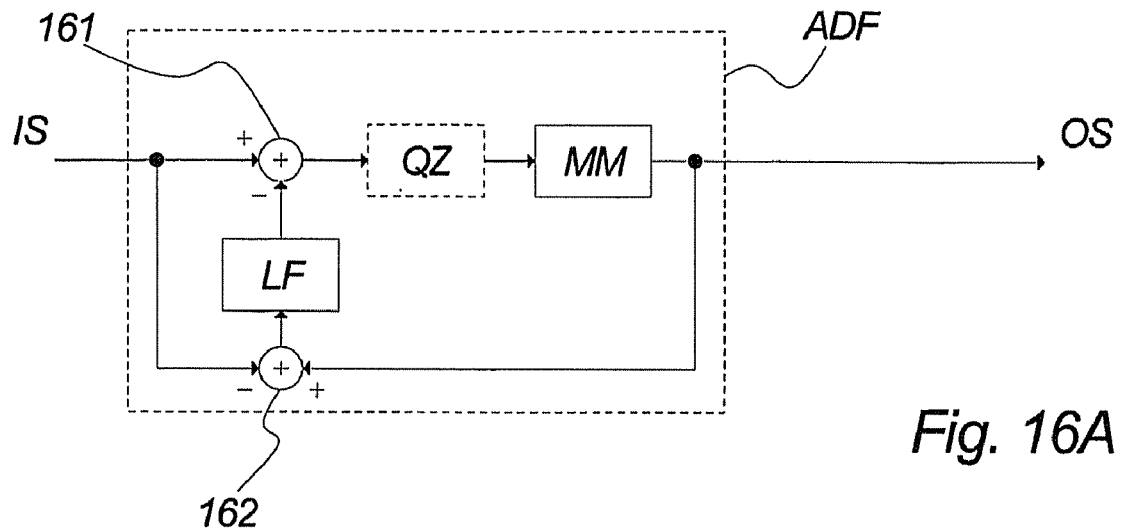
Figure 16B:
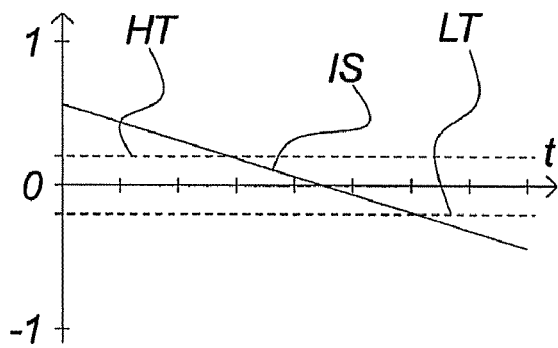
Figure 16C:
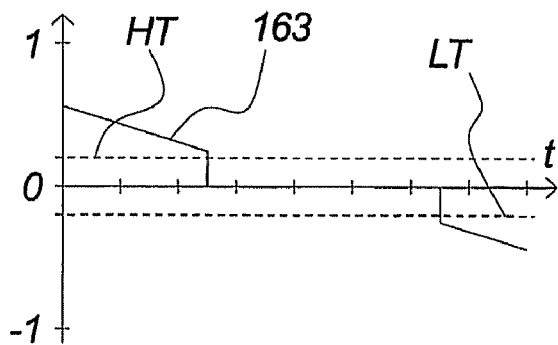

FIGS. 16A to 16C illustrate yet an alternative embodiment of the present invention. FIG. 16A is identical to FIG. 8A and comprises an input signal being processed by an optional quantizing means QZ, a mapping means MM and a loop filter LF. Contrary to the embodiment of FIG. 8A, the mapping means MM of the present embodiment maps values within the problematic range to zero instead of outside the problematic range. This is illustrated in FIGS. 16B and 16C. FIG. 16B illustrates a possible input signal IS and the problematic range is indicated by low threshold LT and high threshold HT. FIG. 16C illustrates the working of the mapping means MM by showing what would be the output 163 of the mapping means MM if the loop filter LF and feedback path were omitted. As seen from FIG. 16C the output 163 is mapped to the zero level when the input decreases below a value just above the high threshold HT and stays at zero until the input decreases below a value just below a low threshold LT.

The quantizing means QZ may be added when any subsequent stages are not able to exploit the amplitude resolution of the input signal. Quantizing the signal before mapping it may ease the implementation of the mapping means considerably. Furthermore, by placing the quantizing means within the forward path being noise-shaped results in the rejection of quantizing errors.

Figure 17A:
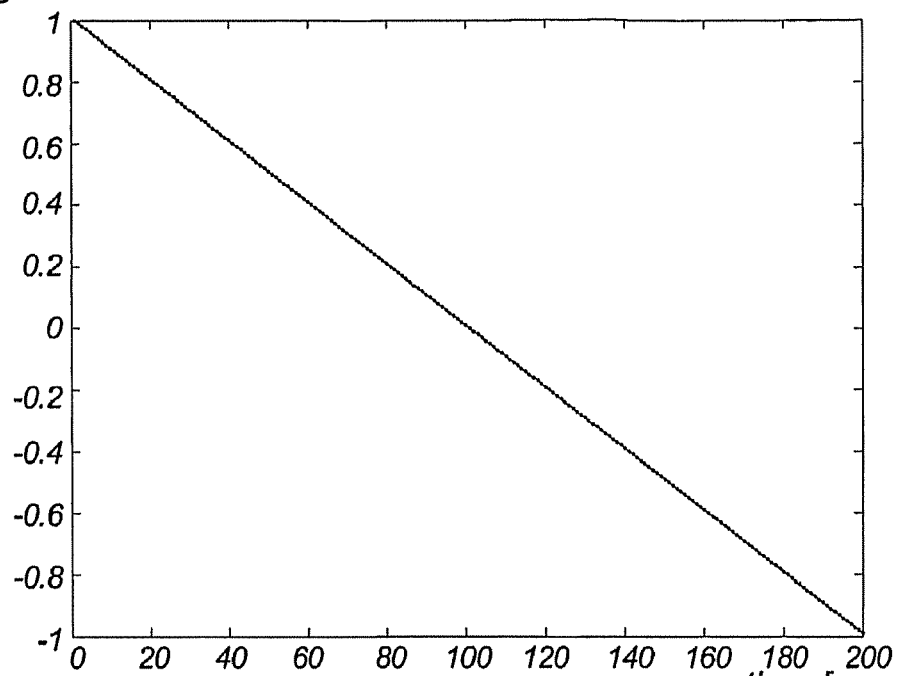
Figure 17B:
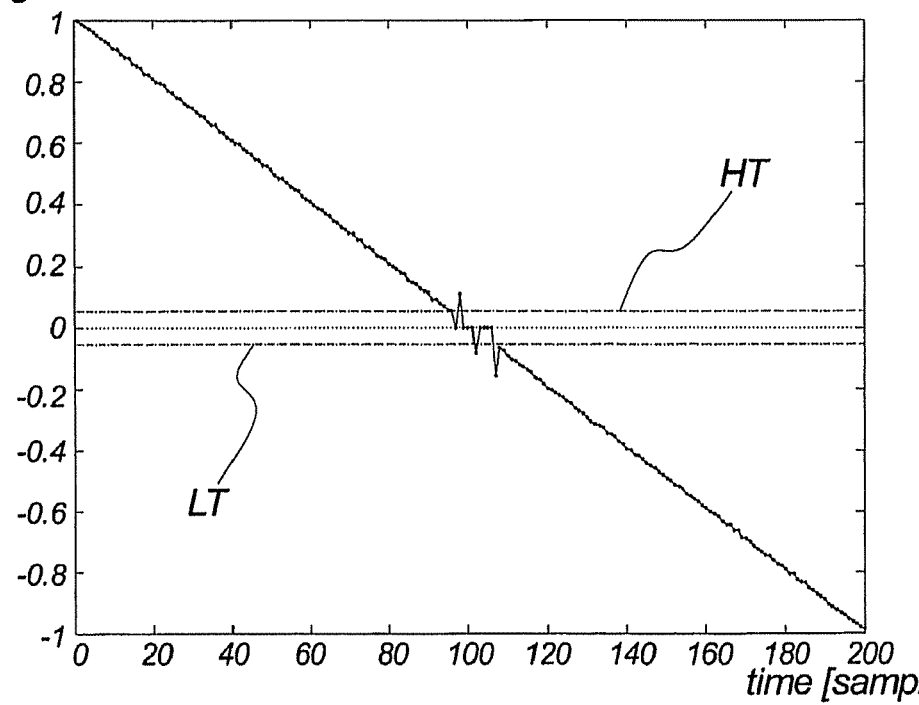
Figure 17C:
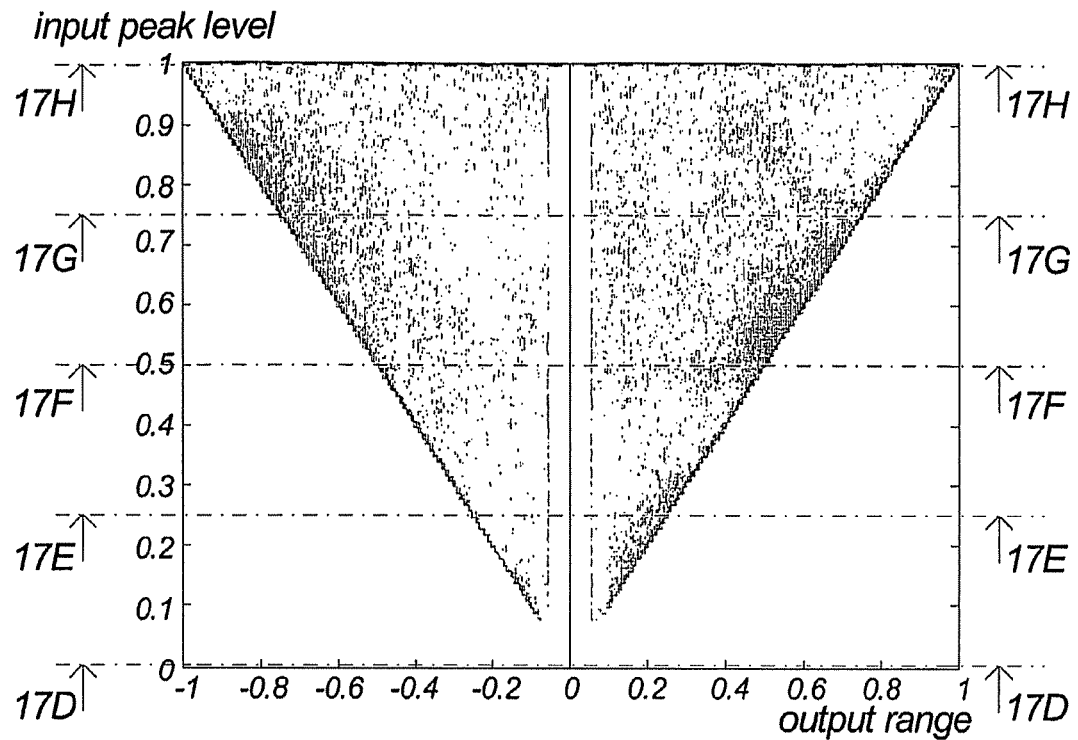

FIGS. 17A to 17H illustrate possible effects of the embodiment of FIG. 16A. FIG. 17A comprises a possible input signal sweeping with time from its maximum level 1 to its minimum level −1. FIG. 17B illustrates a possible output signal OS established by the embodiment illustrated in FIG. 16A, i.e. the combined mapping means MM and loop filter LF. The mapping means MM has caused the output signal to comprise several preferred sample points, indicated by dots, at the zero level but no points at other levels within the problematic range, i.e. the range between the low threshold LT and high threshold HT. The noise-shaping loop causes a few points to be pushed outside the problematic range instead of being mapped to zero.

Figure 17D:
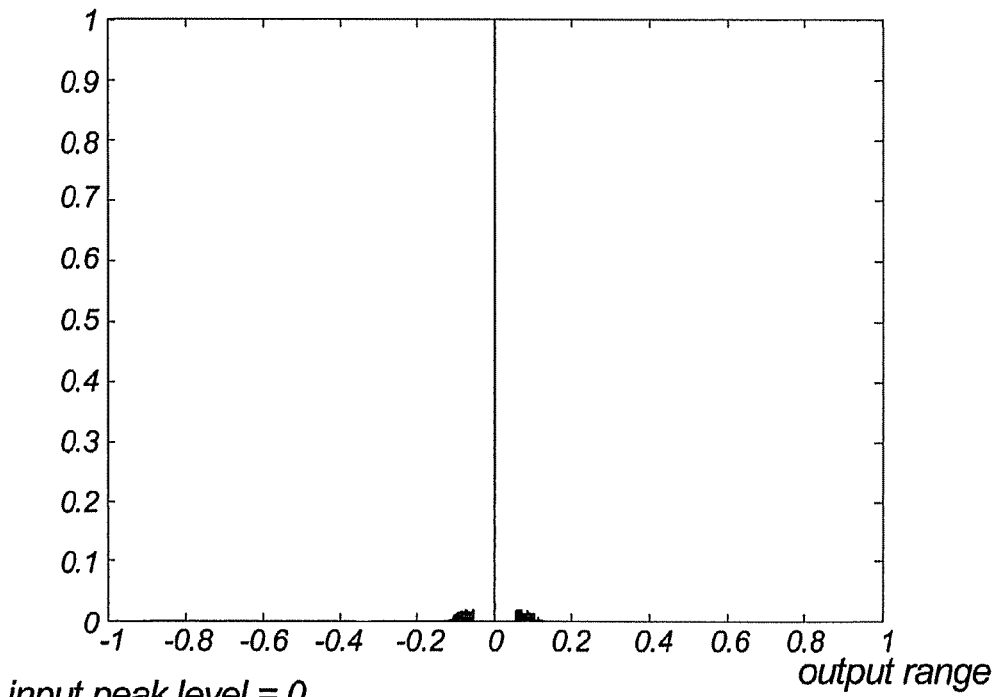
Figure 17E:
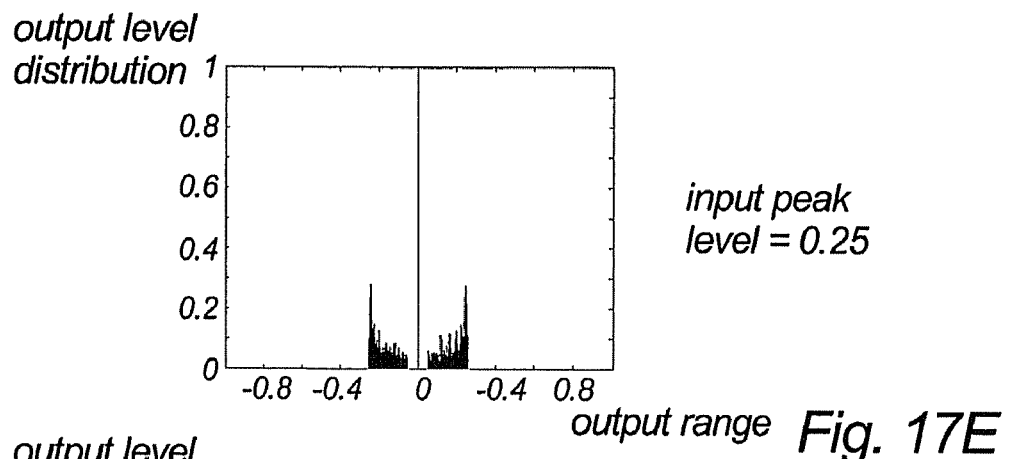
Figure 17F:
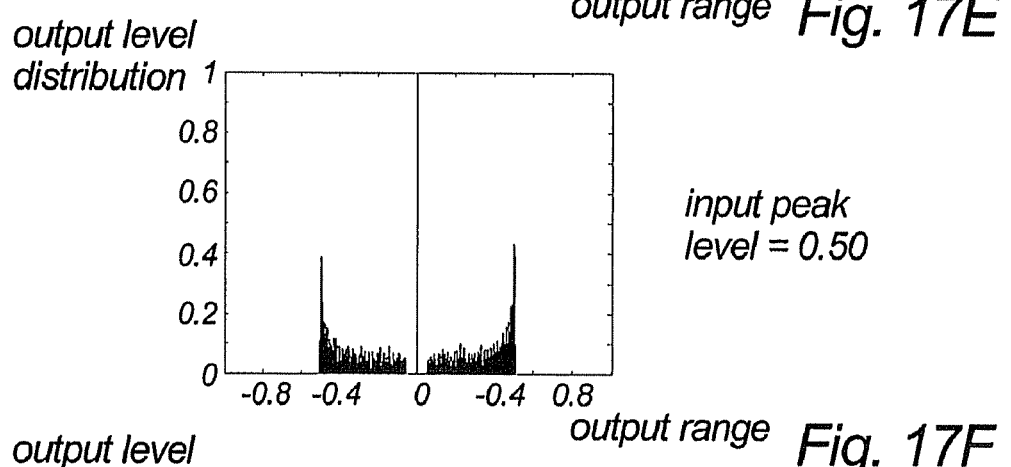
Figure 17G:
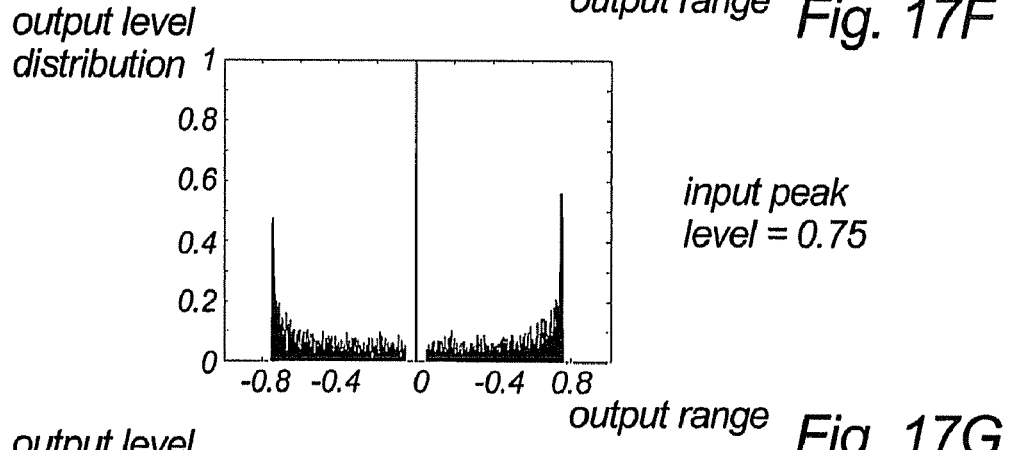
Figure 17H:
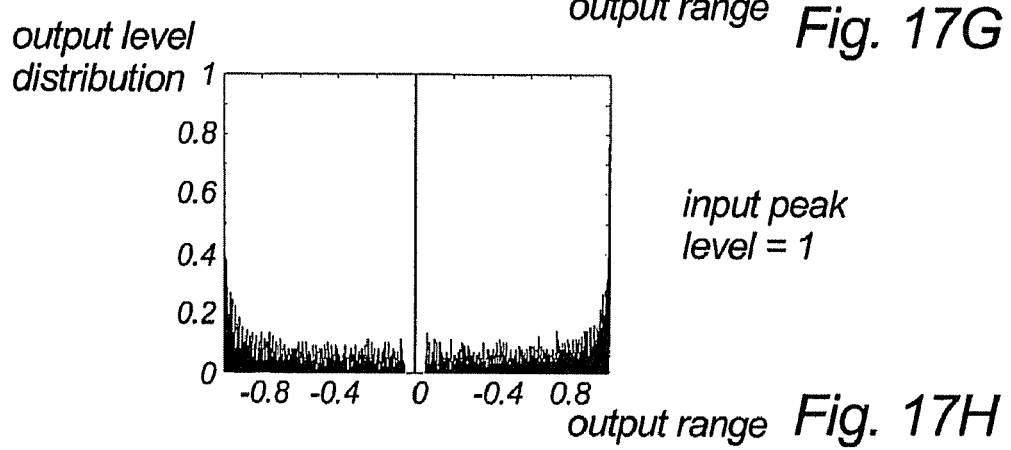

FIGS. 17C to 17H correspond in type to, e.g., the FIGS. 9C to 9H but are established by inputting a 1 kHz sine wave to the embodiment of FIG. 16A. As seen, the output level distribution has a high concentration at the output level of zero all input peak levels. Moreover, the output level distribution is zero for all other values within the range between the low threshold and high threshold, i.e. no pulses of less than the minimum pulse width, except for zero, ever occur when applying the present embodiment to a PWM amplifier. Regarding FIG. 17D illustrating the output level distribution for a zero input signal, i.e. when idling, a certain concentration of output levels below and above the low and high thresholds exists.

This is due to the noise shaping mechanism, sometimes causing different amplitude levels outside the problematic range to be mapped to instead of just zero.

Figure 18:
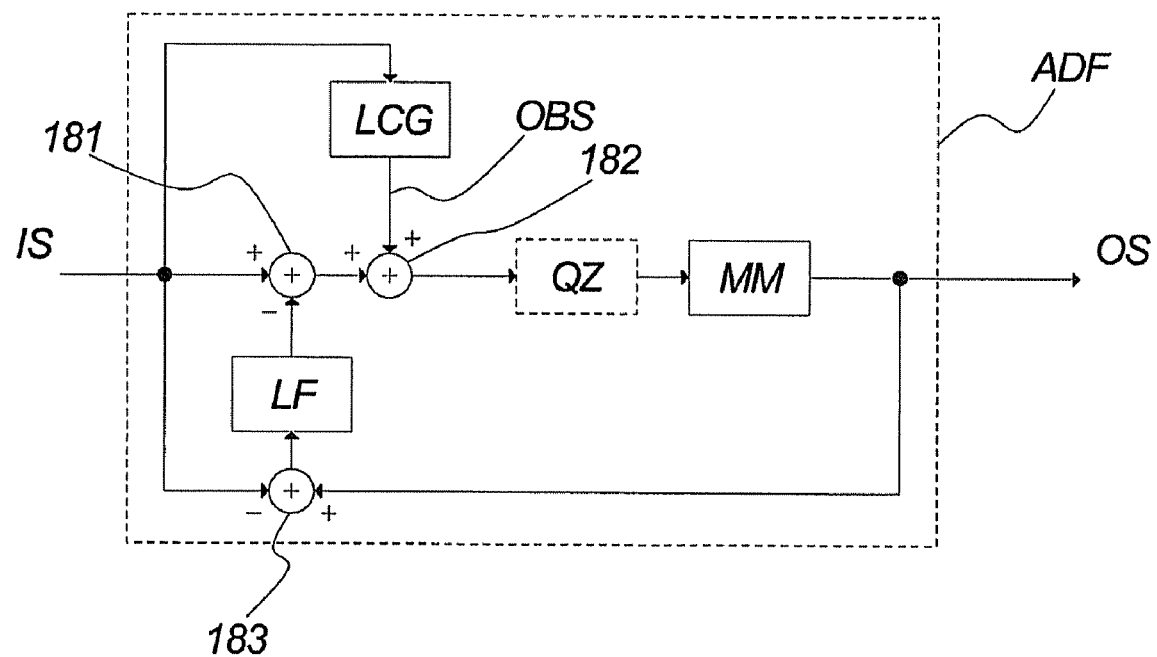

FIG. 18 illustrates a preferred embodiment of the amplitude distribution filter ADF of the present invention. It comprises an input signal IS and an output signal OS. Furthermore, it comprises the elements of both the embodiment of FIG. 14A and the embodiment of FIG. 16A, i.e. a level controlled generator LCG adding an outband signal OBS to the input signal, a mapping means MM mapping signal level within certain ranges to zero and a loop filter LF, which in virtue of its location performs noise shaping.

The addition of the outband signal to the input signal causes the input signal, at times with an amplitude close to zero, to be oscillating around the problematic range but, nevertheless, sometimes causes amplitudes within the problematic range to occur at other times. Furthermore, for empty input signals it causes every second preferred sample point to be at a level of zero. By letting this composite signal comprising the outband signal and the input signal to be processed by the mapping means MM it is ensured that no output signal levels within the problematic range, except for zero, occur, i.e. the output level distribution is zero between the low and high thresholds except for the output level zero, which has a high concentration. The distortion injected by the mapping means is reduced compared to an embodiment not proving an additive outband signal, as the outband signal causes less samples to require mapping and also causes the situations where mapping are required to be moved farther away from the input signal zero level crossings. The signal/error-ratio is thus improved for small signals compared to the signal/error ratio of, e.g., the embodiment of FIG. 16A.

Figure 19A:
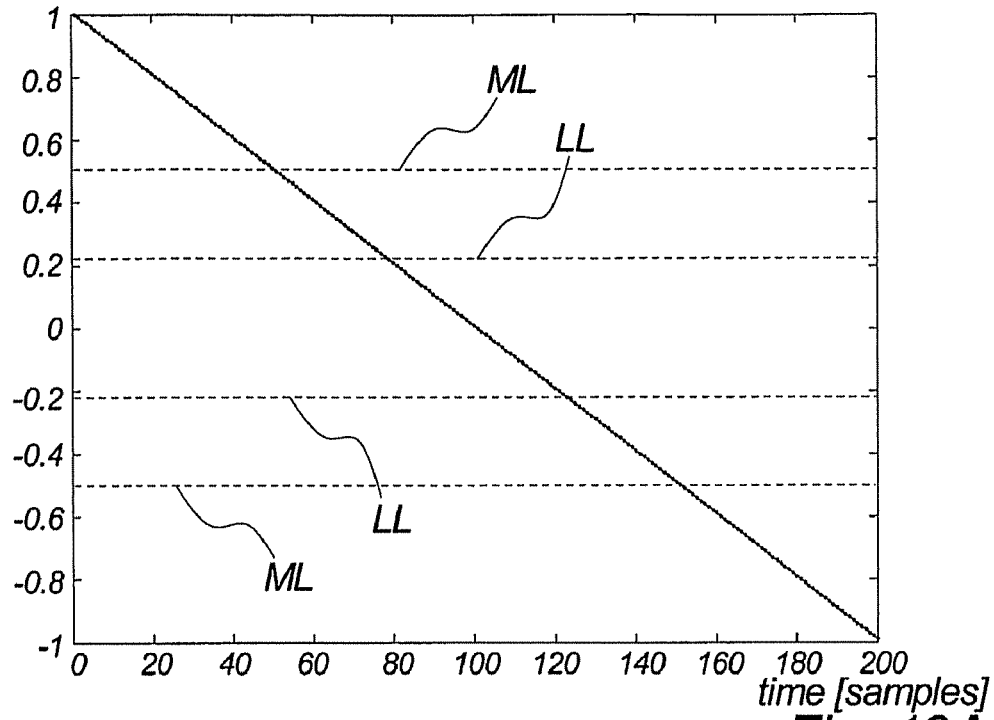
Figure 19B:
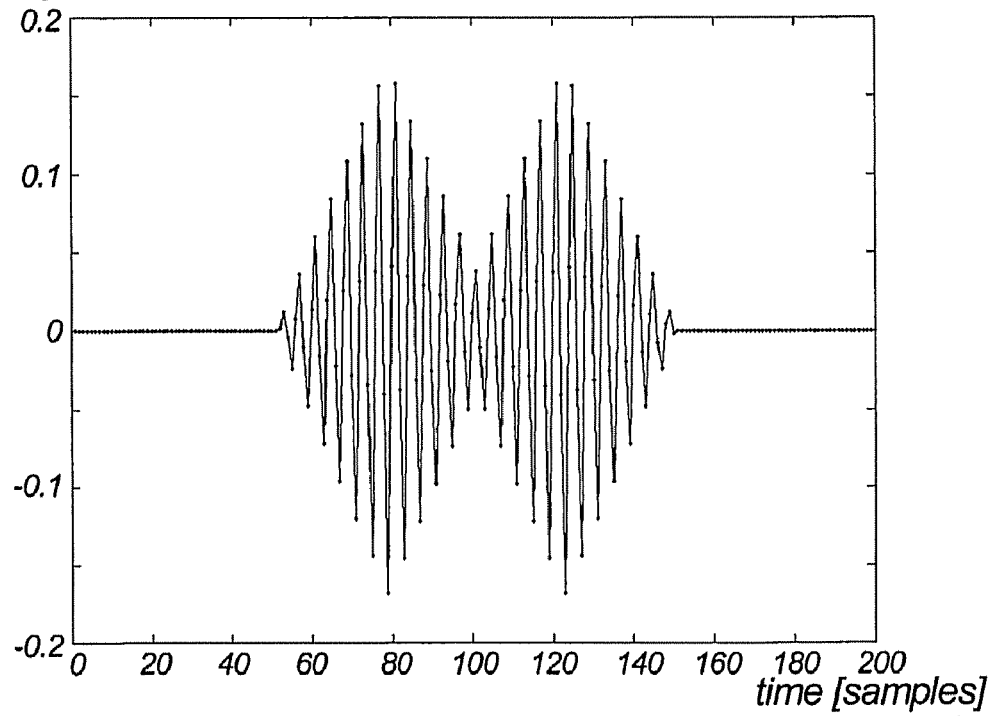
Figure 19C:
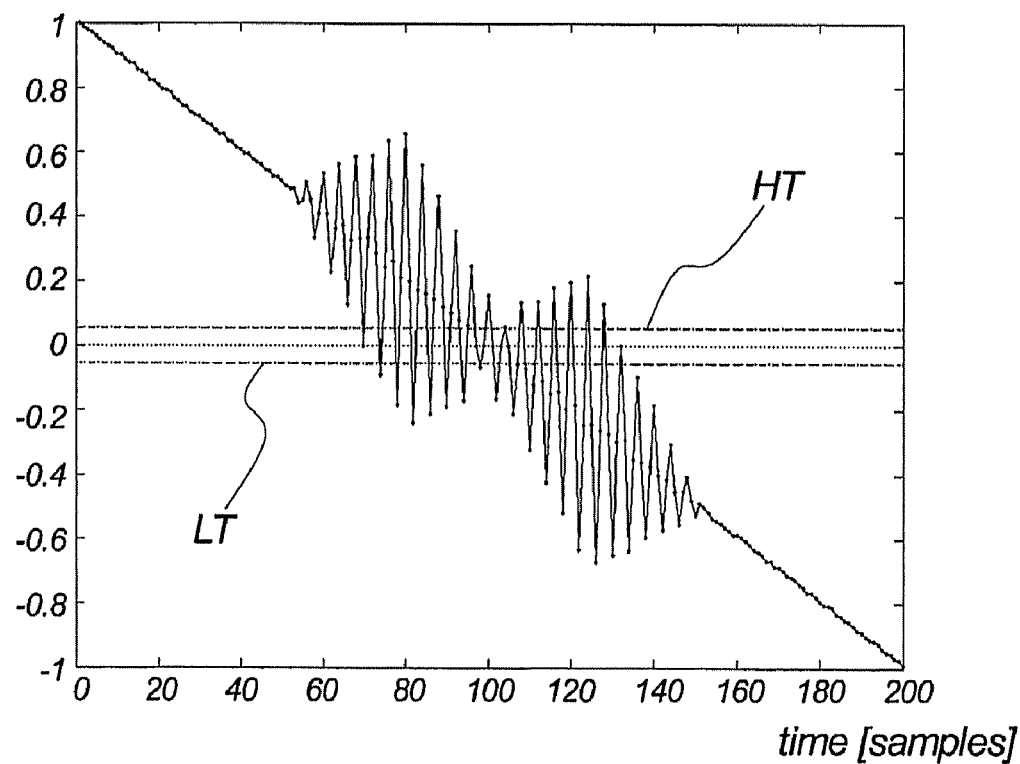
Figure 19D:
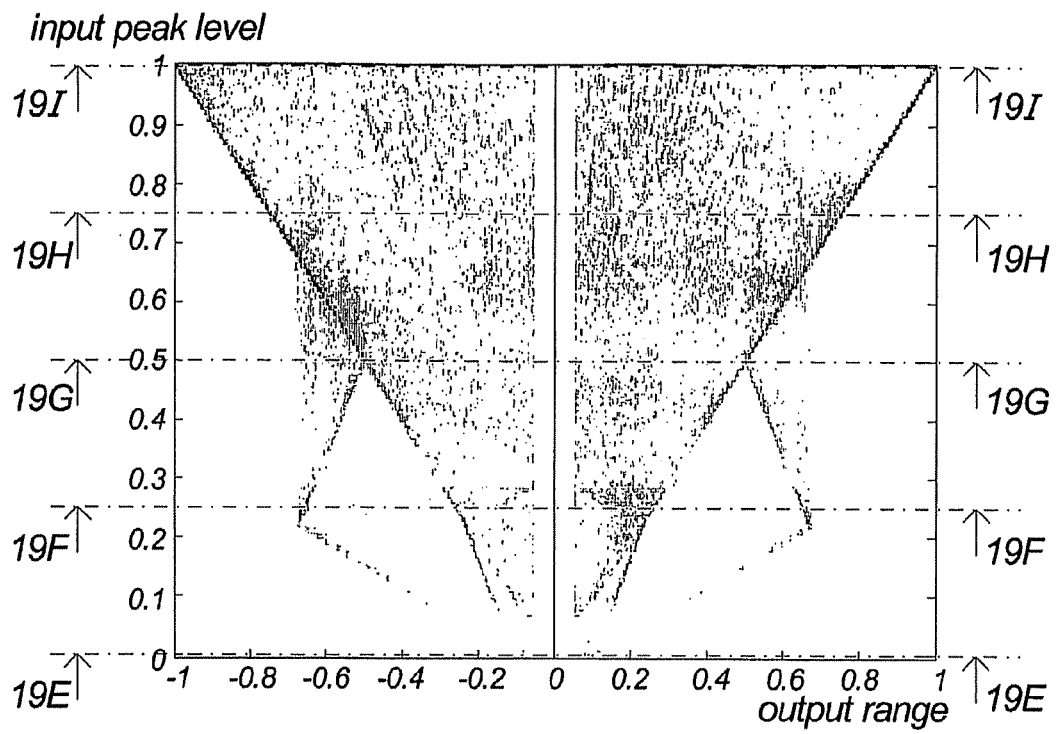
Figure 19E:
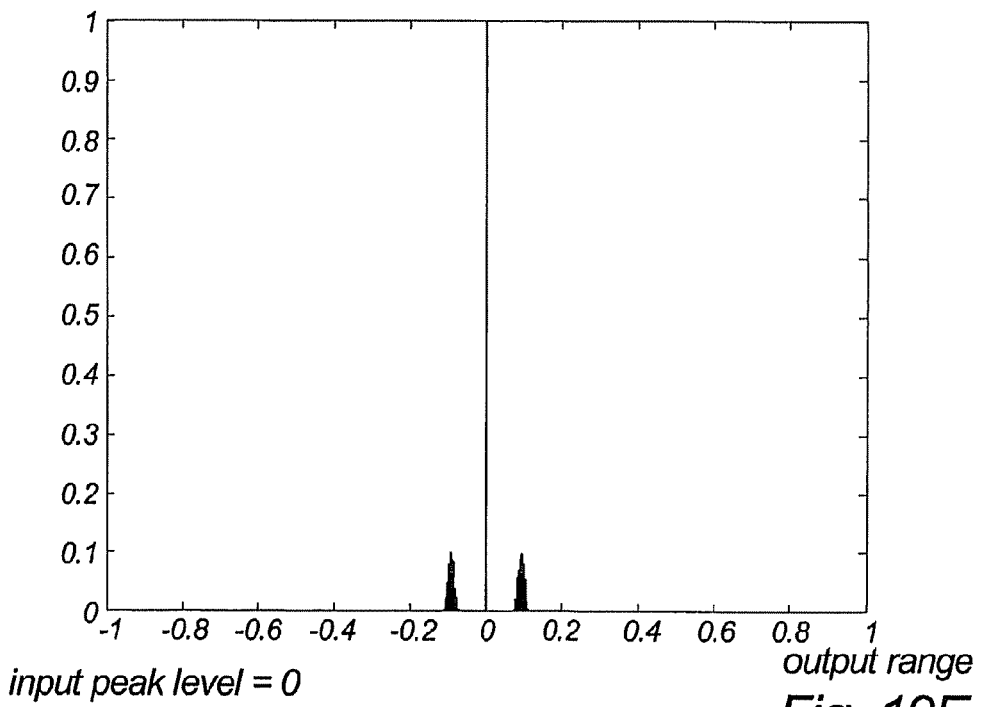
Figure 19F:
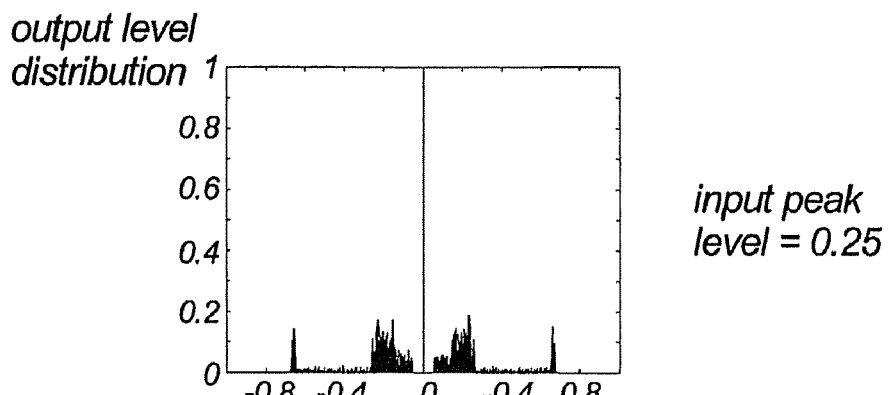
Figure 19G:
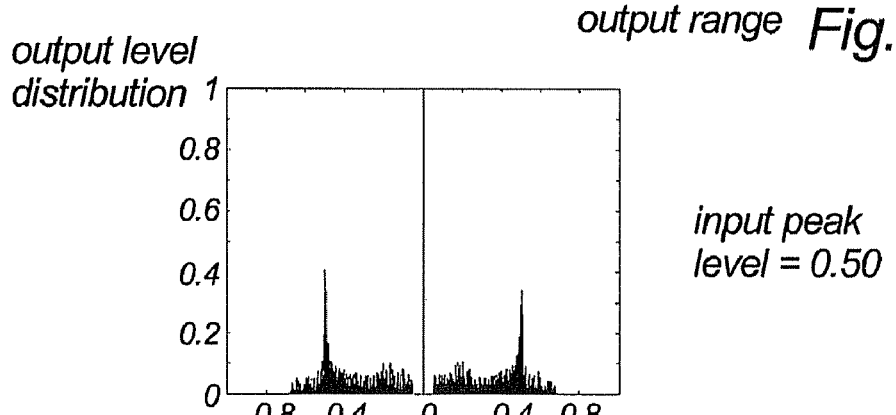
Figure 19H:
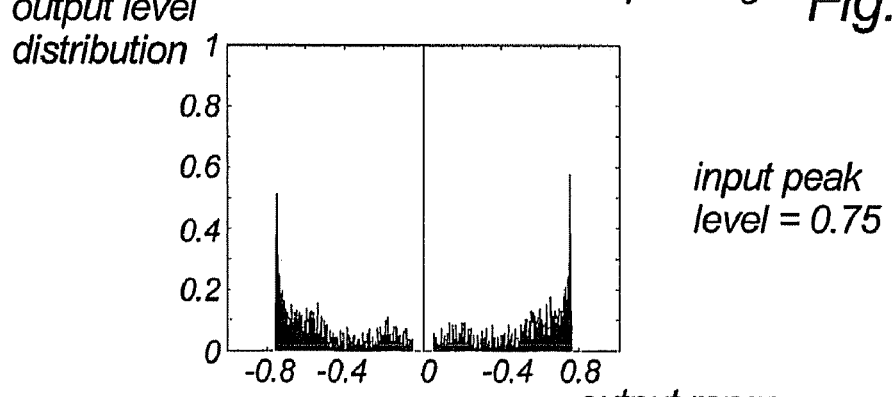
Figure 19I:
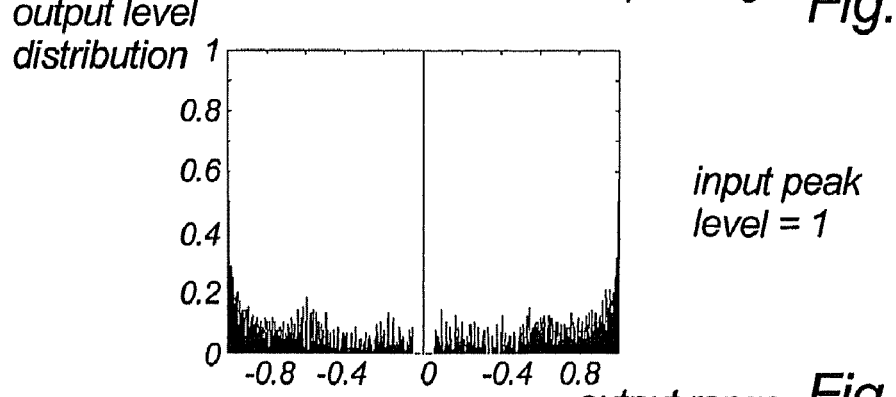

FIGS. 19A to 19C illustrate how the embodiment of FIG. 18 may affect a possible input signal. A possible input signal IS is shown in FIG. 19A together with dashed lines indicating the low level LL and middle level ML used for establishing the outband signal according to the algorithm of FIG. 6B. A corresponding outband signal OBS is shown in FIG. 19B with preferred sample points indicated by dots.

FIG. 19C illustrates a possible output signal OS established by the embodiment illustrated in FIG. 18 and on the basis of the input signal of FIG. 19A and the outband signal of FIG. 19B. Furthermore, FIG. 19C comprises dashed lines indicating a low threshold LT and a high threshold HT and dots indicating preferred sample points. As it can be seen, it is possible by means of the embodiment of FIG. 18 to establish an output signal comprising only sample values outside the problematic range between the low and high thresholds and sample values with a level of zero. Thereby, it is ensured that a possible subsequent PWM amplifier is not required to establish pulses with less than a minimum pulse width.

FIGS. 19D to 19I illustrate examples of the output signal level distribution that may result from the embodiment of FIG. 18. FIGS. 19D to 19I correspond in type to, e.g., the FIGS. 9C to 9H, but are established by inputting a 1 kHz sine wave to the embodiment of FIG. 18. As seen, the output level distribution is zero within the problematic range for any input peak level except for the output level of zero, which represents a high concentration. Thus, it can be seen that the embodiment of FIG. 18 combining the embodiments of FIGS. 14A and 16A improves the performance of each of these.

Figure 20:
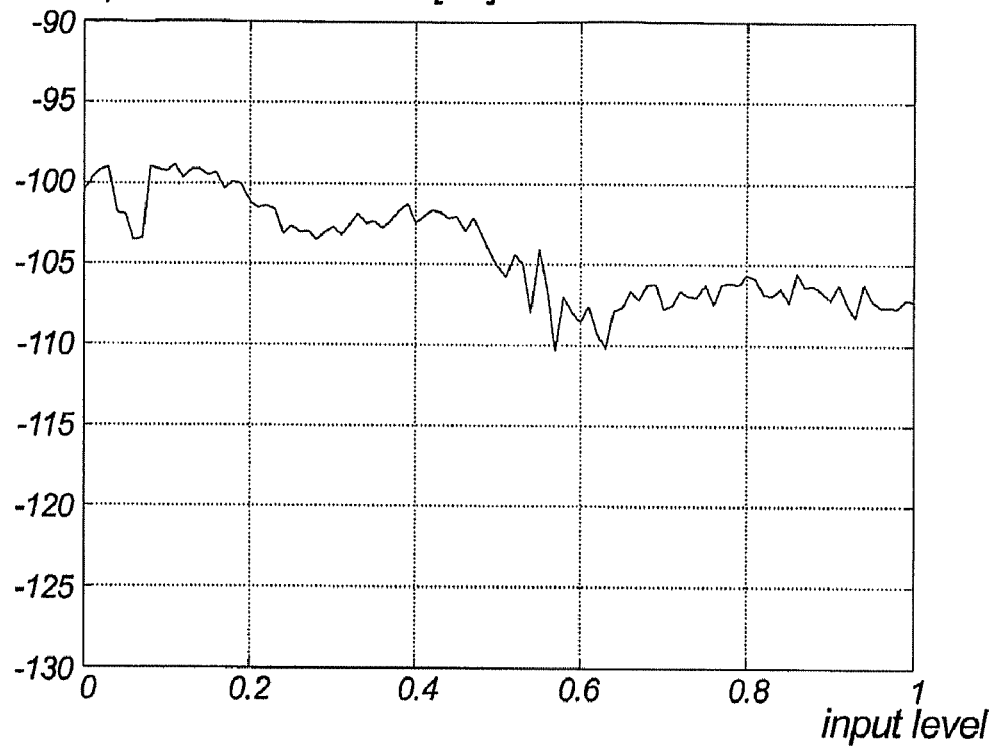
Figure 21:
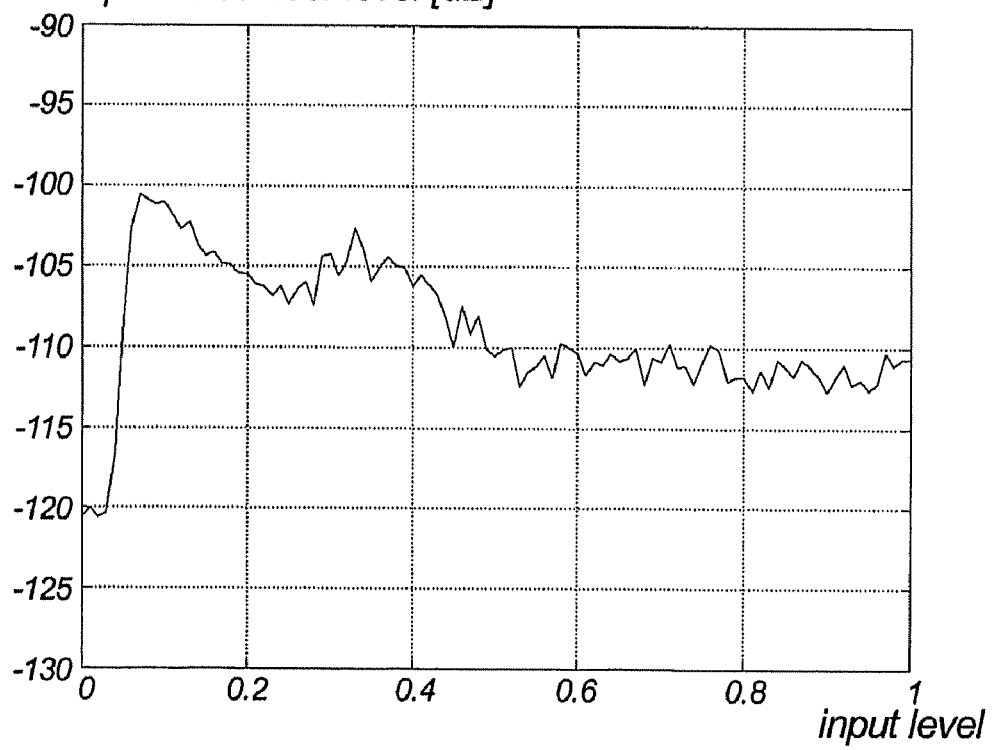

FIGS. 20 and 21 illustrate the relative noise floor, i.e. distortion and errors that may be comprised by an output signal when using the amplitude distribution filter ADF embodiments of FIGS. 16A and 18, respectively. The horizontal axes correspond to the absolute input level, i.e. 0 to 1 for the examples given above. The vertical axes correspond to the relative noise floor of the output signal. By comparing the two illustrations it is easily seen that the embodiment of FIG. 18 that combines a level controlled generator with mapping means adds far less noise to small signals, i.e. input levels less than approximately 0.02, than the embodiment of FIG. 8A comprising only mapping means. As noise in small signals is naturally more disturbing than in large signals the embodiment of FIG. 18 is preferred.

It is noted that the outband signal of the embodiments of FIGS. 14A and 18 should preferably cause a significant amount of zeroes to be sampled by subsequent stages. When the outband signal is a periodic signal, the amount of zeroes to be sampled should, preferably, be less than the half of the samples and, most preferably, the half of the samples, e.g. every second sample. Also non-periodic signals, e.g. white noise, may be used for outband signals but should also be established in a way ensuring a considerable amount of zeroes to be sampled.

Figure 22A:
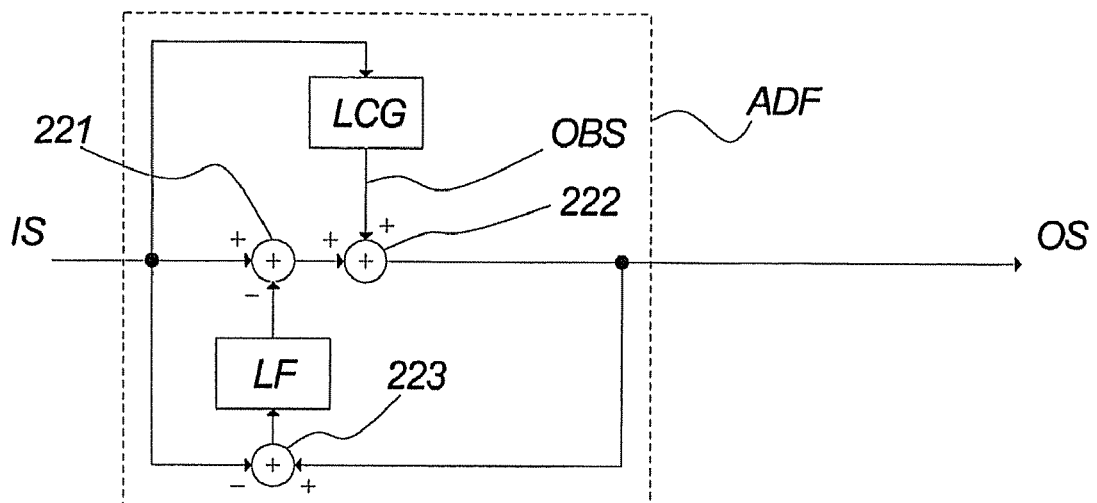

FIG. 22A illustrates a further, preferred embodiment of the present invention. Like the embodiment of FIG. 6A it comprises an input signal IS, which is turned into an output signal OS by adding an outband signal OBS to it by means of a summing point 222. The outband signal of the embodiment of FIG. 22A is established by means of a level controlled generator LCG. The level controlled generator is controlled at least partly by an input connected to the input signal. An outband signal that is amplitude controlled by the input signal may, thus, be established. The particular characteristics of the outband signal, e.g. waveform, frequency, etc., may be freely chosen or determined by other parameters as with the embodiment of FIG. 5A, and need not to be controlled by the input signal. The level controlled generator may, e.g., be implemented as a signal generator with voltage controlled gain.

The embodiment of FIG. 22A further comprises a loop filter LF. The loop filter is in the embodiment of FIG. 6A located in the feedback path from the output signal OS in such a way that is processes the difference between the output signal OS and the input signal IS and the output of the loop filter LF is subtracted from the input signal IS by means of a summing point 221.

Thus, the loop filter LF as described regarding the embodiment of FIG. 6A serves as a noise shaper to distortion and errors introduced to the signal forward path. Such preferred loop filter implementation may comprise a low-pass IIR filter, i.e. infinite impulse response filter, with a corner frequency at the top of the desired utility band, e.g. 20 kHz, and a large gain within the utility band.

Regarding the level controlled generator LCG any rules or algorithms for determining the outband signal amplitude on the basis of the input signal may be implemented. As described above with reference to FIG. 6A the choice of algorithm or rule to implement may be restricted by the system dynamics, in particular typically requiring the output signal OS to not exceed the maximum level of the input signal, e.g. 1, and thus requiring the sum of the input signal IS and the outband signal OBS to not exceed e.g. 1.

The typical restrictions described above may however not always apply, as e.g. when the subsequent processing means comprises certain kinds of three-level PWM amplifiers. An example of such an amplifier typically comprises an H-bridge system or a bridge-tied load system, where a single power supply with +VCC and GND by means of typically 4 switches are able to establish three levels, +VCC, GND and -VCC over the load. Typically positive input signal values are represented by means of pulses of level +VCC established by a first set of 2 switches, whereas negative input signal values are represented by means of pulses of level -VCC established by a second set of 2 switches. Between the pulses the level is GND. The load should be coupled between the outputs of the two sets of switches, instead of as typically between one set of switches and the ground-plane. Hence, if the input signal is, e.g., a positive DC-signal only the first set of switches operates, and vice versa.

In such a system, if it can be ensured that the signal to amplify always alternates between positive and negative levels in synchronism with the switch frequency, there will always for each set of switches between the active switch periods be an empty period where only the other set of switches is working. In this situation it may be possible to let the pulse widths increase beyond the dedicated periods into the preceding and succeeding empty periods. Thereby it is possible to establish pulses of twice the width of the otherwise maximum pulse width, and thereby significantly improve the dynamics of the system. When it is furthermore ensured that the two sets of switches do not operate concurrently, e.g. by ensuring that the sum of the absolute of two successive signal levels does not exceed, e.g., 2, the system is further improved, e.g. in that the two sets of switches do not distort the operation of each other. It is noted that the use of this concept in alternative ways or systems for, e.g., further improving the dynamics is within the scope of the present invention.

In a system as described above providing improved dynamics, in particular doubling of the maximum possible amplitude, the level controlled generator LCG of FIG. 22A may comprises level control algorithms that is not possible to use with the embodiment of FIG. 6A. An example of such a preferred algorithm is illustrated graphically in FIG. 22B. This illustration comprises a horizontal axis corresponding to the absolute of the input amplitude and a vertical axis corresponding to the absolute of the outband signal amplitude, i.e. the output of the level controlled generator. The half of the range between the low threshold and the high threshold, i.e. typically the range from zero level to the high threshold, is shown as a horizontal dashed line HT. The amplitude of the input signal IS is shown as a dashed line and the amplitude OSL of the outband signal OBS is shown as a solid line. The outband signal amplitude is for all input levels determined by adding a safe offset SO to the value of the input signal. Thereby, for a zero input, the outband signal amplitude stays just outside the range between the thresholds at the sample times, provided that the frequency of the outband signal is half the frequency of the sampling performed in subsequent stages. For a non-zero input, the outband signal amplitude alternates between the safe offset value SO and values considerably higher than the input signal amplitude. Thus, this implementation requires far better dynamic parameters than needed to provide for the input signal itself, and such dynamics are just what is provided by the above described PWM amplifier.

The effect of the level controlled generator LCG of FIG. 22A for a silent signal as illustrated in FIG. 5B is exactly like for the embodiment of FIG. 5A. As the input signal is zero all the time, the outband signal amplitude takes the value of the safe offset SO shown in FIG. 22B. Hence, the output signal OS established by summing together the silent input signal IS with the outband signal OBS, thus, becomes the same as in FIG. 5C, where the signal is outside the problematic range at every sample time. Obviously, the possible outcome illustrated in FIG. 5D of pulse width modulating the output signal OS of FIG. 5C also applies to this situation. None of the pulses are too narrow.

Figure 22B:
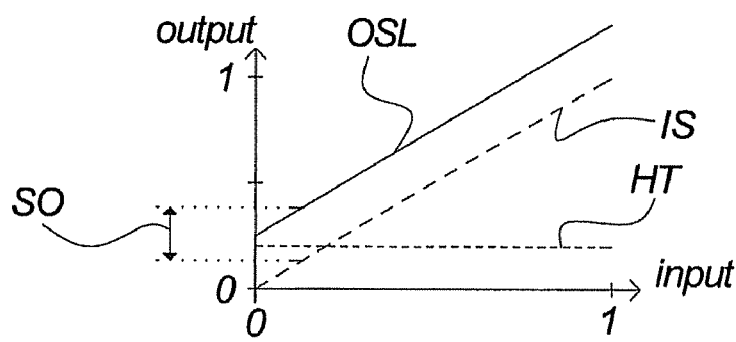
Figure 22C:
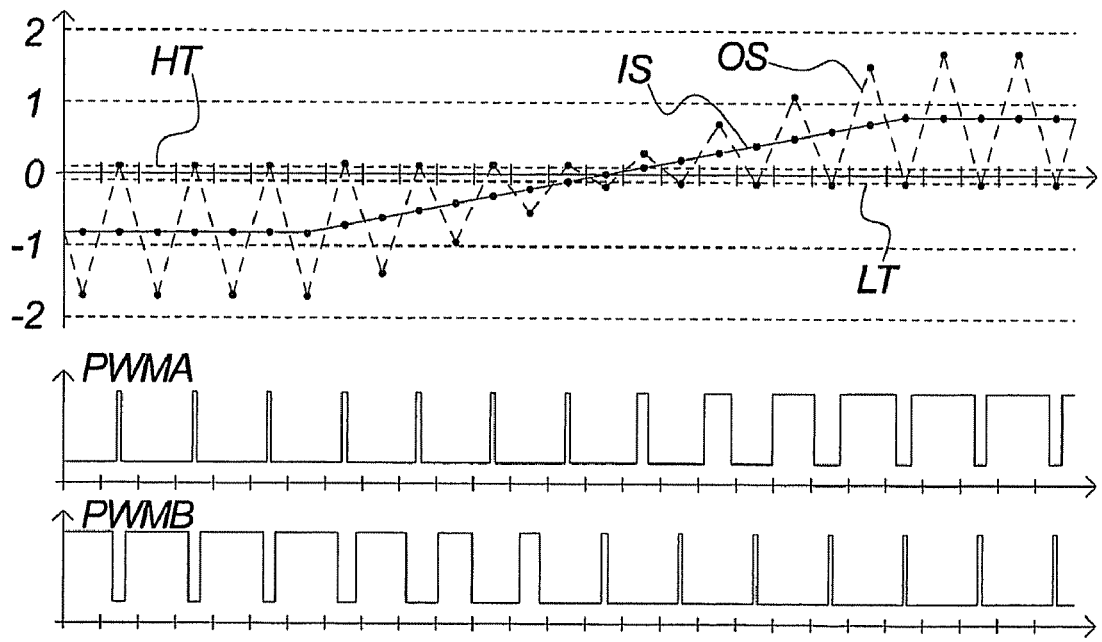

FIG. 22C illustrates a different input signal IS, first constant at approximately -0.8, then ramping to approximately 0.8 where it stays. The horizontal axis corresponds to time, and vertical strokes indicate the switch periods. The vertical axis corresponds to the signal amplitude. Horizontal lines are provided corresponding to the low threshold LT and high threshold HT. The diagram further comprises a possible output signal OS established by means of the embodiment of FIG. 22A on the basis of the input signal IS and the level control algorithm of FIG. 22B. When the input signal level is negative, the output signal alternates between a positive value corresponding to the safe offset SO, just above the high threshold HT, and a negative value corresponding to twice the input signal level minus the safe offset SO. When the input signal level is positive, the output signal alternates between a negative value corresponding to the negative of the safe offset SO, just below the low threshold LT, and a positive value corresponding to twice the input signal level plus the safe offset SO. Hence, when the input signal approaches the maximum amplitude of 1, the output signal approaches twice that amplitude, i.e. 2 in the present example. By using the algorithm of FIG. 22B is obtained that no output signal samples is between the low threshold and high threshold.

FIG. 22C furthermore comprises examples of a PWM signal established from the output signal OS of FIG. 22C. Strokes on the horizontal axes indicate the PWM periods. The PWM signal in this example is a three level signal comprising a first signal PWMA and a second signal PWMB. The signals are established in such a way that positive output signal levels are represented by pulses in the first signal PWMA, and negative output signal levels are represented by pulses in the second signal PWMB. When signal represented by the PWM signal alternates between negative and positive values, as the output signal in FIG. 22C, there will always be an empty PWM period between each pulse in each signal. As described above these empty periods may be used for increasing the pulse widths of the active periods. Thereby it is possible to establish a three level PWM signal representing the output signal of FIG. 22C, i.e. an output signal normally exceeding the system dynamics. The present embodiment of the invention furthermore ensures that the two PWM signal parts PWMA and PWMB preferably never, and at least less often, comprise pulses at the same times, by ensuring narrow, yet not too narrow, pulses in one signal part, e.g. PWMA, while establishing broad pulses in the other signal part, e.g. PWMB.

Regarding the embodiment of FIG. 22A and the above description should be noted that also three-level PWM techniques and H-bridge implementations that do not behave as the examples given above are known. A conventional three-level differential PWM technique where two sets of switches operates simultaneously thus establishing overlapping pulses is an example of a such, which however typically provides poor electromagnetic compatibility and interference (EMC/EMI) properties as well as higher power dissipation.

Figure 23A:
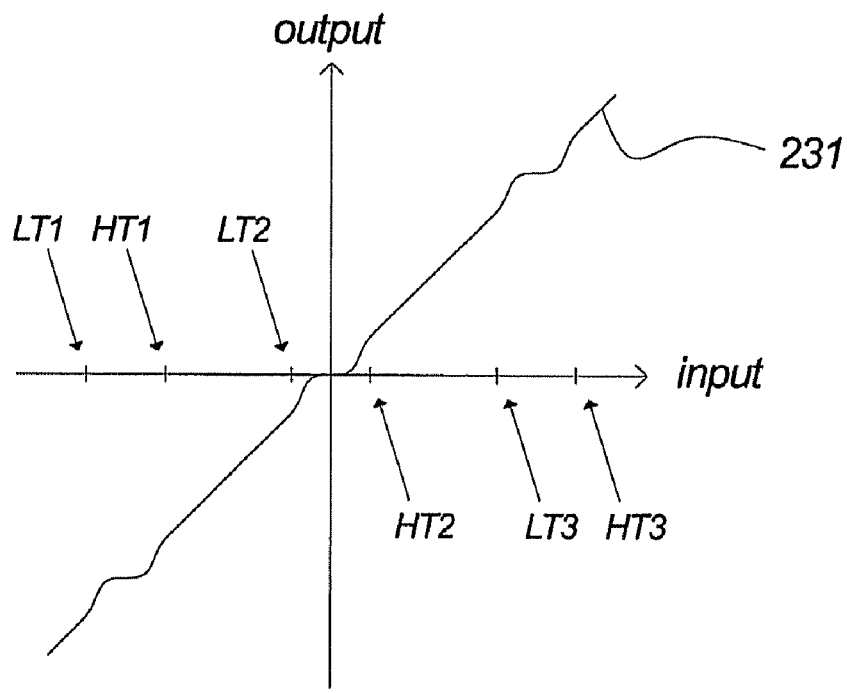
Figure 23B:
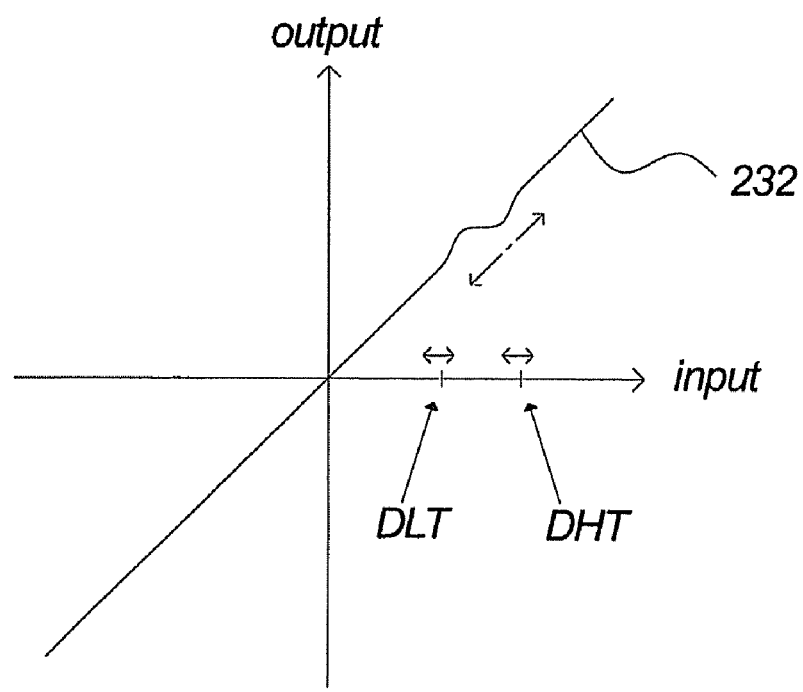

FIGS. 23A and 23B illustrate relationships between the output and the input of a process being non-linear for inputs within certain ranges. They relate to FIGS. 3A and 3B illustrating the ideal relationship and a relationship comprising a non-linear processing range in the middle of the full level range. FIG. 23A comprises an example of a relationship 231 comprising several amplitude ranges in which the output is distorted, whereof also some of these obviously does not comprise the zero level. The ranges comprise values between a first low threshold LT1 and a first high threshold HT1, between second low and high threshold LT2, HT2, and between third low and high thresholds LT3, HT3.

FIG. 23B illustrates an output/input relationship 232 where the amplitude range with non-linear relationship is dynamically positioned within the input level range. As indicated by arrows the range extends from a dynamically positioned low threshold DLT to a dynamically positioned high threshold DHT. It is noted that both the extent of the range as well as the position may in some embodiments be dynamically adapted. It is furthermore noted that a possible output/input relationship may simultaneously comprise several dynamically positioned ranges or a combination of fixed and dynamically positioned ranges, and that also the number of ranges may be dynamically changed, e.g. when two or more ranges partly or fully coincide, or due to any other reason.

Figure 24:
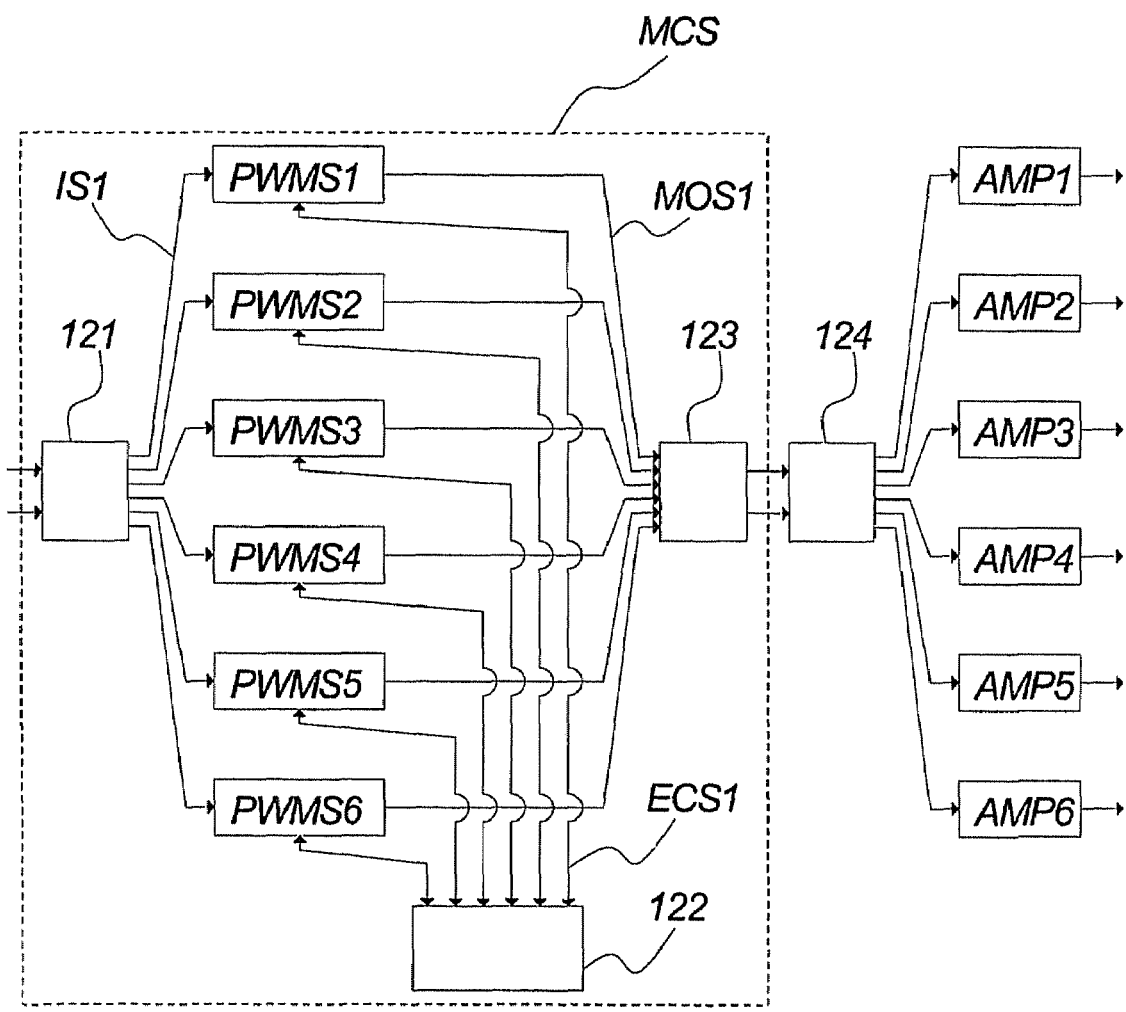

An example of an application where dynamically positioned problematic amplitude ranges as described above regarding FIG. 23B may be advantageously utilized is given in FIG. 24. It comprises an embodiment of a multi-channel PWM modulator system MCS. Such a system may, e.g., be used for pulse width modulating several audio channels, e.g. 6 channels, and may advantageously be implemented in a single integrated circuit. One of several issues to consider when implementing a system in an integrated circuit is the use of external chip connectors, as the number of these significantly impacts the cost of the integrated circuit, i.e. production and materials. A possible solution to this problem is to combine the multiple audio channels into a fewer number of physical conductors. When, e.g., the system comprises 6 audio channels it may be possible by means of a proper multiplexing algorithm, compression algorithm, etc., to combine the information of these into, e.g., 2 or 4 physical wires. In FIG. 24 is shown two signals entering the multi-channel PWM modulator system MCS. These signals may each require more than one physical connector, but use together preferably less than 6 connectors. Within the multi-channel system MCS the combined channels signal is split into a signal for each of the 6 individual channels by a signal splitter 121. Alternatively each of the 6 channels may enter the multi-channel system MCS by its own physical connector. Each of the 6 channels are provided to a pulse width modulating system PWMS1, PWMS2, ..., PWMS6 according to the present invention as input signals, whereof due to clarity in the drawing only a reference IS1 is given for the first channel. The modulator output signals MOS1, etc., which are pulse width modulated representations for the input signal IS1, etc., are again combined into preferably less than 6 physically wired signals by means of a signal combiner 123.

FIG. 24 further comprises a signal splitter 124 for dividing the combined modulator output signal into a signal for each channel outside the integrated circuit comprising the multi-channel pulse width modulator system MCS. Each of these pulse width modulated output channels may then be fed to, e.g., separate amplifiers AMP1, ..., AMP6, preferably switch-mode amplifiers. Alternatively the combined modulator output signal may be fed directly to each of the subsequent, e.g., amplifiers by bypassing the signal splitter 124. The subsequent stage, e.g. amplifier, should then be adapted to retrieve from the combined signal only the relevant channel.

In order to most optimally combine multiple pulse width modulated signals MOS1, etc., into a fewer physical signals by means of signal combiner 123 it may be beneficial to assume that none of the PWM signals comprise concurrent pulse flanks. As the input signal amplitudes determine the pulse widths, and thus the flanks of the pulses, non-concurrent pulse flanks may be ensured by ensuring that a pulse width modulator PMOD of one pulse width modulator system PWMS1, ..., PWM6 never receive the same intermediate output signal OS amplitude at the same time as the modulator of another system PWMS1, ..., PWMS6, as this would probably cause concurrent pulse flanks to be established.

A further reason for desiring non-concurrent pulse flanks is the probability of establishing cross-talk when, e.g., the amplifiers AMP1, ..., AMP6 are operated from the same power supply. By ensuring that the switches in different amplifiers are never required to switch simultaneously, the problem of cross-talk may be reduced.

Guaranteeing or at least increasing the probability of non-concurrent flanks in a multi-channel system, e.g. a stereo system or a 5.1 system, is thus desired, and one way in which this may be ensured is, within the example embodiment of FIG. 24, by dynamically adapting the problematic amplitude ranges of some of the pulse width modulator systems PWMS1, ..., PWMS6 according to the intermediate output signal amplitudes of other pulse width modulator systems PWMS1, ..., PWMS6.

Such dynamically adapting the problematic amplitude ranges may e.g. be performed be a control unit 122 connected with each pulse width modulator system PWMS1, ..., PWMS6 by means of two-way external control signals ECS1, etc. Thereby the control unit 122 may continuously obtain information of the currently processed input values or intermediate output values, and adaptively establish control information accordingly.

The invention claimed is:

1. A pulse width modulator system comprising
a modulator system input,
a modulator output,
an amplitude distribution filter, and
a pulse width modulator,
wherein said amplitude distribution filter establishes an intermediate output signal by modifying a level of amplitude distribution of an input signal within at least one predetermined amplitude range of said input signal, said input signal being received from said modulator system input
wherein said amplitude distribution filter comprises a level controlled generator adapted for establishing an outband signal at least partly controlled on the basis of the amplitude of said input signal, and
wherein said pulse width modulator provides a modulator output signal on said modulator output on the basis of said intermediate output signal.

2. The pulse width modulator system according to claim 1, wherein said pulse width modulator system is a distributed system.

3. The pulse width modulator system according to claim 1, wherein said pulse width modulator system comprises an amplifier, comprising an amplifier output, said amplifier producing an amplified modulator system output signal on said amplifier output responsive to said modulator output signal.

4. The pulse width modulator system according to claim 3, wherein said amplifier is a switching amplifier.

5. The pulse width modulator system according to claim 1, wherein said input signal is a continuous time signal.

6. The pulse width modulator system according to claim 1, wherein said input signal is a discrete time signal.

7. The pulse width modulator system according to claim 1, wherein said input signal is an audio signal.

8. The pulse width modulator system according to claim 1, wherein said modulator output signal is a pulse width modulated signal.

9. The pulse width modulator system according to claim 1, wherein said pulse width modulated signal comprises at least partly curved or inclined pulses.

10. The pulse width modulator system according to claim 1, wherein said modulator output signal is a three level pulse width modulated signal.

11. The pulse width modulator system according to claim 1, wherein said at least one predetermined amplitude range is dynamically positioned.

12. The pulse width modulator system according to claim 1, wherein the extent of said at least one predetermined amplitude range is dynamically adapted.

13. The pulse width modulator system according to claim 1, wherein said at least one predetermined amplitude range comprises a zero-level.

14. The pulse width modulator system according to claim 1, wherein said at least one predetermined amplitude range is symmetric around a zero-level.

15. The pulse width modulator system according to claim 1, wherein said at least one predetermined amplitude range comprises a range from a low threshold up to but not including a zero-level, and a range from but not including the zero-level up to a high threshold.

16. The pulse width modulator system according to claim 1, wherein said at least one predetermined amplitude range does not comprise the zero-level.

17. The pulse width modulator system according to claim 1, wherein said at least one predetermined amplitude range is determined on the basis of a minimum pulse width of said modulator output signal.

18. The pulse width modulator system according to claim 17, wherein said minimum pulse width of said modulator output signal is determined on the basis of characteristics of said amplifier.

19. The pulse width modulator system according to claim 18, wherein said characteristics of said amplifier comprises the rise time and/or fall time.

20. The pulse width modulator system according to claim 1, wherein said at least one predetermined amplitude range is adaptively determined on the basis of an external control signal.

21. The pulse width modulator system according to claim 20, wherein said external control signal is provided by an instance of said pulse width modulator system.

22. The pulse width modulator system according to claim 1, wherein the peak amplitude of said outband signal varies with the amplitude of said input signal.

23. The pulse width modulator system according to claim 1, wherein the peak amplitude of said outband signal at least partly corresponds to the sum of the level of said input signal and a safe offset value.

24. The pulse width modulator system according to claim 23, wherein said safe offset value corresponds to at least the half of said predetermined amplitude range.

25. The pulse width modulator system according to claim 23, wherein the peak amplitude of said outband signal for a first input signal amplitude range at least partly corresponds to the sum of the amplitude of said input signal and said safe offset value, for a second input signal level range at least partly corresponds to the difference between a predetermined level and the level of said input signal, and for a third input signal level range at least partly corresponds to zero.

26. The pulse width modulator system according to claim 1, wherein said outband signal is a periodic signal.

27. The pulse width modulator system according to claim 1, wherein said outband signal comprises a frequency corresponding to a half of the modulation frequency of said pulse width modulator.

28. The pulse width modulator system according to claim 1, wherein said outband signal comprises a frequency corresponding to a quarter of a modulation frequency of said pulse width modulator.

29. The pulse width modulator system according to claim 1, wherein a wave form of said outband signal is a sine waveform, a triangular waveform, a square waveform or a sawtooth waveform.

30. The pulse width modulator system according to claim 1, wherein said outband signal is a multiple frequency signal.

31. The pulse width modulator system according to claim 1, wherein said outband signal comprises a broadest possible frequency band.

32. The pulse width modulator system according to claim 1, wherein a level of a frequency distribution of said outband signal is at least partly reduced within a frequency range comprising the input signal.

33. The pulse width modulator system according to claim 1, wherein said outband signal is at least partly synchronized with a modulation frequency of said pulse width modulator.

34. The pulse width modulator system according to claim 33, wherein said synchronization comprises synchronizing peaks of said outband signal with a modulation frequency and modulation phase of said pulse width modulator.

35. The pulse width modulator system according to claim 33, wherein said pulse width modulator comprises a reference signal representation generator establishing a reference signal representation.

36. The pulse width modulator system according to claim 35, wherein said synchronization comprises synchronizing the outband signal with said reference signal representation of said pulse width modulator.

37. The pulse width modulator system according to claim 1, wherein said amplitude distribution filter establishes said intermediate output signal at least partly by means of an outband signal summing point adapted for adding said outband signal to said input signal.

38. The pulse width modulator system according to claim 37, wherein said amplitude distribution filter further comprises a noise shaper performing noise shaping of said intermediate output signal.

39. The pulse width modulator system according to claim 38, wherein said noise shaper comprises a loop filter, a filter summing point and a feedback summing point establishing a feedback path from said intermediate output signal to said input signal.

40. The pulse width modulator system according to claim 39, wherein said loop filter comprises a low pass filter.

41. The pulse width modulator system according to claim 1, wherein said amplitude distribution filter establishes said intermediate output signal at least partly by means of mapping means adapted for establishing a mapping output corresponding to said input signal in such a way that input signal amplitude instances that fall within said at least one predetermined amplitude range are mapped to mapping output amplitude instances according to a predetermined mapping scheme.

42. The pulse width modulator system according to claim 41, wherein said predetermined mapping scheme comprises mapping input signal amplitude instances that fall within said at least one predetermined amplitude range to amplitude instances outside said at least one predetermined amplitude range.

43. The pulse width modulator system according to claim 41, wherein said predetermined mapping scheme comprises mapping input signal amplitude instances that fall within said at least one predetermined amplitude range to the zero-level.

44. The pulse width modulator system according to claim 41, wherein said predetermined mapping scheme is dynamically adapted.

45. The pulse width modulator system according to claim 41, wherein said predetermined mapping scheme is controlled by an external control signal.

46. The pulse width modulator system according to claim 38, wherein said noise shaper further performs noise shaping of errors introduced by said mapping means.

47. The pulse width modulator system according to claim 38, wherein said amplitude distribution filter further comprises a quantizer.

48. The pulse width modulator system according to claim 47, wherein said noise shaper further performs noise shaping of errors introduced by said quantizer.

49. The pulse width modulator system according to claim 1, wherein said modifying the level of the amplitude distribution of said input signal within said at least one predetermined amplitude range comprises decreasing said level of the amplitude distribution of said input signal within said at least one predetermined amplitude range.

50. The pulse width modulator system according to claim 1, wherein said modifying the level of the amplitude distribution of said input signal within said at least one predetermined amplitude range comprises entirely restraining said level of the amplitude distribution of said input signal within said at least one predetermined amplitude range.

51. The pulse width modulator system according to claim 1, wherein said pulse width modulator comprises an intersection computing block.

52. The pulse width modulator system according to claim 1, wherein said pulse width modulator comprises a pulse generator.

53. The pulse width modulator system comprising
a modulator system input,
a modulator output,
an amplitude distribution filter, and
a pulse width modulator,
wherein said amplitude distribution filter establishes an intermediate output signal by modifying the level of the amplitude distribution of an input signal within at least one predetermined amplitude range of said input signal, said input signal being received from said modulator system input,
wherein said amplitude distribution filter comprises a level controlled generator adapted for establishing an outband signal at least partly controlled on the basis of the amplitude of said input signal,
wherein said pulse width modulator provides a modulator output signal on said modulator output on the basis of said intermediate output signal, and
wherein said modifying the level of the amplitude distribution of an input signal within at least one predetermined amplitude range of said input signal comprises substantially preventing said pulse width modulator from establishing pulse width modulation pulses of a width less than a predetermined minimum pulse width.

* * * * *